(12) United States Patent
Arai et al.

(10) Patent No.: US 8,048,741 B2
(45) Date of Patent: Nov. 1, 2011

(54) SEMICONDUCTOR MEMORY DEVICE AND METHOD OF FABRICATING THE SAME

(75) Inventors: Fumitaka Arai, Yokohama (JP); Riichiro Shirota, Fujisawa (JP); Makoto Mizukami, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 12/715,964

(22) Filed: Mar. 2, 2010

(65) Prior Publication Data

US 2010/0159657 A1 Jun. 24, 2010

Related U.S. Application Data

(63) Continuation of application No. 11/616,522, filed on Dec. 27, 2006, now Pat. No. 7,696,559.

(30) Foreign Application Priority Data

Dec. 28, 2005 (JP) ................................. 2005-379017

(51) Int. Cl.
*H01L 21/336* (2006.01)

(52) U.S. Cl. ................. 438/268; 257/365; 257/E21.423

(58) Field of Classification Search .................. 438/268; 257/365, E21.423

See application file for complete search history.

(56) References Cited

U.S. PATENT DOCUMENTS

| 4,665,418 | A | 5/1987 | Mizutani |
| 7,387,935 | B2 | 6/2008 | Masuoka et al. |

FOREIGN PATENT DOCUMENTS

| JP | 7-235649 | 9/1995 |
| JP | 10-93083 | 4/1998 |
| JP | 2005-85938 | 3/2005 |

OTHER PUBLICATIONS

Office Action issued Dec. 14, 2010, in Japan Patent Application No. 2005-379017 (with English translation).

*Primary Examiner* — Lex Malsawma
*Assistant Examiner* — Tanika Warrior
(74) *Attorney, Agent, or Firm* — Oblon, Spivak, McClelland, Maier & Neustadt, L.L.P.

(57) ABSTRACT

A semiconductor memory device includes: a semiconductor substrate, on which an impurity diffusion layer is formed in a cell array area; a gate wiring stack body formed on the cell array area, in which multiple gate wirings are stacked and separated from each other with insulating films; a gate insulating film formed on the side surface of the gate wiring stack body, in which an insulating charge storage layer is contained; pillar-shaped semiconductor layers arranged along the gate wiring stack body, one side surfaces of which are opposed to the gate wiring stack body via the gate insulating film, each pillar-shaped semiconductor layer having the same conductivity type as the impurity diffusion layer; and data lines formed to be in contact with the upper surfaces of the pillar-shaped semiconductor layers and intersect the gate wirings.

3 Claims, 52 Drawing Sheets

FIG. 7

ERASE

| | Selected Block | Non – Selected Block |
|---|---|---|
| SGD | Floating | Floating |
| SGS | Floating | Floating |
| WL | 0V | Floating |
| BL | Floating | |
| CELSRC | Erase Voltage (Positive) | |

FIG. 8

READ

| | | Selected Block | Non – Selected Block |
|---|---|---|---|
| SGD | | Positive Voltage (SG1-ON) | Negative Voltage (SG1-OFF) |
| SGS | | Positive Voltage (SG2-ON) | Negative Voltage (SG2-OFF) |
| WL | Selected | 0V | 0V |
| | Non-Selected | Pass Voltage Vread (Positive) | |
| BL | | Prechage to Positive Voltage | |
| CELSRC | | 0V | |

FIG. 9

WRITE

|  |  | Selected Block | Non – Selected Block |
|---|---|---|---|
| SGD | | Positive Voltage (SG1-ON) | Negative Voltage (SG1-OFF) |
| SGS | | Negative Voltage (SG2-OFF) | Negative Voltage (SG2-OFF) |
| WL | Selected | Write Voltage Vpgm (Positive) | 0V |
|  | Non Selected | Pass Voltage Vm (Positive) |  |
| BL | | "0" Write Voltage = 0V  "1" Write Voltage = Vdd | |
| CELSRC | | 0V | |

SEMICONDUCTOR MEMORY DEVICE AND METHOD OF FABRICATING THE SAME

CROSS-REFERENCE TO RELATED APPLICATION

This application is a continuation of U.S. Ser. No. 11/616,522, filed Dec. 27, 2006, which claims priority under 35 U.S.C. 119(a)-(d) to Japanese Patent Application No. 2005-379017, filed on Dec. 28, 2005, the entire contents of both of which are incorporated herein by reference.

BACKGROUND OF THE INVENTION

1. Field of the Invention

This invention relates to an electrically rewritable and nonvolatile semiconductor memory device (EEPROM), more particularly relates to such a device that multiple memory cells are stacked on a semiconductor substrate to constitute a NAND cell unit, and a method of fabricating the same.

2. Description of the Related Art

A NAND-type flash memory is known as one of EEPROMs. In the NAND-type flash memory, multiple memory cells are connected in series in such a manner that adjacent two cells share a source/drain diffusion layer, thereby constituting a NAND cell unit. By use of this cell array arrangement, the unit cell area is smaller that that of a NOR-type one, and it is easy to increase the capacitance.

Further, since the NAND-type flash memory uses tunneling current for writing data, the consumption current is smaller than that of the NOR-type one, which uses hot-carrier injection. Therefore, it is possible to make a page capacitance defined as a simultaneously written cell range large, whereby it becomes possible to perform high-speed write/read.

To make the storage density of a unit area higher with the conventional structure, in which memory cells are formed in a single layer, it is in need of progressing the miniaturization or using a multi-level storage scheme. However, there is a limit for miniaturization. The increase of memory density based on the multi-level storage scheme also has a limit defined by data reliability.

By contrast, to make a NAND-type flash memory highly integrated, there has already been provided such a scheme as to stack memory cells on the semiconductor substrate (for example, refer to Patent Document 1: Unexamined Japanese Patent Application Publication No. 2005-85938). However, there are some problems in the disclosed method in this document as follows.

First, the channel regions and source/drain regions of memory cells in the NAND cell unit are formed to have different conductivity types from each other like that in the conventional, planar type NAND cell unit. Therefore, as the NAND cell unit is more miniaturized, the short-channel effect will become larger.

Second, in case the number of stacked memory cells is increased, i.e., the height of the memory cell unit (unit length) is enlarged, the aspect ratio also is increased. It will not only injure the process reliability but also cause the memory cell's operation delay.

Third, to achieve such a structure that a floating gate and a control gate are stacked in perpendicular to the side wall of a semiconductor pillar, it is necessary to repeatedly bury a highly resistive dielectric film for every memory cell formation process. Therefore, the number of processes is increased in proportion to the number of memory cells, and it leads to reliability reduction.

Another NAND-type flash memory, which has a possibility of solving the above described problems, has already been provided prior to the above-described Patent Application (refer to Patent Document 2: Unexamined Japanese Patent Application Publication No. 10-93083). In this Document 2, there is disclosed a NAND-type flash memory with vertical memory cells stacked, in which a gate wiring stack structure is previously formed, and semiconductor activation layers are formed opposite to the sidewalls of the gate wirings, respectively, with gate insulating films interposed therebetween.

However, in the Patent Document 2, after having patterned the gate wiring stack body and prior to the silicon layer formation, the source diffusion layer of NAND cell units (NAND strings) is formed by a selective diffusion method. This is because of that in case of p-type of channel bodies, and n-channel type of NAND cell units, it is in need of making the p-type silicon layer contacted with the p-type substrate. However, according to this method, the select gate transistor formed at the lowest portion of the silicon layer becomes to have an offset gate structure, in which the source diffusion layer is formed as separated from the gate edge. There is not provided a measure for avoiding such the problem. If as it is, it is impossible to achieve a desired operation of a NAND-type flash memory Further, in the Patent Document 2, a polycrystalline silicon film is used as word lines and select gate lines. Therefore, there is a limit for making the resistance of the word lines and select gate lines low, and it is difficult to achieve a usual NAND-type flash memory.

SUMMARY OF THE INVENTION

According to an aspect of the present invention, there is provided a semiconductor device including:

a semiconductor substrate;

an impurity diffusion layer formed in a cell array area of the semiconductor substrate to serve as a common source line in the cell array;

a gate wiring stack body formed on the cell array area of the substrate with an elongate pattern, in which multiple gate wirings are stacked and separated from each other with insulating films interposed therebetween;

a gate insulating film formed on the side surface of the gate wiring stack body, in which an insulating charge storage layer is contained;

a plurality of pillar-shaped semiconductor layers arranged in the elongated direction of the gate wiring stack body at a certain pitch, at least one side surfaces of which are opposed to the gate wiring stack body via the gate insulating film, other side surfaces thereof being in contact with a device isolating dielectric film, each the pillar-shaped semiconductor layer having the same conductivity type as the impurity diffusion layer and a lower impurity concentration than the impurity diffusion layer; and data lines formed to be in contact with the upper surfaces of the pillar-shaped semiconductor layers and intersect the gate wirings.

According to another aspect of the present invention, there is provided a method of fabricating a semiconductor memory device including:

forming a plurality of polycrystalline silicon films, which are stacked and separated from each other with insulating films interposed therebetween, in a cell array formation area of a semiconductor substrate;

etching the stack structure of the polycrystalline silicon films and the insulating films to form a gate wiring stack body with an elongate pattern, in which a plurality of gate wirings are stacked via the insulating films;

forming a gate insulating film on a first side surface of the gate wiring stack body, in which an insulating charge storage layer is formed;

forming a plurality of pillar-shaped semiconductor layers with the same conductivity type as the impurity diffusion layer and a lower impurity concentration than the impurity diffusion layer, which are arranged in the elongated direction of the gate wiring stack body and opposed to the first side surface of the gate wiring stack body via the gate insulating film;

forming a metal film on the second side surface of the gate wiring stack body, and annealing it to make the gate wirings silicides; and forming data lines to be in contact with the upper surfaces of the pillar-shaped semiconductor layers and intersect the gate wirings.

BRIEF DESCRIPTION OF THE DRAWINGS

FIG. 7 shows bias voltage relationships for explaining the erase operation of the flash memory.

FIG. 8 shows bias voltage relationships for explaining the read operation of the flash memory.

FIG. 9 shows bias voltage relationships for explaining the write operation of the flash memory.

DETAILED DESCRIPTION OF THE EMBODIMENTS

Illustrative embodiments of this invention will be explained with reference to the accompanying drawings below.

Embodiment 1

Figure 1:
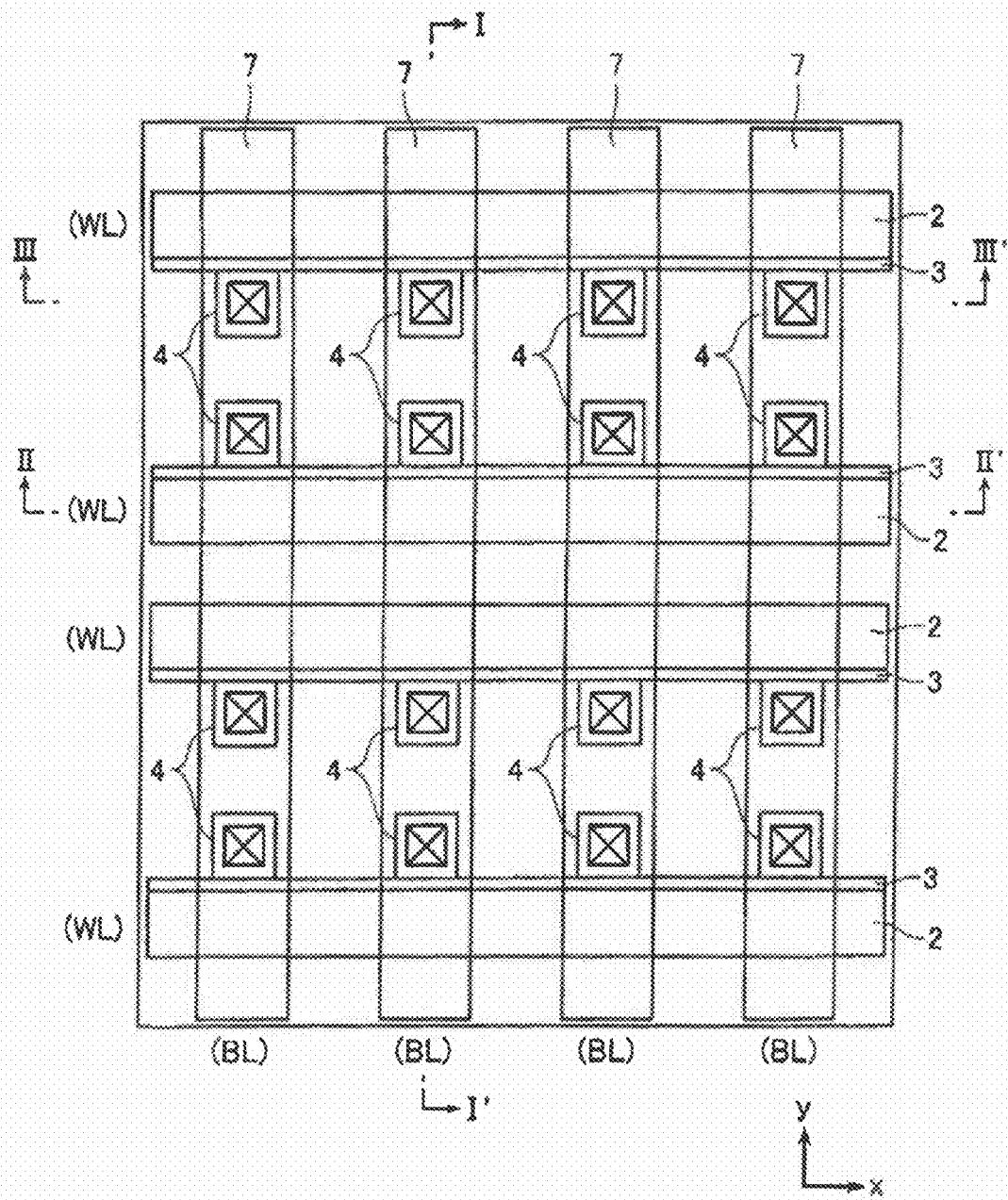
FIG. 1 is a plan view of a memory cell array in a NAND-type flash memory in accordance with an embodiment of the present invention.
Figure 2:
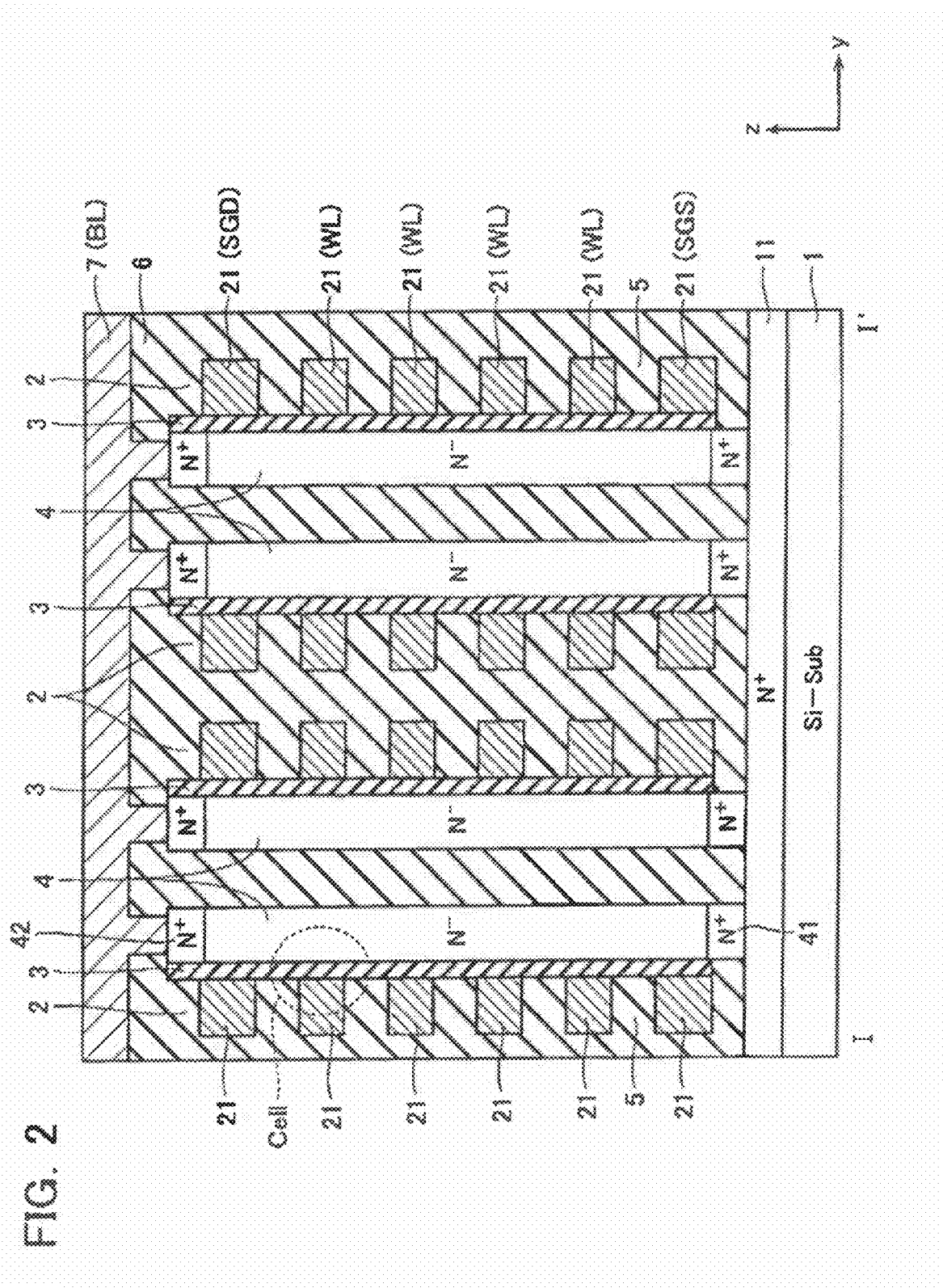
FIG. 2 is a sectional view taken along line I-I' in FIG. 1.
Figure 3:
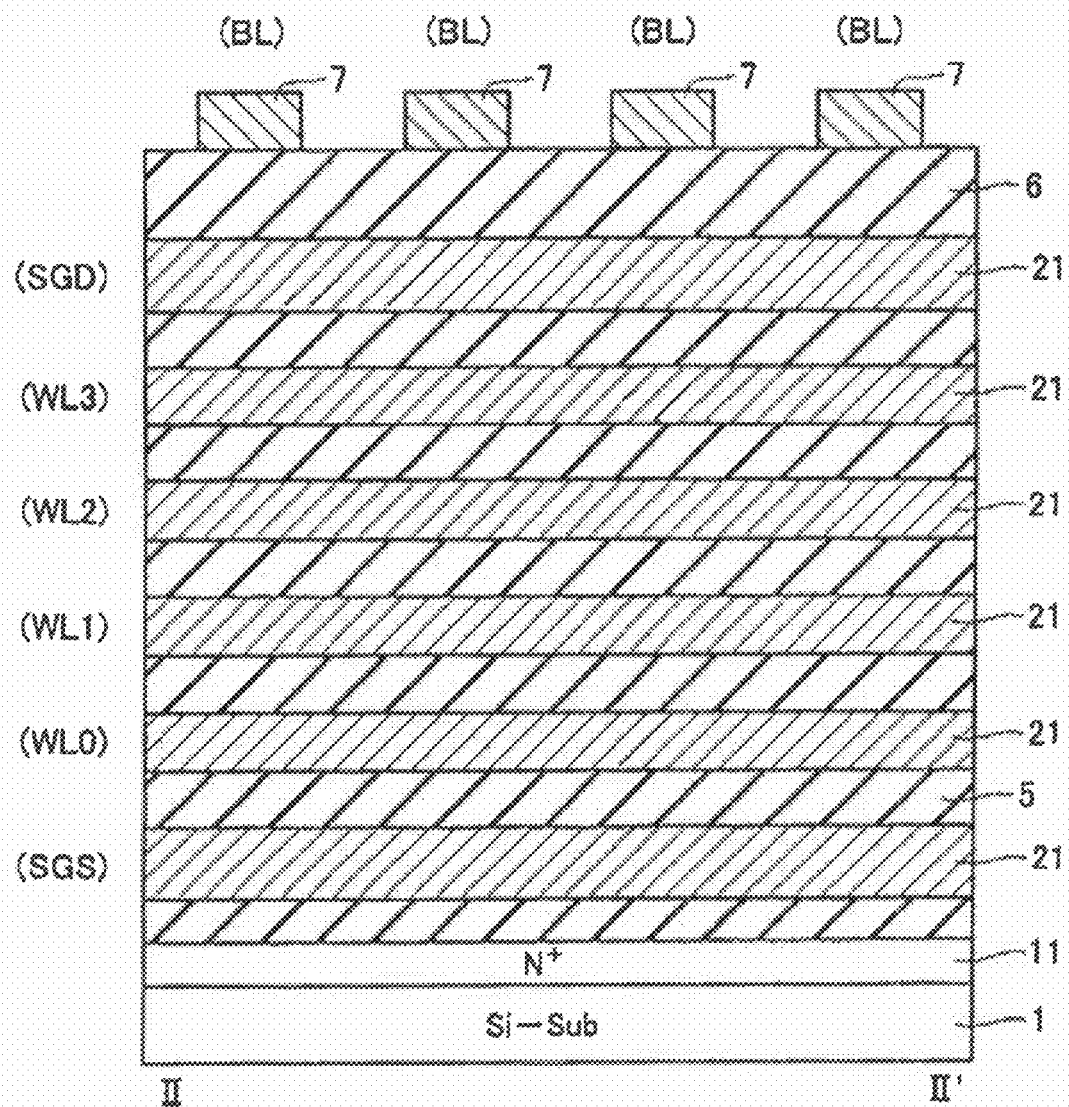
FIG. 3 is a sectional view taken along line II-II' in FIG. 1.
Figure 4:
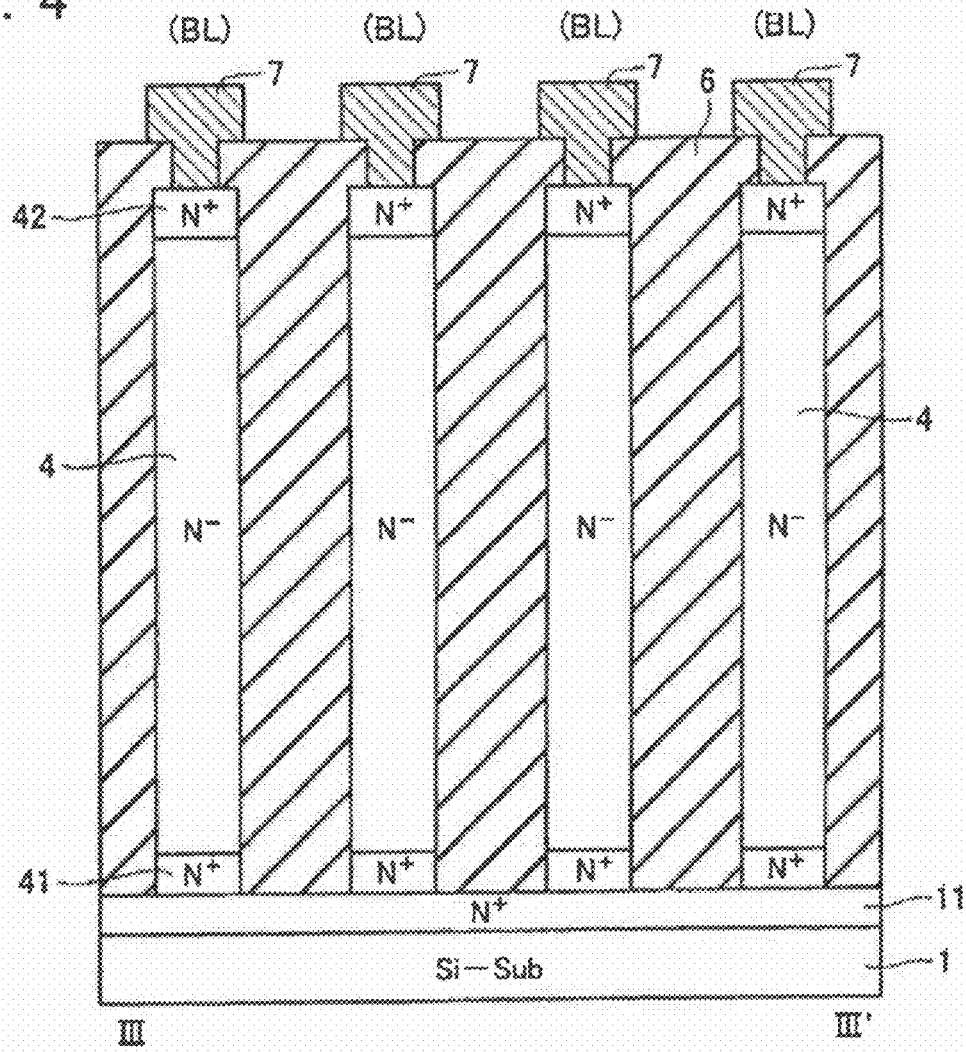
FIG. 4 is a sectional view taken along line III-III' in FIG. 1.

FIG. 1 is a plan view of a memory cell array of a NAND-type flash memory in accordance with an embodiment, and FIGS. 2, 3 and 4 are sectional views thereof taken along lines I-I', II-II' and III-III' in FIG. 1, respectively.

A plurality of gate wiring stack bodies 2 are formed on a silicon substrate 1, each of which has multiple gate wirings 21 stacked and separated from each other with interlayer dielectric films 5 interposed therebetween. Each of the gate wiring stack bodies 2 is patterned as elongated in x-direction in the x-y plane of the substrate 1.

The gate wirings 21 are formed of a metal film, the resistance of which is lower than that of a polycrystalline silicon film, for example, selected from tungsten (W), aluminum (Al), cupper (Cu), silicide thereof and the like. Alternatively, the gate wirings 21 may be initially formed as polycrystalline silicon wirings, and then reformed as silicide wirings by a salicide (Self Aligned Silicide) step. As a result, it is possible to form so low-resistive gate wirings as not been achieved when a polycrystalline silicon film is used.

Explaining in detail, in the stacked gate wirings 21, the lowest and the uppermost ones serve as select gate lines (SGS and SGD), which are gates of the vertical select gate transistors; and four wirings disposed between them serve as word lines WL (WL0-WL3), which are control gates of memory cells.

The thickness of the gate wirings serving as the select gate lines SGS and SGD, i.e., gate length, is set to be larger than that of gate lines of memory cells (i.e., word lines). This is for making the cut-off property of the select gate transistors good. Although, in this example, one NAND cell unit is formed of four word lines, the present invention is not limited to this example.

Formed on one side surface of the gate wiring stack body 2 is a gate insulating film 3, in which an insulating charge storage layer is formed. Pillar-shaped silicon layers 4, which serve as activation layers of memory cells, are formed to be opposite to the side surface of the gate wiring stack body 2 via the gate insulating film 3. The silicon layers 4 are formed pillar-shaped with about the same height as the gate wiring stack bodies 2, and arranged at a certain pitch in the elongated direction (i.e., x-direction) of the gate wiring stack bodies 2. Side surfaces of the pillar-shaped silicon layer 4 are in contact with device isolating dielectric film 6 except that opposite to the gate wiring stack body 2.

The pillar-shaped silicon layer 4 is $N^-$-type one with a low impurity concentration, on the top surface of which an $N^+$-type of diffusion layer 42 is formed for bit line contacting. On the bottom surface of the silicon layer 4, another $N^+$-type of diffusion layer 41 is formed due to impurity diffusion from the $N^+$-type of diffusion layer 11 formed on the surface of the substrate 1. The $N^+$-type layer 11 is formed on the whole surface of the memory cell array area and it serves as a common source line of the cell array.

As shown by a dotted line in FIG. 2, one gate wiring (word line) 21 and one pillar-type silicon layer 4 disposed opposite to it with the gate insulating film 3 interposed therebetween constitute an electrically rewritable and non-volatile memory cell, Cell. This memory cell is a vertical cell with a gate length (i.e., channel length) defined by the thickness of the gate wiring 21. Multiple memory cells are stacked to constitute a NAND cell unit (NAND string).

Figure 5:
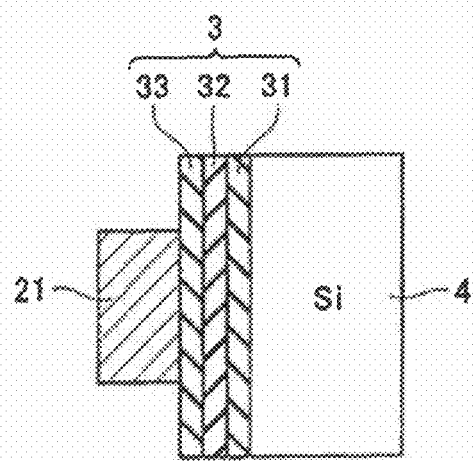
FIG. 5 is an enlarged sectional view of one memory cell in FIG. 2.

FIG. 5 is an enlarged sectional view of a memory cell. The gate insulating film 3 is a laminated one, the medium layer 32 of which has a function of a charge storage layer. For example, this laminated film is a so-called ONO film, which is formed of silicon oxide film 31, silicon nitride film 32 and silicon oxide film 33.

Note here that other insulating films may be used in place of the silicon nitride film 32, and other insulating films may be used in place of the silicon oxide film 33, which have dielectric coefficient higher than the silicon oxide film. This memory cell is conventionally referred to as a MONOS (Metal Oxide Nitride Oxide Semiconductor)-type of cell.

In this memory cell, since the entire gate insulating film including the charge storage layer is an insulator film, there is no need of using a process for separating the floating gates for every cell as different from the floating gate type memory cell. That is, the gate insulating film 3 may be formed over the side surface of the gate wiring stack body 2, and it is not necessary to pattern it. As a result, the stacked structure of the vertical cells may be easily achieved.

It is difficult in technique to selectively form source and drain diffusion layers of the memory cells to be stacked by ion implantation and the like. Therefore, in this embodiment, source and drain diffusion layers are not formed in the $N^-$-type of pillar-shaped silicon layer 4 except $N^+$-type layers 41 and 42 formed on the bottom and top surfaces, respectively. In other words, the $N^-$-type of silicon layer 4 is used as channel regions, source and drain regions as it is. For this reason, the threshold voltage of the select gate transistors may be negative, and a negative voltage may be used to turn off the select gate transistors as described later.

The top surfaces of the NAND cell units are covered by an insulating film 6, on which data lines, i.e., bit lines 7 are formed. Bit lines 7 are pattered to be elongated in y-direction and in contact with the upper diffusion layers 42 of the NAND cell units.

Figure 6:
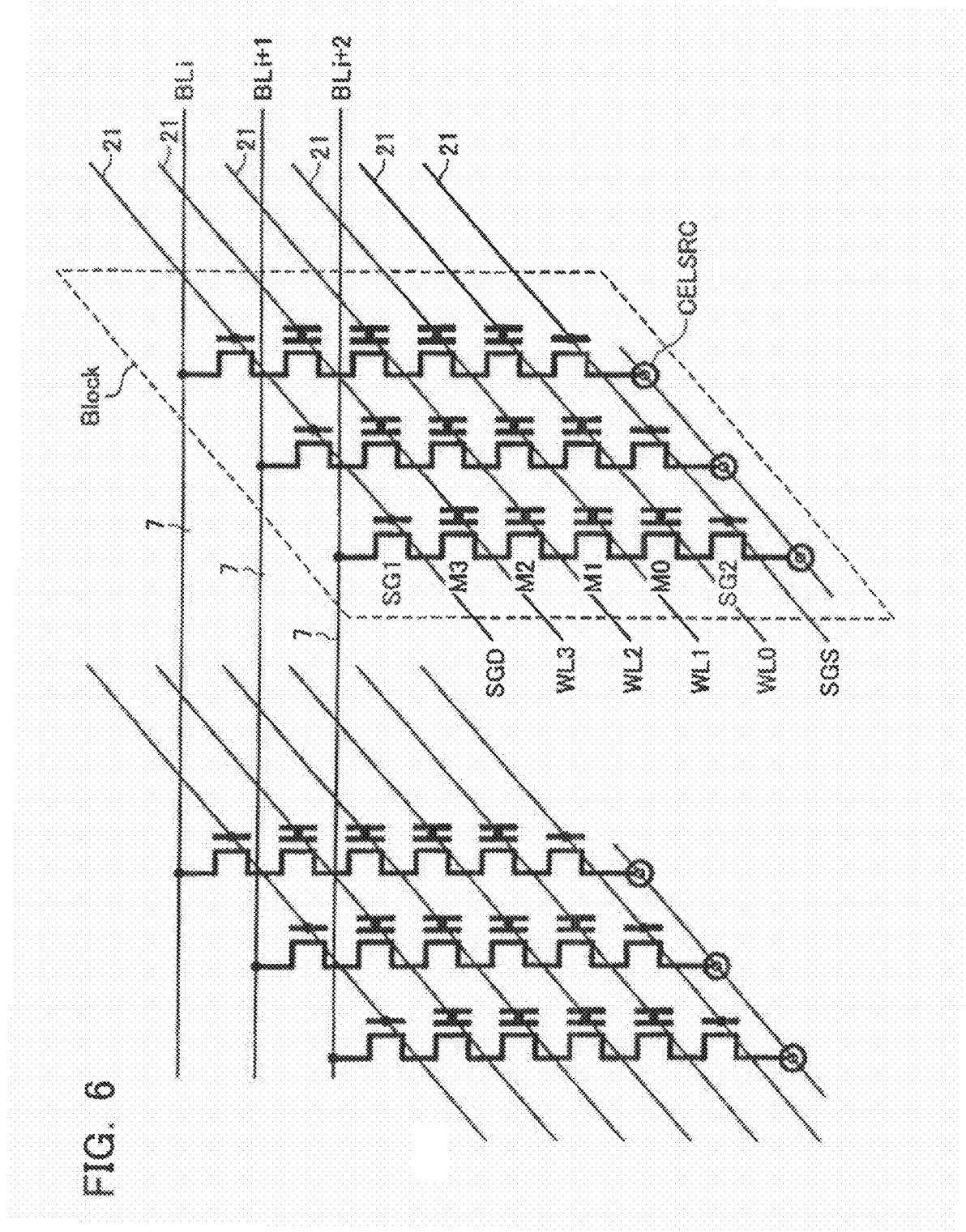
FIG. 6 shows an equivalent circuit of the memory cell array.

FIG. 6 shows an equivalent circuit of the memory cell array arranged with NAND cell units each having stacked vertical cells as described above. Gate wirings 21 of the memory cells M0-M3 serve as word lines WL0-WL3, respectively; and gate wirings 21 of the select gate transistors SG1 and SG2 serve as select gate lines SGD and SGS, respectively.

$N^+$-type diffusion layer 11 formed on the cell array area of the substrate 1 serves as the common source line CERSRC. A set of NAND cell units arranged in the direction of the word lines constitutes a block, which serves as an erase unit.

The operations of the NAND-type flash memory in accordance with this embodiment will be explained below. The memory cell array is initially set in an erase state (refer to as, for example, data "1" state) with a negative threshold voltage, and it will be written into such a state that memory cells are selectively set in a positive threshold state (refer to as data "0" state). This is a basic binary data storage scheme.

Setting more threshold levels, multi-level data storage may be performed. For example, setting three positive threshold voltages, it will be achieved a four-level storage.

Data erase is performed by a block. As shown in FIG. 7, with respect to a selected block, the select gate lines SGD and SGS, and bit lines BL are set in a floating state; all word lines are set at 0V; and a boosted and positive erase voltage Vera is applied to the common source line CELSRC. As a result, electrons stored in the charge storage layers in the selected block will be discharged, resulting in that the memory cells are erased in a state of a negative threshold voltage.

In non-selected blocks, the select gate lines SGD, SGS, bit lines BL and word lines WL are set in a floating state. These floating nodes are boosted in potential by capacitive coupling, so that a large electric field is not applied between the charge storage layers and the silicon pillar layer, and data are not erased. Further, the boosted potential of the non-selected block disposed adjacent to the selected block will not step-down in potential the pillar-shaped silicon layer in the selected block, and serve for keeping the potential of the pillar-shaped silicon layer in the selected block necessary for erasing.

Data read is performed, as shown in FIG. 8, under the condition that with respect to a selected block, select gate lines are applied with a positive voltage to sufficiently turn on the select gate transistors; a selected word line with 0V; and the remaining non-selected word lines with a positive read pass voltage Vread, which turns off cells without regard to cell data. The common source line CELSRC is set at 0V. The bit lines are initially precharged to a certain voltage VBL, and then set in a floating state.

As a result, the bit lines will be discharged in accordance with selected cell data. Therefore, detecting the bit line voltage after a certain bit line discharge operation, data will be read out.

In the non-selected blocks, as shown in FIG. 8, select gate lines SGD and SGS are applied with a negative voltage, which keeps the select gate transistors off. As a result, the non-selected blocks are separated from the bit lines.

Data write is, as shown in FIG. 9, performed under the condition of that with respect to a selected block, the source line side select gate line SGS is applied with a negative voltage to keep the select gate transistor SG2 off; the bit line side select gate line SGD with a positive voltage Vsg to turn on the select gate transistor SG1; a selected word line with a boosted and positive write voltage Vpgm; and non-selected word lines with a write pass voltage (medium voltage) Vm (<Vpgm).

Applied to the bit lines are Vss (=0V) in case of "0" write; and Vdd in case of "1" write (i.e., write inhibiting) in accordance with write data. With these bit line voltages, in case of "0" write, selected NAND cell channels are set at 0V while in case of "1" write, the sources of the bit line side select gate transistors are boosted to Vsg-Vth (Vth is the threshold voltage of the select gate transistors), resulting in that the selected NAND cell channels are set in a floating state.

As a result, in the "0" write cell, electrons are injected into the charge storage layer, and the cell threshold voltage is made positive. By contrast, in the "1" write cell, the cell channel is boosted in potential by capacitive coupling. Therefore, electron injection does not occur, thereby keeping the "1" write cell in the erase state ("1" data state) as it is.

In non-selected blocks, applying 0V to all word lines; and applying 0V or a negative voltage to the select gate lines SGS and SGD with, the NAND cell units are kept as separated from the bit lines.

Next, the fabrication steps of the flash memory in accordance with this embodiment will be explained with reference to FIGS. 10-20 below. FIGS. 10-17 and 19 are perspective views of the respective fabrication steps, in which I-I' sectional views corresponding to that shown in FIG. 2 are shown.

Figure 10:
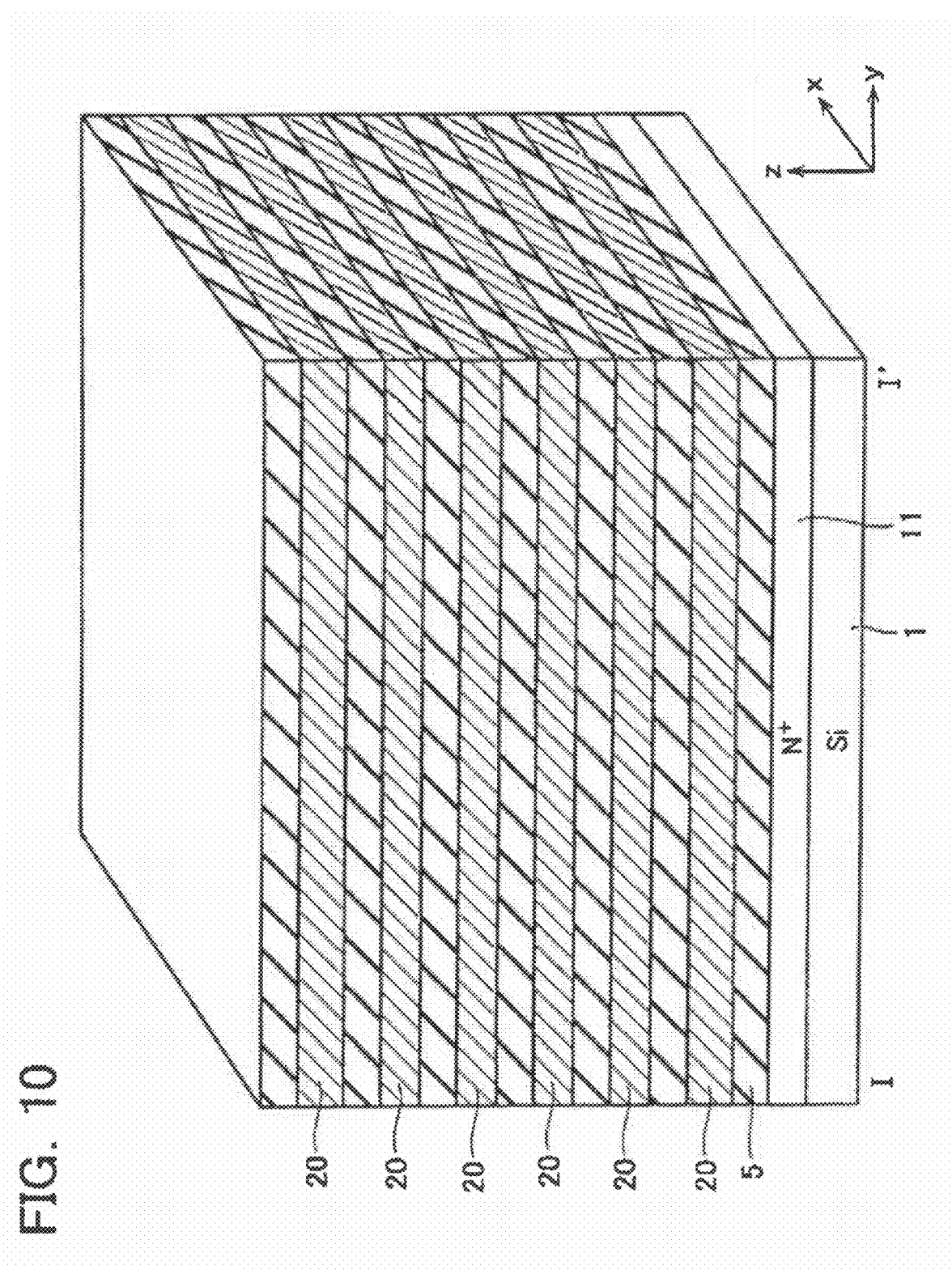
FIG. 10 shows the step of depositing the gate wiring material film of the flash memory.

On the silicon substrate 1, $n^+$-type diffusion layer 11 is formed on the whole cell array formation area. As shown in FIG. 10, after having formed an interlayer dielectric film 5, a wiring material film 20 is formed thereon. Repeatedly performing the same film formation, multiple gate wiring material films 20 are stacked as separated from each other with the interlayer dielectric films 5. The gate wiring material film 20 is tungsten(W) film or silicide thereof (WSi) in this embodiment, but other high-melting point metals or silicide thereof may be used.

Figure 11:
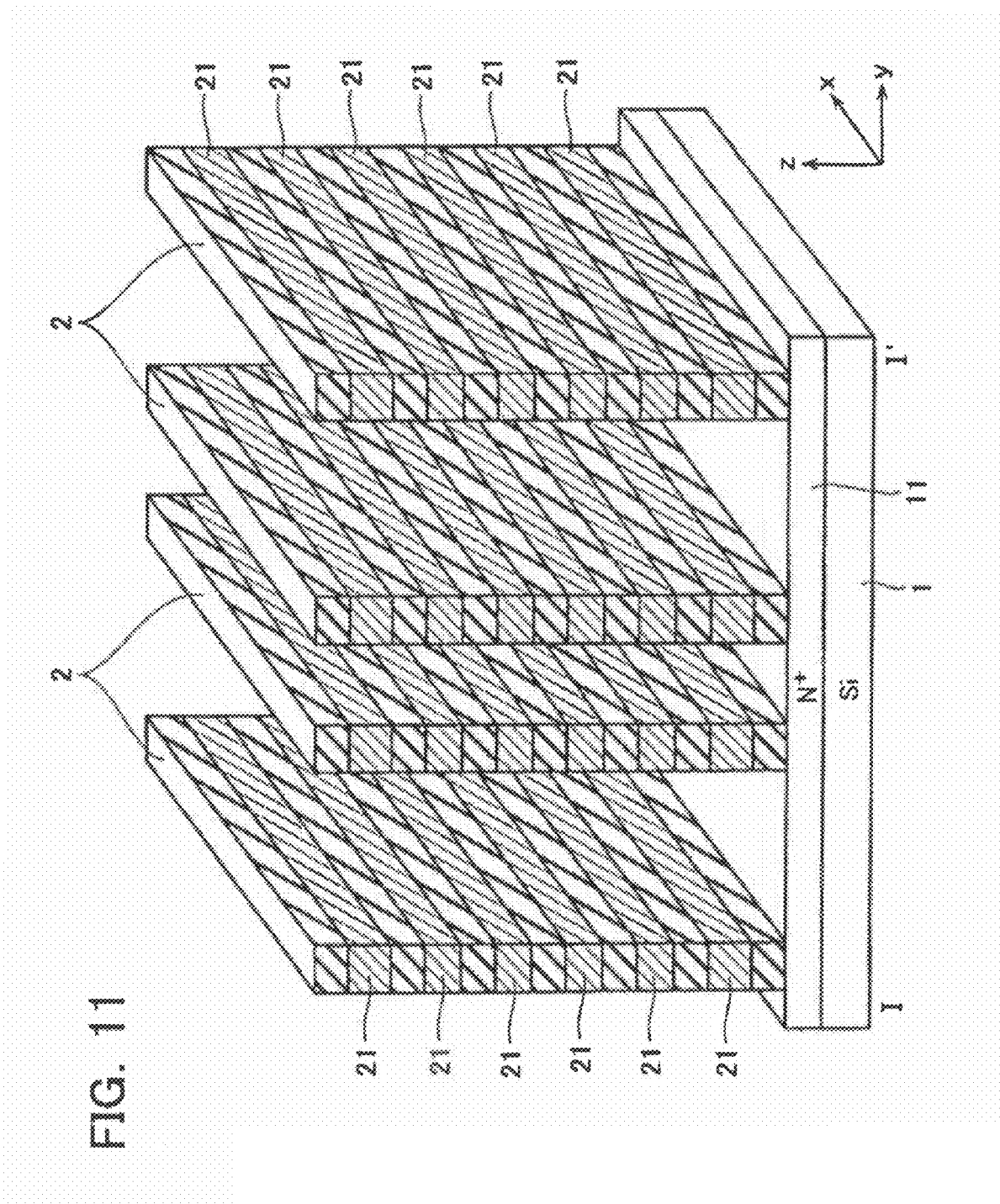
FIG. 11 shows the step of patterning the gate wiring material film.

Following it, as shown in FIG. 11, vertically etch the stacked structure of the gate wiring material films by RIE, and divide it into plural gate wiring stack bodies 2 separated from each other, each of which has plural gate wirings 21 stacked and a stripe pattern elongated in x-direction. This stripshaped gate wiring stack body 2 is formed in such a state that gate wirings 21 and dielectric films 5 are alternately exposed on the side surfaces (x-z planes) thereof.

Figure 12:
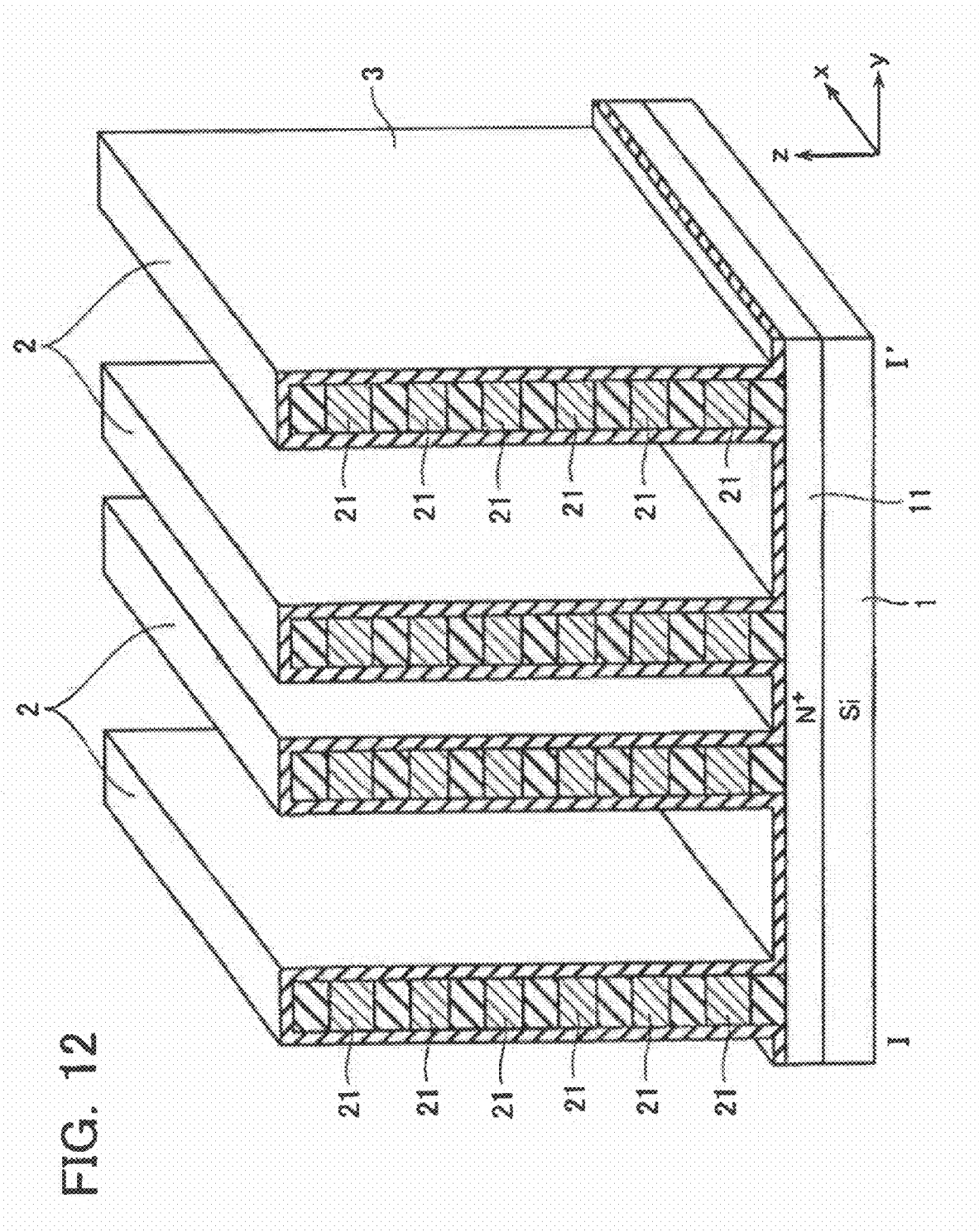
FIG. 12 shows the step of forming the gate insulating film.
Figure 13:
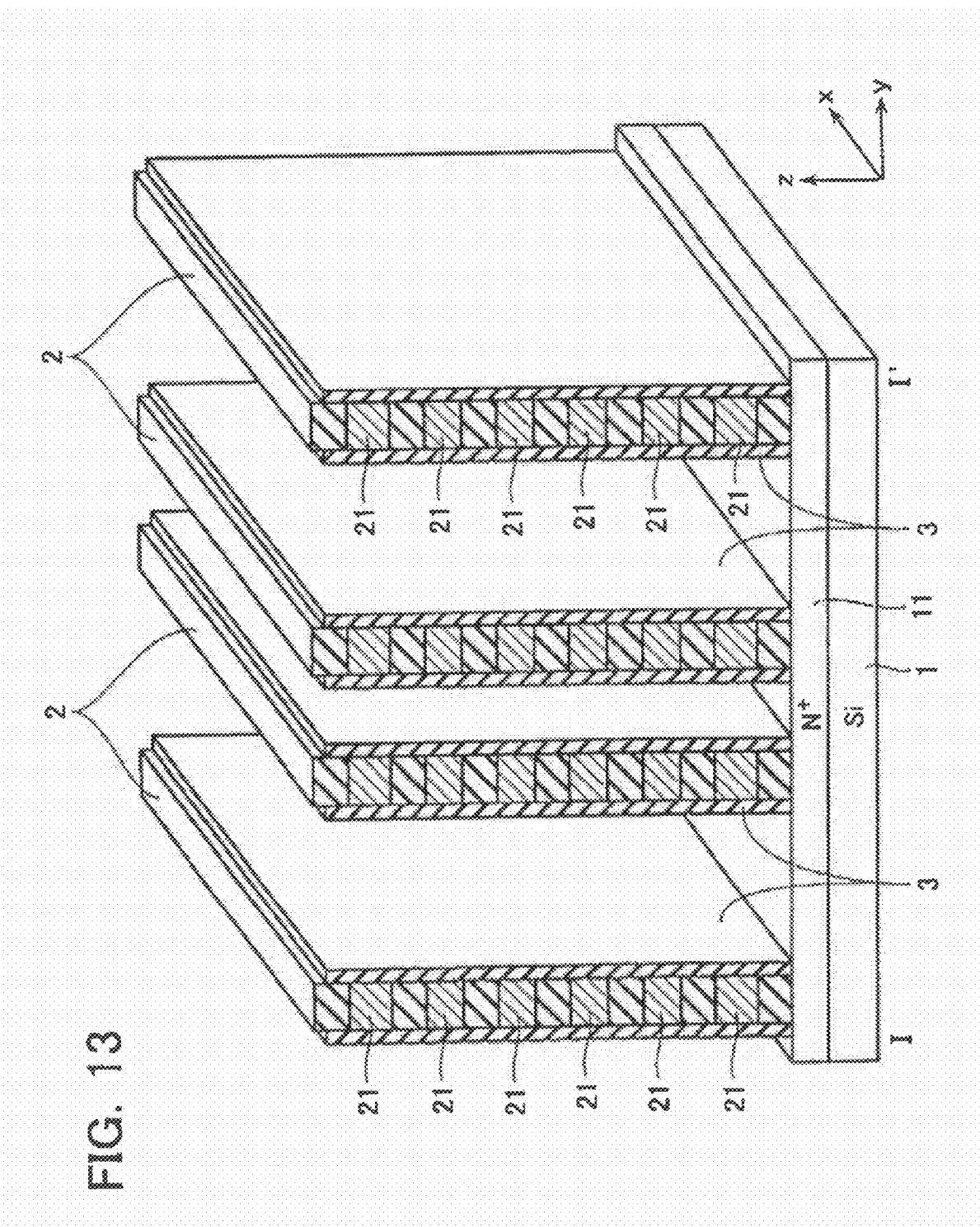
FIG. 13 shows the step of etching the gate insulating film.

Next, as shown in FIG. 12, gate insulating film 3 is deposited with a good step-coverage deposition method in such a manner that it is formed on the side surfaces of the gate wiring stack bodies 2 with a constant thickness. As described above, the gate insulating film 3 has a stacked structure of silicon oxide film/silicon nitride film/silicon oxide film. The gate insulating film 3 is, as shown in FIG. 13, subjected to etchback, and remained only on the side surfaces of each gate wiring stack body 2.

Figure 14:
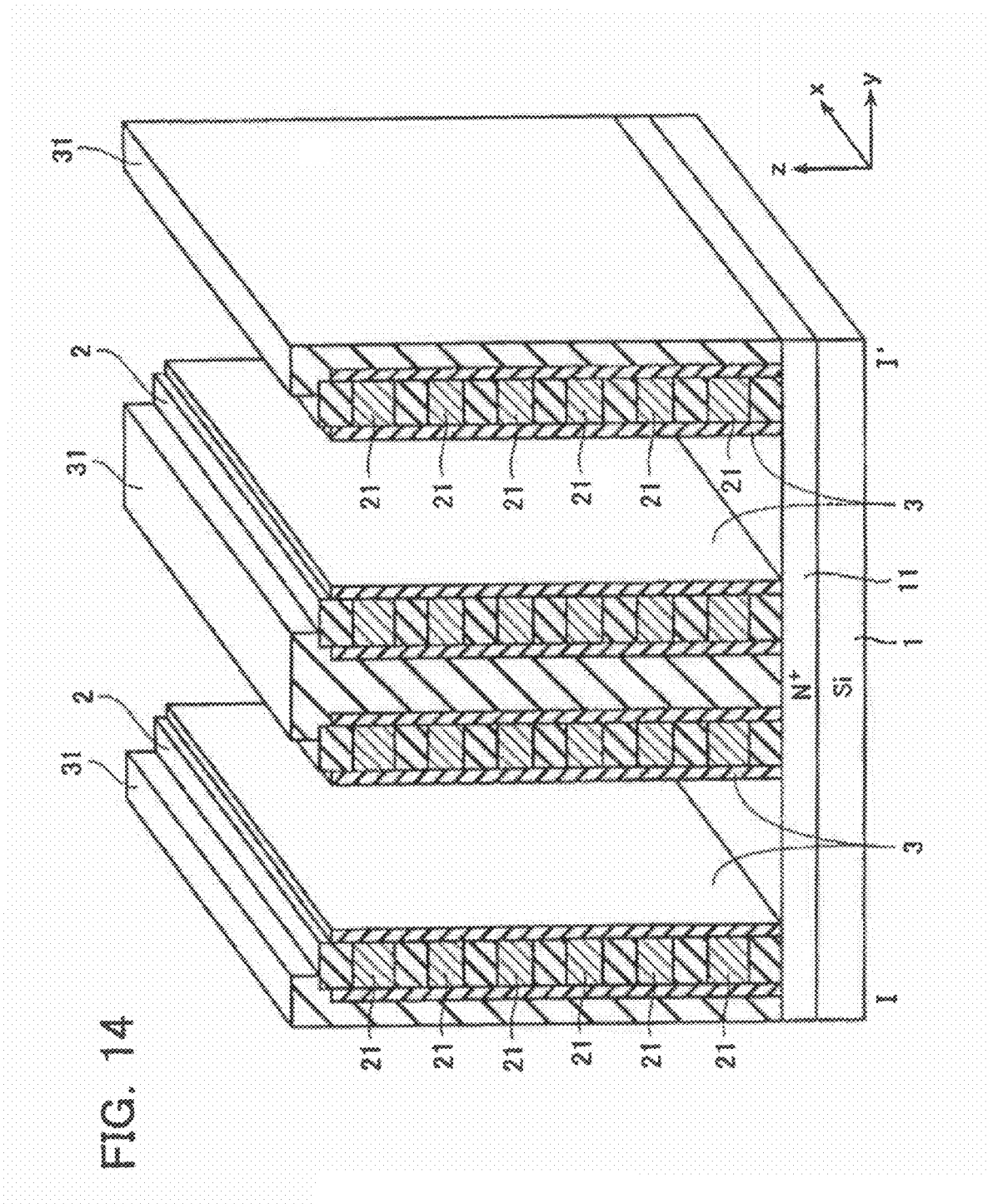
FIG. 14 shows the step of forming an insulating film of one side surface of the gate wiring stack body.

Next, after having deposited and planarized insulating film 31 to be buried in the spaces between the gate wiring stack bodies 2, as shown in FIG. 14, it is selectively etched by RIE to expose only one side surface (on which activation layer is to be formed) of the gate wiring stack body 2.

Figure 15:
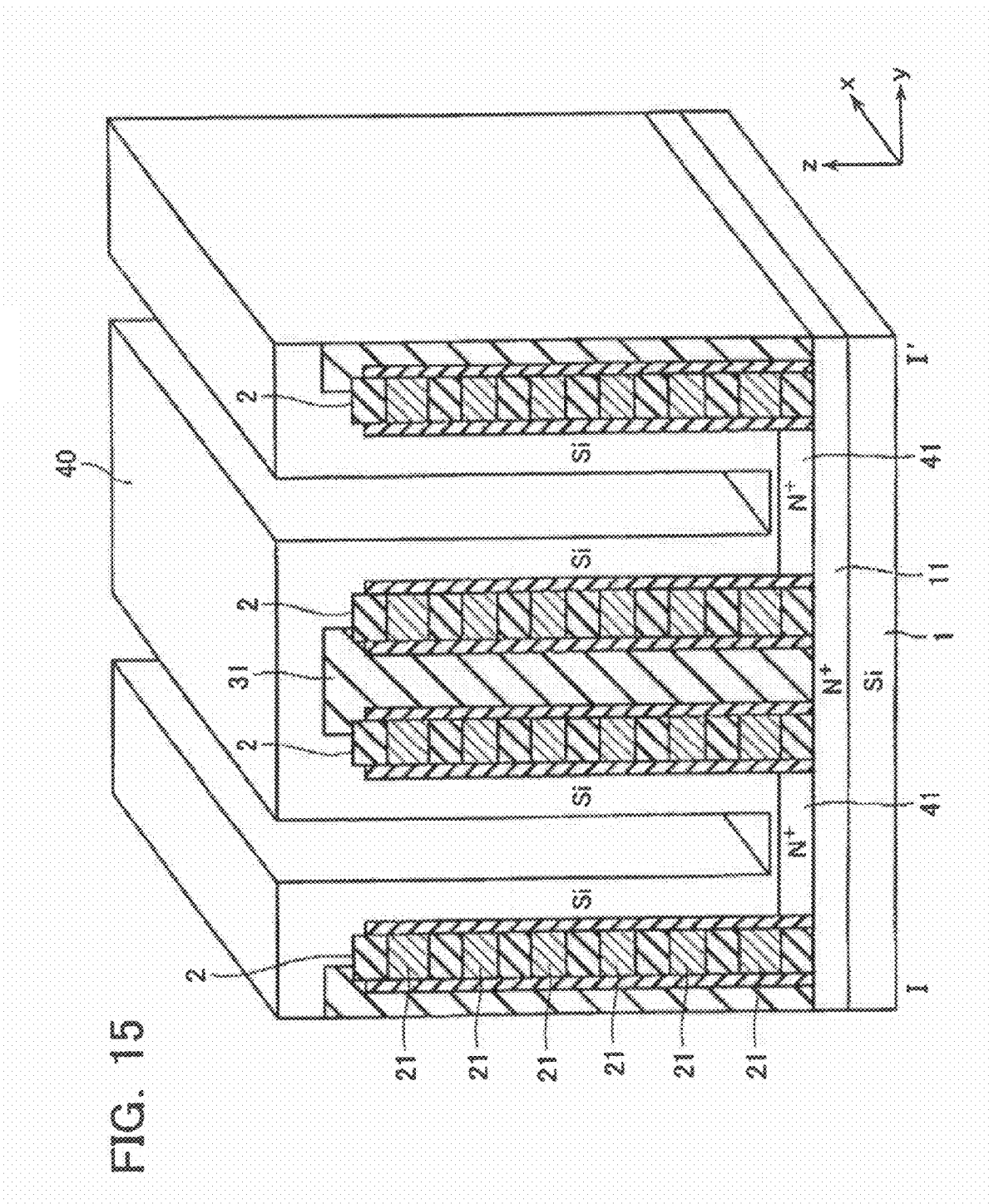
FIG. 15 shows the step of forming a silicon layer serving as a memory cell activation layer.

Following it, as shown in FIG. 15, amorphous silicon layer 40 is deposited and subjected to annealing treatment. As a result, the silicon layer 40 is crystallized due to solid-phase epitaxial growth by use of the silicon substrate 1 as a seed. In detail, the silicon layer 40 is $N^-$-type layer with relatively low impurity concentration such as $10E19/cm^3$ or less. In the crystallizing anneal process, impurities in the $N^+$-type layer 11 formed on the surface of the substrate 1 are diffused into the silicon layer 40, so that $N^+$-type diffusion layer 41 is formed on the bottom of the silicon layer 40.

The diffusion layer 41 is formed in such a manner that upper surface thereof reaches the bottom surface of the lowest gate wiring 21 (i.e., select gate line SGS), thereby preventing the select gate transistor from being in a gate-offset state. If necessary for this purpose, annealing may be performed in addition to the crystallizing anneal process.

Figure 16:
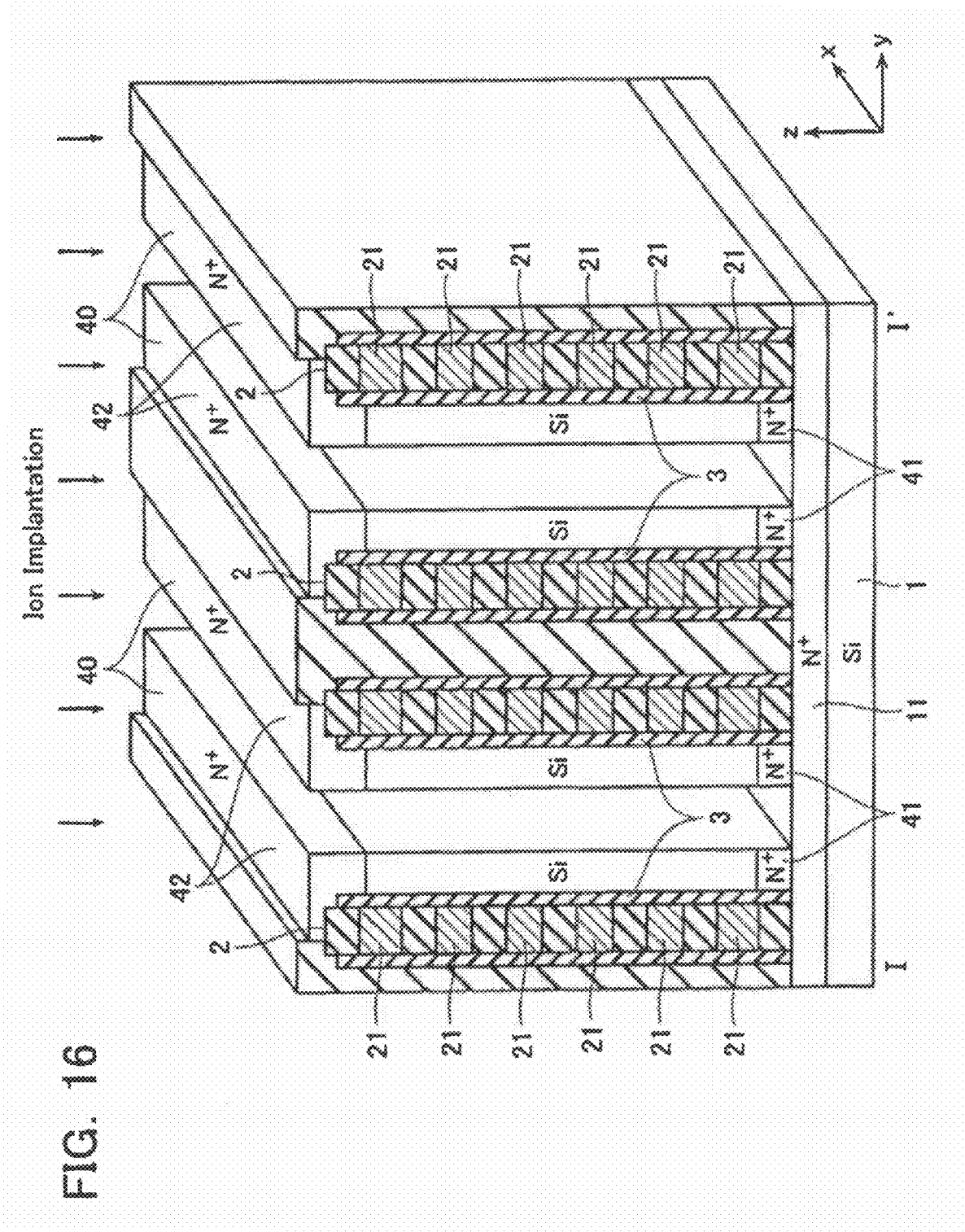
FIG. 16 shows the step of etching the silicon layer to be remained on one side surface of the gate wiring stack body.

Then, as shown in FIG. 16, the silicon layer 40 is etched to be remained only on one side surface of the gate wiring stack body 2. In this state, N-type impurity ions are implanted, and $N^+$-type layers 42 are formed on the top surfaces of the silicon layers 40 formed on the side surfaces of the gate wiring stack bodies 2 and separated from each other, each of which serves as a bit line contact.

Figure 17:
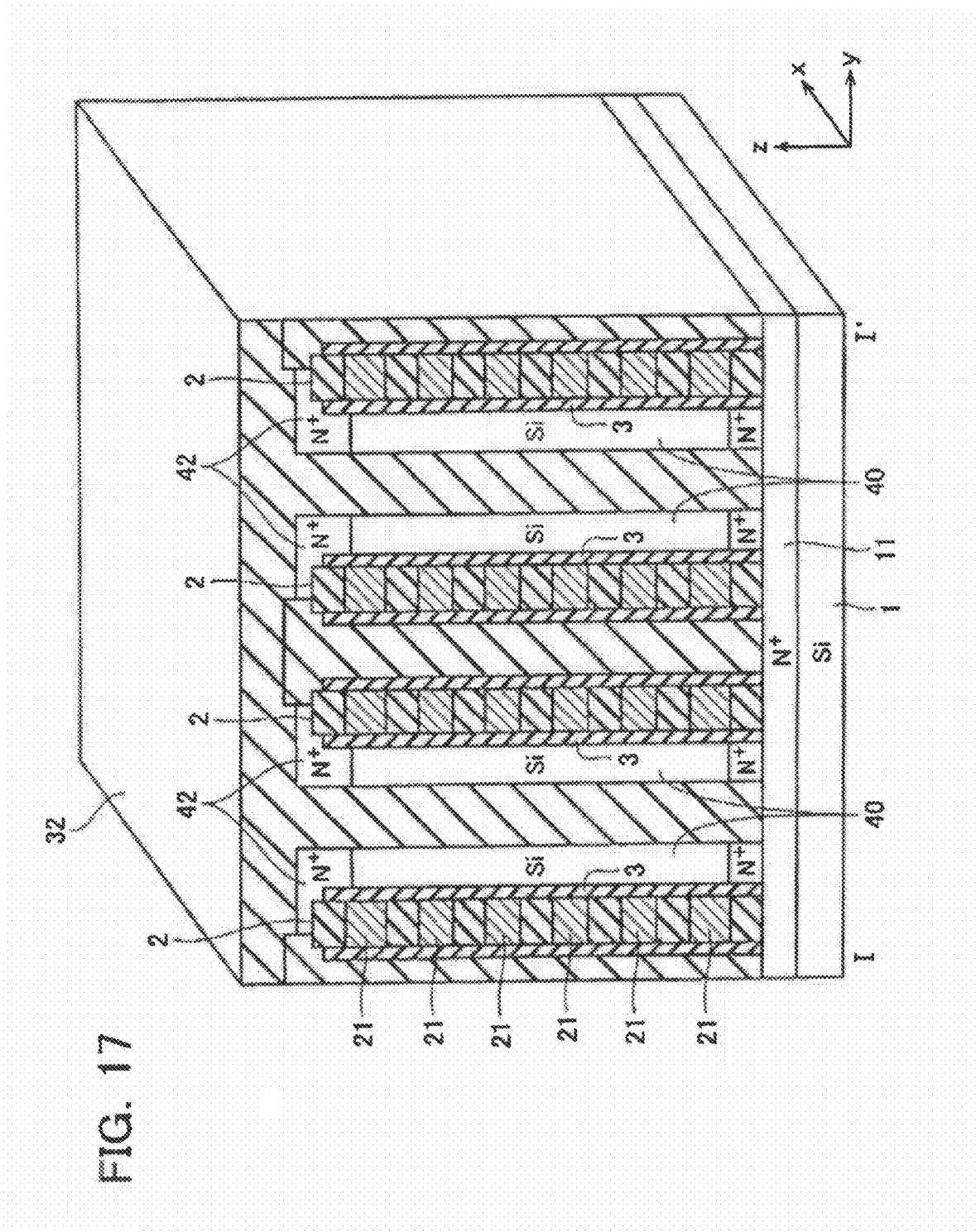
FIG. 17 shows the step of depositing an insulating film and planarizing it.

Next, as shown in FIG. 17, insulating film 32 is deposited and planarized.

Figure 18:
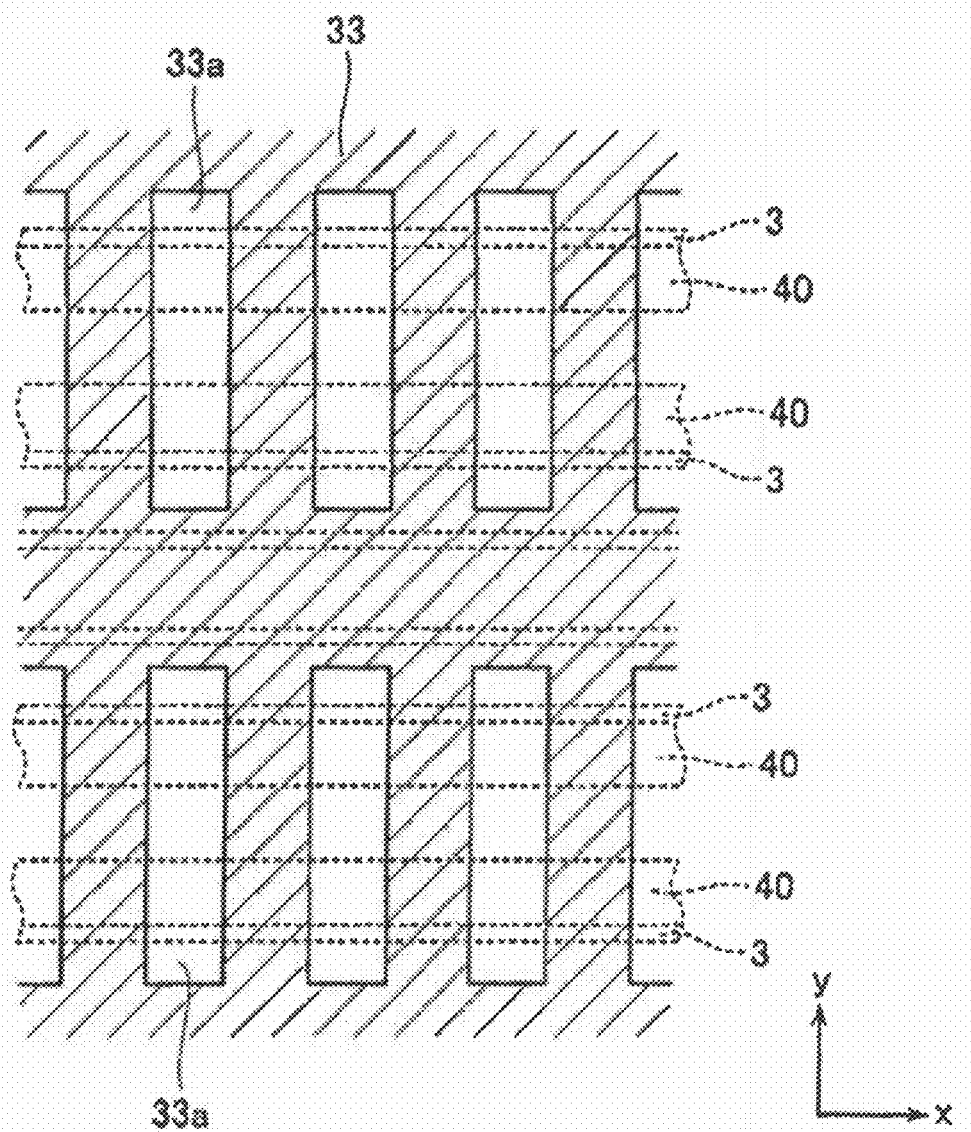
FIG. 18 shows a resist mask pattern used for etching the silicon layer.

Thereafter, the silicon layers 40, which are elongated in x-direction at this stage, will be processed to become multiple pillar-shaped silicon layers arranged in x-direction at a certain pitch. For this purpose, as shown in FIG. 18, resist pattern 33 is formed on the planarized surface of the insulating film 32, which has etching openings 33a for dividing the silicon layer 40 into plural layers arranged at a certain pitch in the x-direction.

With this resist pattern 33, the insulating film 32 is etched so as to expose the silicon layer 40 at a first step, and then the exposed silicon layer 40 is etched so as to expose the silicon substrate 1.

Figure 19:
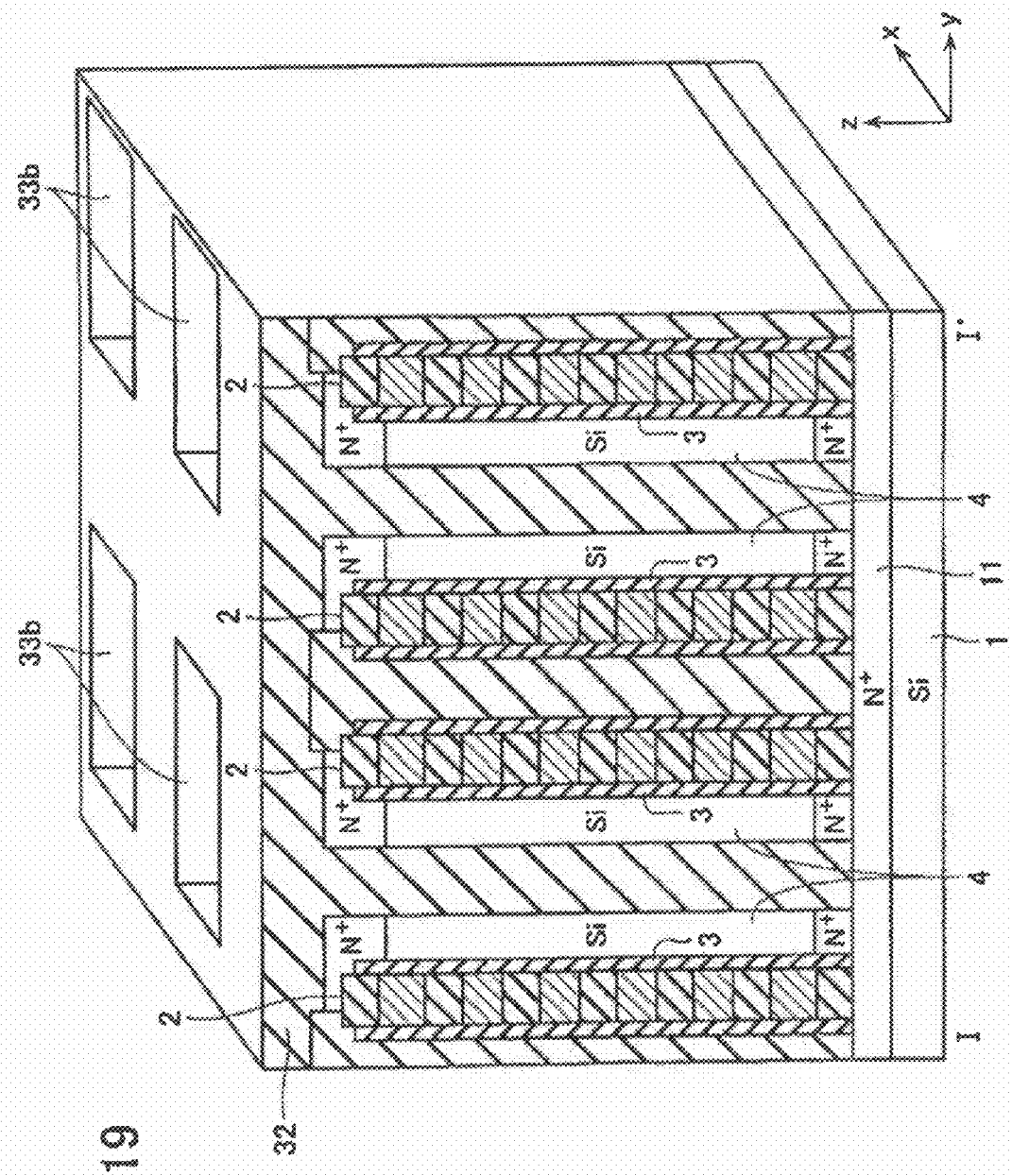
FIG. 19 shows the step of insulating film etching and silicon etching with the resist mask.
Figure 20:
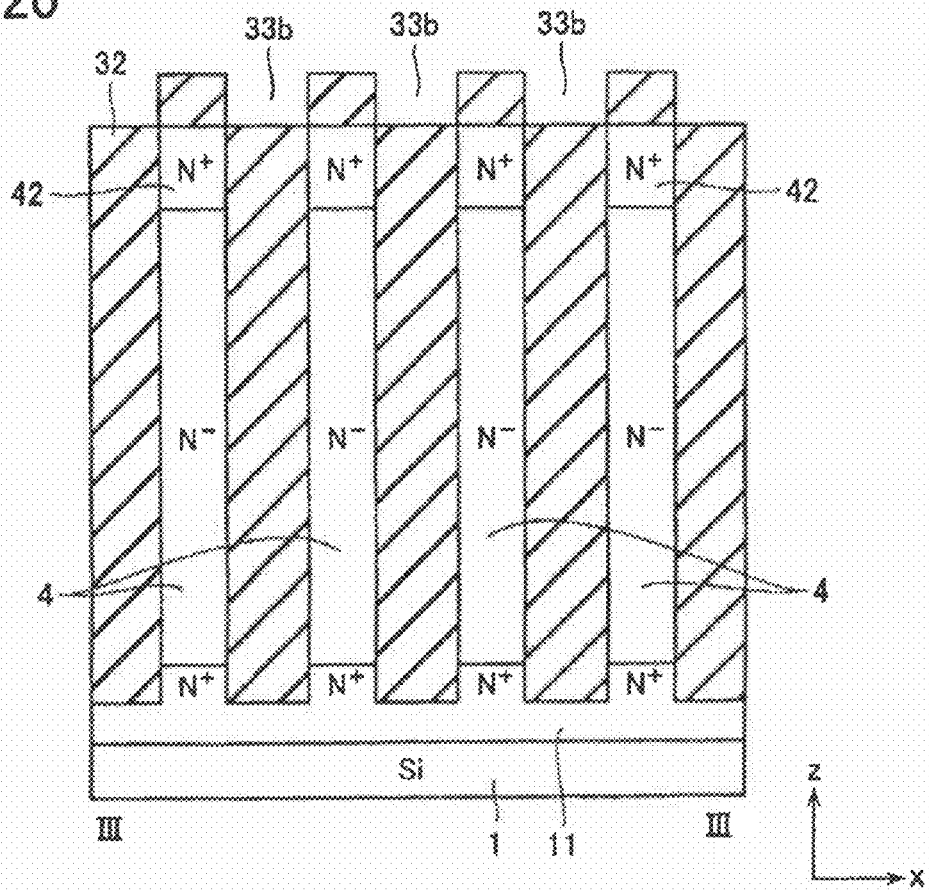
FIG. 20 is the III-III' sectional view showing the state that the silicon layer is divided into pillar-shaped silicon layers.

FIG. 19 shows such a state that windows 33b are formed in the insulating film 32 corresponding to the openings 33a of the resist pattern 33. Etching the silicon layer 40 via the windows 33b, as shown in FIG. 20 (III-III' sectional view of FIG. 1), pillar-shaped silicon layers 4 are dispersedly formed to be arranged along each gate wiring stack body 2 at a certain pitch.

Thereafter, as explained with reference to FIGS. 1 to 4, insulating film 6 is further deposited; contact holes are formed therein; and bit lines 7 are formed to be in contact with $N^+$-type layers 42 on the top surfaces of the pillar-shaped silicon layers 4. As a result, the memory cell array formation will be completed. One side surface of each pillar-shaped silicon layer 4 is opposite to the gate wiring stack body 2, and the remaining side surfaces are in contact with the device isolating film gate formed of insulating films 32 and 6.

Figure 21:
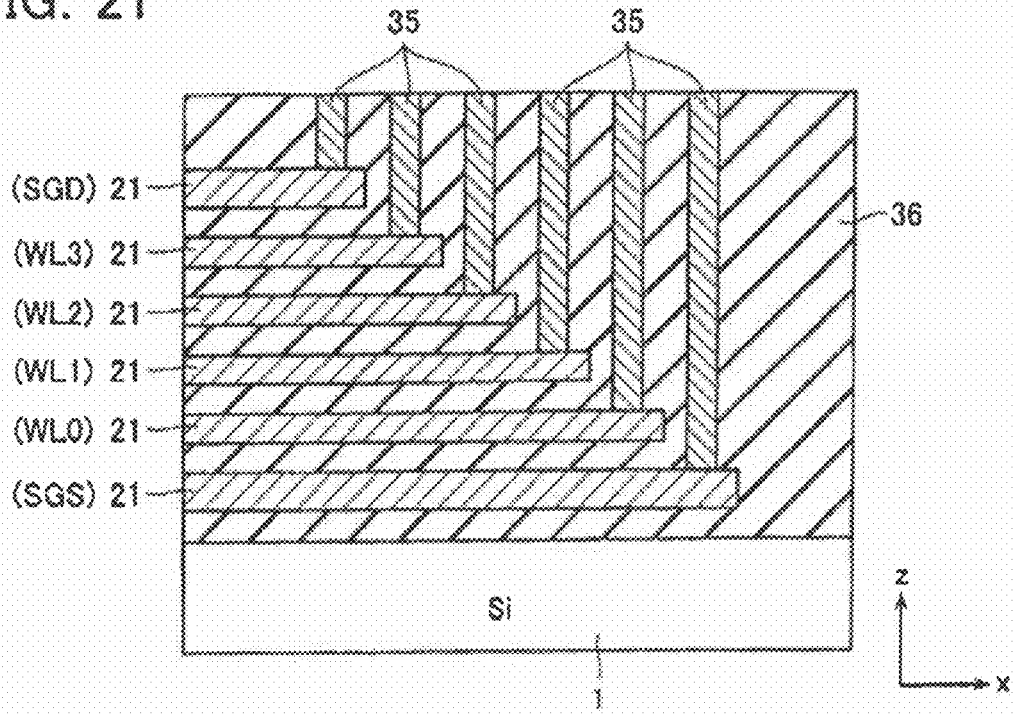
FIG. 21 shows the structure of drawing portions of the gate wirings.

FIG. 21 shows a drawing structure of the stacked gate wirings 21. As shown in FIG. 21, the extended portions of the gate wirings 21 from the cell array area edge are formed in such a state that the lower, the longer, and contact pugs 35 are buried in the interlayer insulating film 36 to be in contact with the end portions of the gate wirings 21, respectively. As a result, the gate wirings 21 will be coupled to the corresponding metal wirings (not shown) to be formed on the insulating film 36.

According to this embodiment, the gate wiring stack body is formed with the steps of: alternately depositing gate wiring films and insulating films; and etching the stacked structure to be stripe-shaped. The gate material films exposed on the side surfaces of the gate wiring stack body are used as gate electrodes, on the side surface of which a gate insulating film including charge storage layer and an activation silicon layer are formed, and then the silicon layer is subjected to separation process to be formed as pillar-shaped silicon layers, each of which serves as a vertically stacked NAND cell unit.

According to the method shown in Patent Document 1, in which a pillar-shaped silicon layer is initially formed, and then select gate lines and word lines are formed to surround the silicon layer, the line/space formation process of the select gate lines and word lines is too complicated to realize the structure.

By contrast, in this embodiment, after having formed the gate wiring stack body, the gate insulating film and the pillar-shaped silicon layer are formed. Therefore, it is able to form the gate wiring stack body by alternately depositing the gate electrode material films and the insulating films on a plane semiconductor substrate. In other words, the gate wiring stack body may be easily formed with a precise size.

Further, in case the memory cells are vertically stacked, it is difficult in the process technology to form source/drain diffusion layers thereof or charge storage layers thereof for every memory cell. In consideration of this point, in this embodiment, $N^-$-type silicon activation layer is used as sources, drains and channel regions of the vertically stacked memory cells as it is, resulting in that there is no need of performing selective ion implantation.

In case the pillar-shaped silicon layer (i.e., channel body) is formed as P-type one, as shown in Patent Document 2, to make the channel body in contact with the P-type substrate without letting it be floating, it is necessary to selectively form the source diffusion layers. By contrast, in this embodiment, the pillar-shaped silicon layer is formed as $N^-$-type one, and source/drain diffusion layers are not formed in the vertically stacked memory cells. Therefore, $N^+$-type diffusion layer is previously formed on the whole memory cell array area, and it serves as a common source line of the cell array. As a result, the potential of the channel bodies of all NAND cell units is defined by the common source line.

Besides, the memory cell is formed to have a MONOS structure (i.e., the charge storage layer is insulating), in which it is unnecessary to form floating gate-type charge storage layers for every memory cell. As a result, vertically stacked memory cells may be formed with a good controllability.

As described above, it is easy to form the vertically stacked structure of the vertical memory transistors, and possible to make the unit cell area of the cell array sufficiently smaller than that of the conventional NAND-type flash memory.

Since the gate wiring is formed of a metal film, such as W or WSi film, with low resistivity, it is able to achieve a flash memory with a practical memory density and sufficiently low-resistive word lines and select gate lines.

Figure 22:
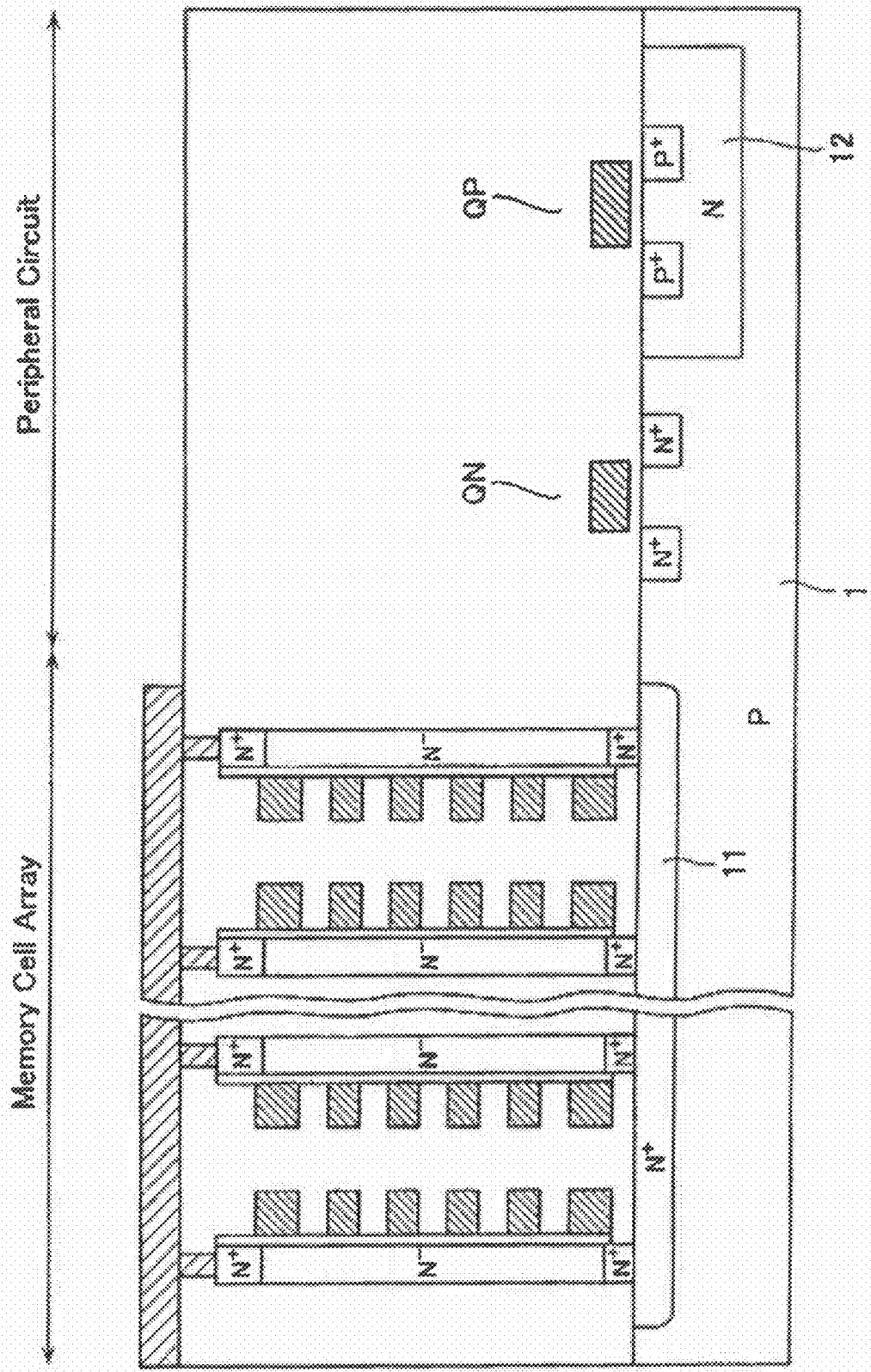
FIG. 22 is a sectional view of the flash memory including the peripheral circuit area.

FIG. 22 is a sectional view showing the NAND-type flash memory including the peripheral circuit area. Supposing that the silicon substrate 1 is P-type, on which $N^+$-type diffusion layer 11 is formed as the common source line of the cell array, PMOS transistor QP in the peripheral circuit is formed on N-type well 12; and NMOS transistor QN on the P-type silicon substrate 1. As a result, the peripheral circuit is formed as a CMOS circuit.

Examples of memory cell arrays in accordance with other embodiments will be explained below. In the embodiments described below, parts corresponding to those in the Embodiment 1 will be shown with the same reference symbols in the Embodiment 1, and explanation thereof will be omitted.

Embodiment 2

Figure 23:
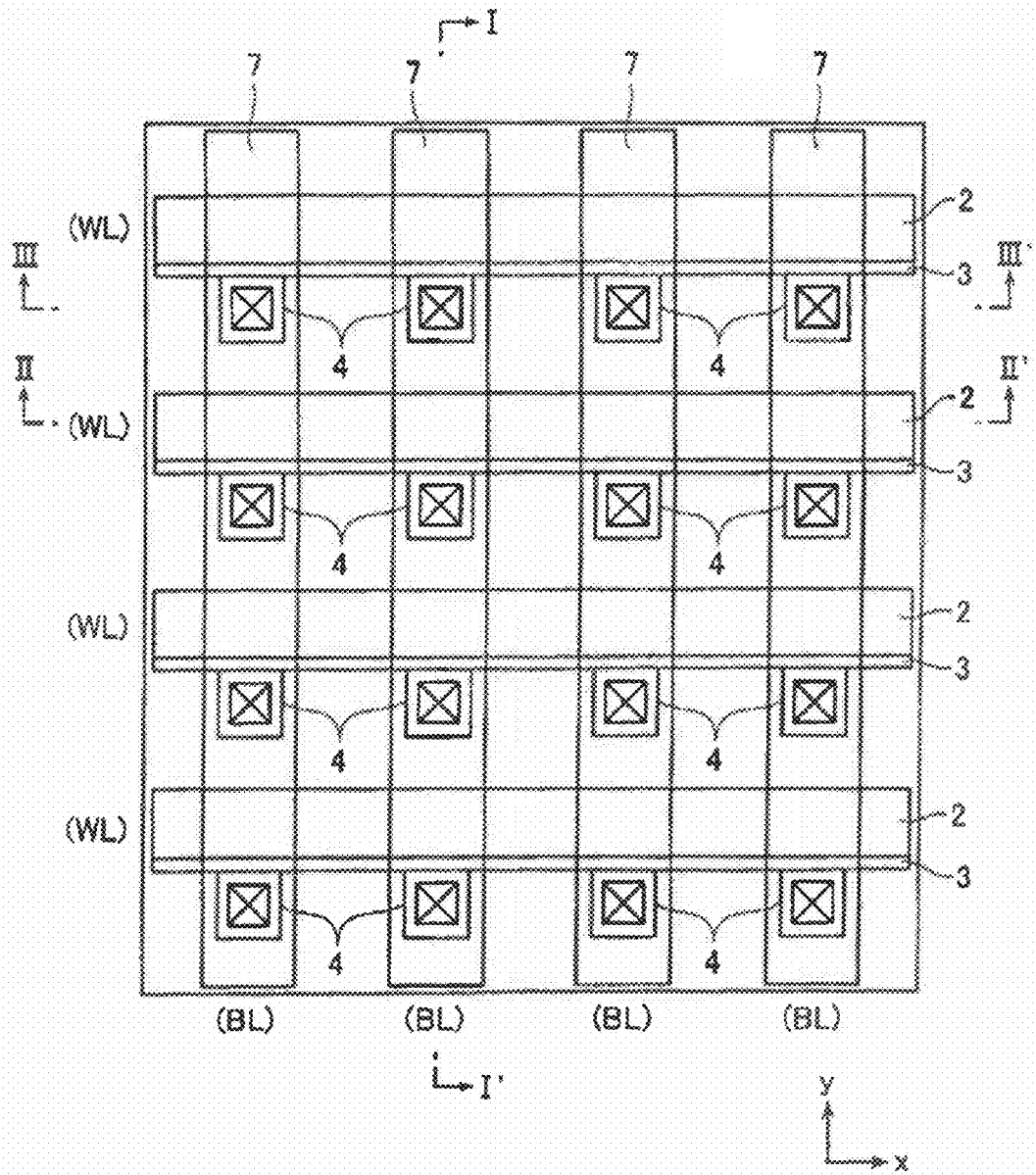
FIG. 23 is a plan view of a memory cell array in accordance with another embodiment.
Figure 24:
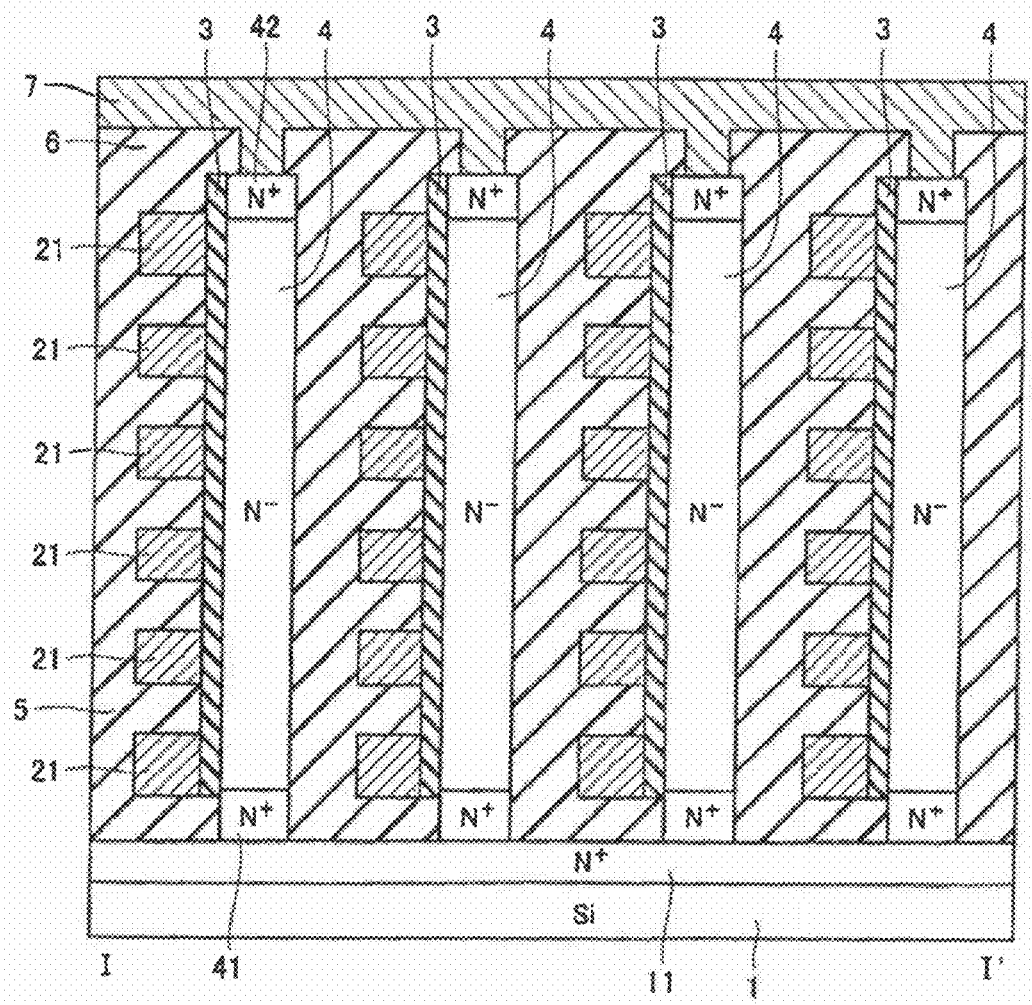
FIG. 24 is a sectional view taken along line I-I' in FIG. 23.

FIGS. 23 and 24 are a plan view and I-I' sectional view thereof, respectively, of a memory cell array in a NAND-type flash memory in accordance with Embodiment 2, which correspond to FIGS. 1 and 2, respectively.

In Embodiment 1, pillar-shaped silicon layers 4 are disposed in relation with the gate wiring stack bodies 2 in such a manner that one array is opposite to one side surface of a gate wiring stack body; and the following one to the reverse side surface of the following gate wiring stack body. By contrast, in this embodiment, pillar-type silicon layers 4 are disposed opposite to the same side surfaces of the respective gate wiring stack bodies 2.

Others are the same as in Embodiment 1. That is, one side surface of the pillar-shaped silicon layer 4 is opposite to the gate wiring stack body 2 while the remaining three side surfaces are in contact with device isolating film; II-II' and III-III' sectional views of FIG. 23 are identical with those shown in FIGS. 3 and 4; and fabrication processes are the same as in Embodiment 1. Therefore, according to this Embodiment 2, the same effects as in Embodiment 1 will be obtained.

Embodiment 3

Figure 25:
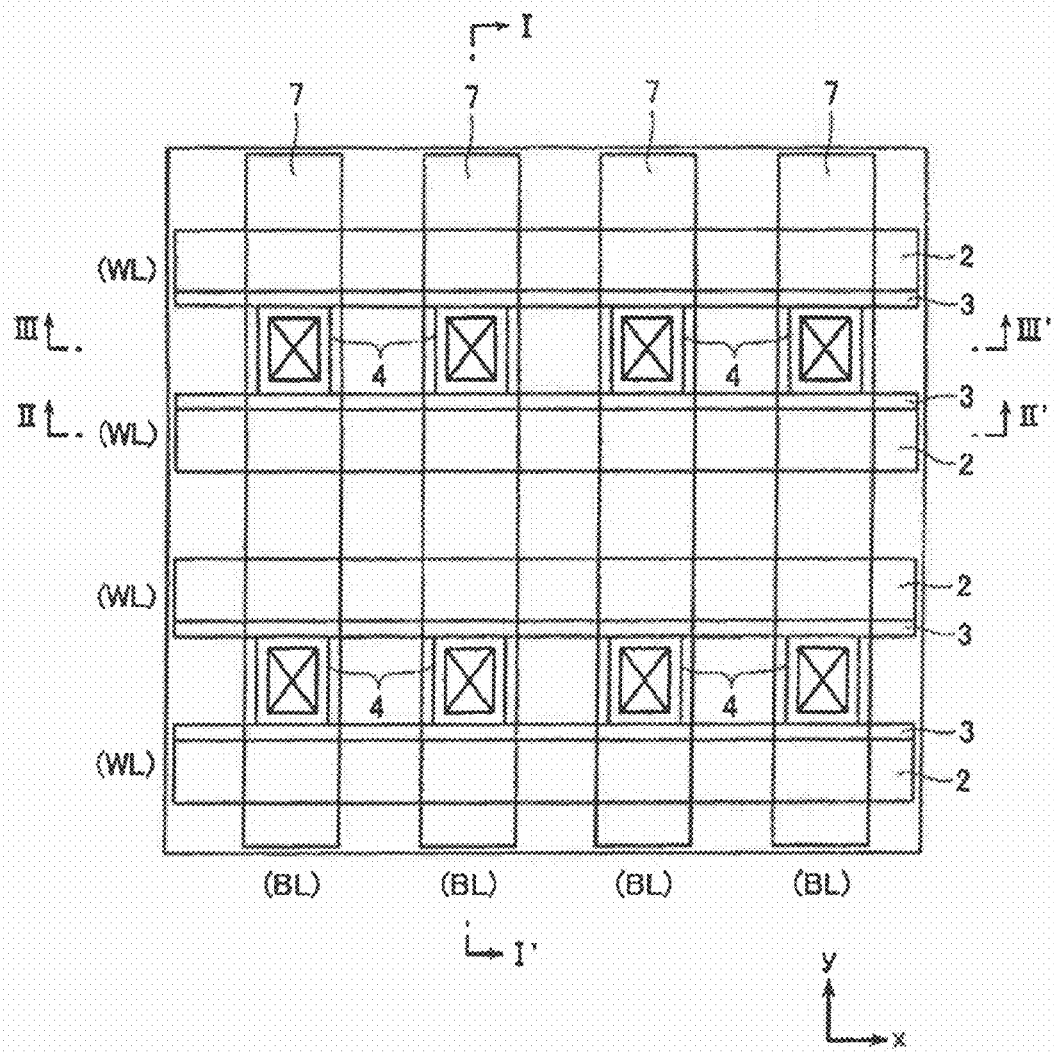
FIG. 25 is a plan view of a memory cell array in accordance with another embodiment.
Figure 26:
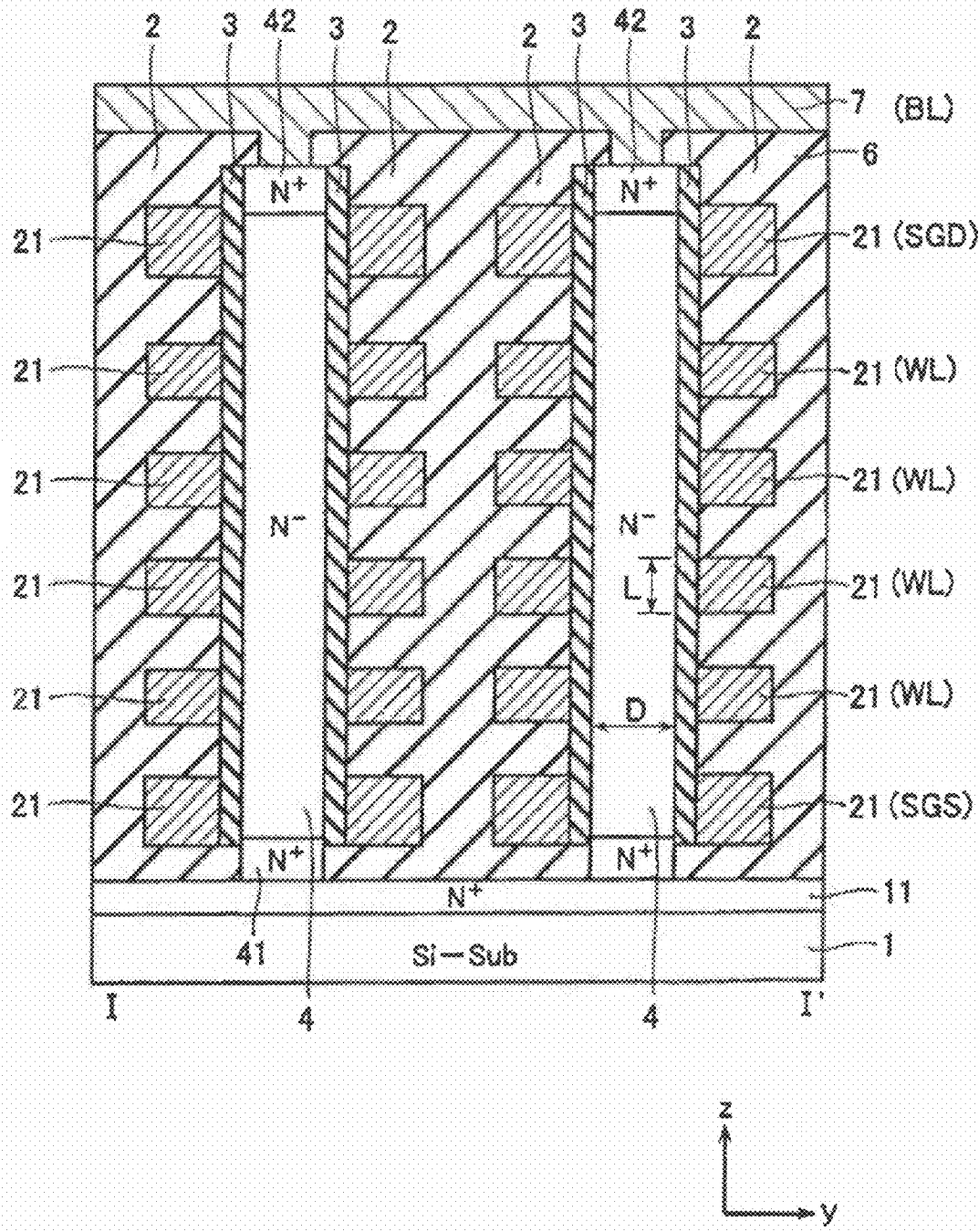
FIG. 26 is a sectional view taken along line I-I' in FIG. 25.

FIG. 25 is a plan view of a memory cell array in a NAND-type flash memory in accordance with Embodiment 3, which corresponds to FIG. 1 in Embodiment 1. FIG. 26 is I-I' sectional view of FIG. 25. II-II' and III-III' sectional views of FIG. 25 are identical with those shown in FIGS. 3 and 4; and fabrication processes are the same as in Embodiment 1.

In Embodiment 1, two arrays of pillar-shaped silicon layers 4 are disposed between two gate wiring stack bodies 2 to be driven with them. By contrast, in this Embodiment 3, adjacent two gate wiring stack bodies share one array of pillar-shaped silicon layers 4. In other words, in Embodiments 1 and 2, one side surface of each pillar-shaped silicon layer 4 is opposite to the gate wiring stack body 2 and the remaining three side surfaces are in contact with the device isolating film, while in this Embodiment 3, opposite side surfaces of the pillar-shaped silicon layer 4 are opposite to adjacent two gate wiring stack bodies 2, respectively; and the remaining two side surfaces are in contact with the device isolating film.

According to this embodiment, since two side surfaces of one pillar-shape silicon layer 4 are used, the same cell density as Embodiment 1 will be obtained with the half number of the pillar-shaped silicon layers 4 in comparison with Embodiment 1. That is, it is possible to achieve high integration of the memory cells.

In case two NAND cell units share one pillar-shaped silicon layer as channel bodies thereof, if the width of the pillar-shaped silicon layer is made smaller than a certain value, the interference between two NAND cell units sharing the pillar-shape silicon layer will become larger. Although the detail will be explained later, it may cause wasteful current in non-selected NAND cell units in a read mode.

A data read mode taking note of the above-described interference will be explained below with reference to FIGS. 37 and 38.

Figure 37:
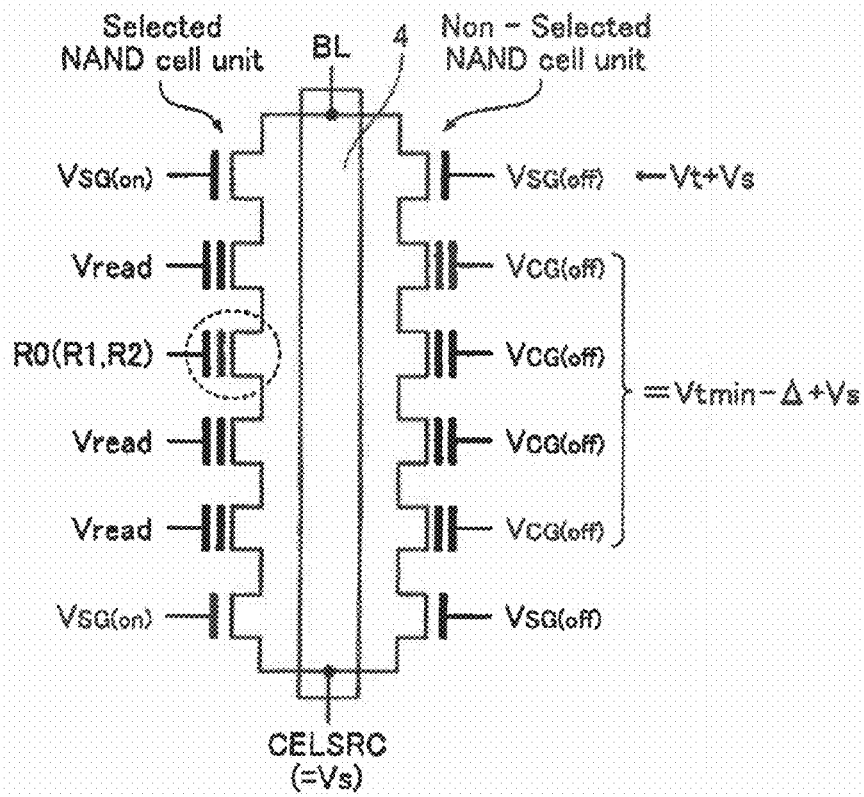
FIG. 37 is a diagram for explaining the read bias condition in the cell array shown in FIG. 25.

FIG. 37 shows an equivalent circuit of two NAND cell units sharing a pillar-shaped silicon layer 4 and a read bias condition thereof in a read mode. Supposing that one memory cell stores four-level data, FIG. 38 shows the data threshold distributions and the data bit assignment example.

Four-level data is defined by four data levels (threshold levels) L0, L1, L2 and L3. The lowest level L0 is a negative threshold state obtained by a collective erase while levels L1 to L3 are write states with positive threshold voltages. Supposing that four-level data is expressed by (HB, LB), where HB is upper bit; and LB lower bit, the bit assignment is defined as follows.

The lowest level L0 is defined as data (1,1); following level L1 is obtained by a lower bit write step, which selectively increases the threshold voltage of cells with data level (1,1), and defined as data (1,0); and levels L2 and L3 are obtained by a higher bit write step, which selectively increase the threshold voltages of cells with data levels (1,1) and (1,0), and defined as data (0,0) and (0,1), respectively.

Supposing that the above-described data write scheme is used, in case one of the two NAND cell units shown in FIG. 37 is selected while the other is non-selected, it is in need of avoiding the wasteful interference from the non-selected NAND cell unit. For example, assume that there is a negative threshold cell with data (1,1) in the non-selected NAND cell unit. In this case, even if a word line corresponding to the negative threshold cell is set at 0V, the channel is not made off. Therefore, in the data read mode of the selected NAND cell unit, a wasteful channel current flows through the on-cell in the non-selected NAND cell unit in addition to the primary channel current.

Even if the select gate transistors in the non-selected NAND cell unit are made off, it is impossible to avoid this phenomenon, and this leads to read error. Particularly, in FIG. 26, in case the width D of the pillar-shaped silicon layer, i.e., the common channel body in the two NAND cell units, is smaller than four times gate length L of each memory cell, the possibility of the above-described situation will become high.

FIG. 37 shows such a read bias condition that it is considered to avoid the interference described above. On the selected NAND cell unit side, a word line corresponding to the selected cell (surrounded by a dotted line) is applied with read voltage R0 (or R1, R2); the remaining non-selected word lines are applied with pass voltage Vread, which turns on cells without regard to cell data; and select gate lines are applied with Vsg(on), which turns on the select gate transistors.

Figure 38:
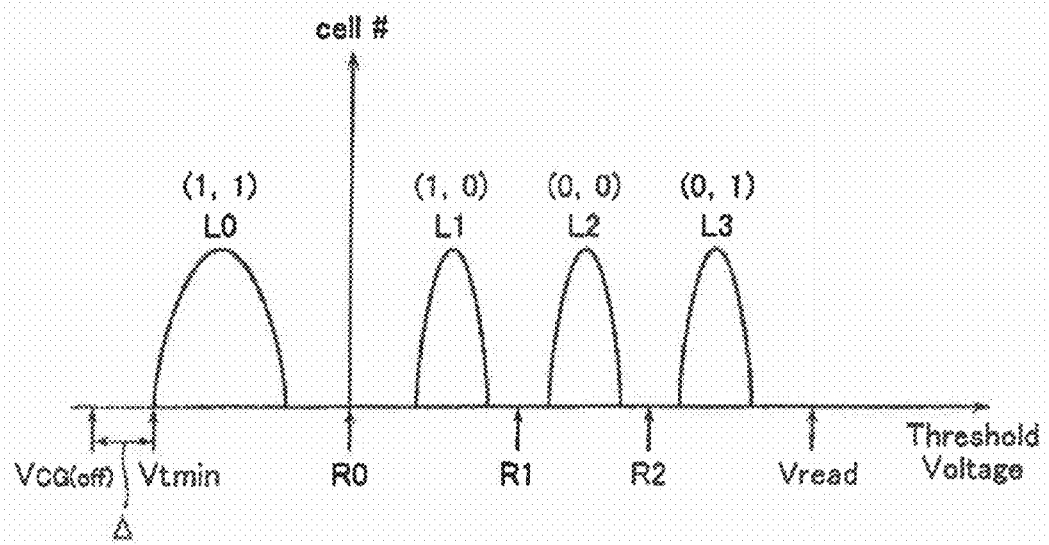
FIG. 38 is a diagram for showing four-level data threshold distributions and the data bit assignment.

The read voltages R0-R2 are selected as shown in FIG. 38. That is, in case of reading the upper bit HB, read voltage R1, which is set between the data levels L1 and L2, is used. In case of reading the lower bit LB when the upper bit HB is "1", read voltage R0, which is set between the data levels L0 and L1, is used. In case of reading the lower bit LB when the upper bit HB is "0", read voltage R2, which is set between the data levels L2 and L3, is used.

As a result, cell current flows or not in the selected NAND cell unit in accordance with that the selected cell is on or off. The cell current detection may be performed in such a way that the bit line is previously precharged, and then the sense amplifier detects whether the bit line is discharged or not.

By contrast, in the non-selected NAND cell units, all memory cells are set to be kept in a channel-off state without regard to cell data. That is, supposing that the memory cell's threshold voltage is Vt; the common source line CELSRC is set at Vs; and the lower limit of the lowest data level L0 is Vtmin, all word lines are applied with Vcg(off)=Vtmin−Δ+Vss; and the select gate lines Vsg(off)<Vt+Vs.

the lower limit Vtmin of the lowest data level L0 is not judged when the data level L0 is obtained with the collective erase operation. In addition, since over-erased cells are often generated, it is difficult to previously estimate the lower limit Vtmin. To set the lower limit Vtmin to be in a certain range, it is desirable to perform preliminary write with Vtmin as a write-verify voltage after the collective erase. By use of this scheme, selecting the control voltage Vcg(off) to be lower than the lower limit Vtmin of data level L0 by a certain level Δ, it becomes possible to certainly make the channel of the non-selected NAND cell unit off.

Adapting the read bias as described above, in case two NAND cell units are formed as sharing a pillar-shaped silicon layer, it is possible to perform such a data read that the interference between the two NAND cell units is removed or reduced.

In case two NAND cell units are formed to share a channel body, it is necessary to consider similarly in the case of not only the above-described four-level data storage but also a binary data storage scheme or other multi-level data storage schemes with more than four levels. That is, in case two NAND cell units share a channel body, word lines in the non-selected NAND cell unit side are biased so as to make the channel off without regard to cell data. As a result, it becomes possible to perform data read free from the interference between two NAND cell units.

Embodiment 4

Figure 27:
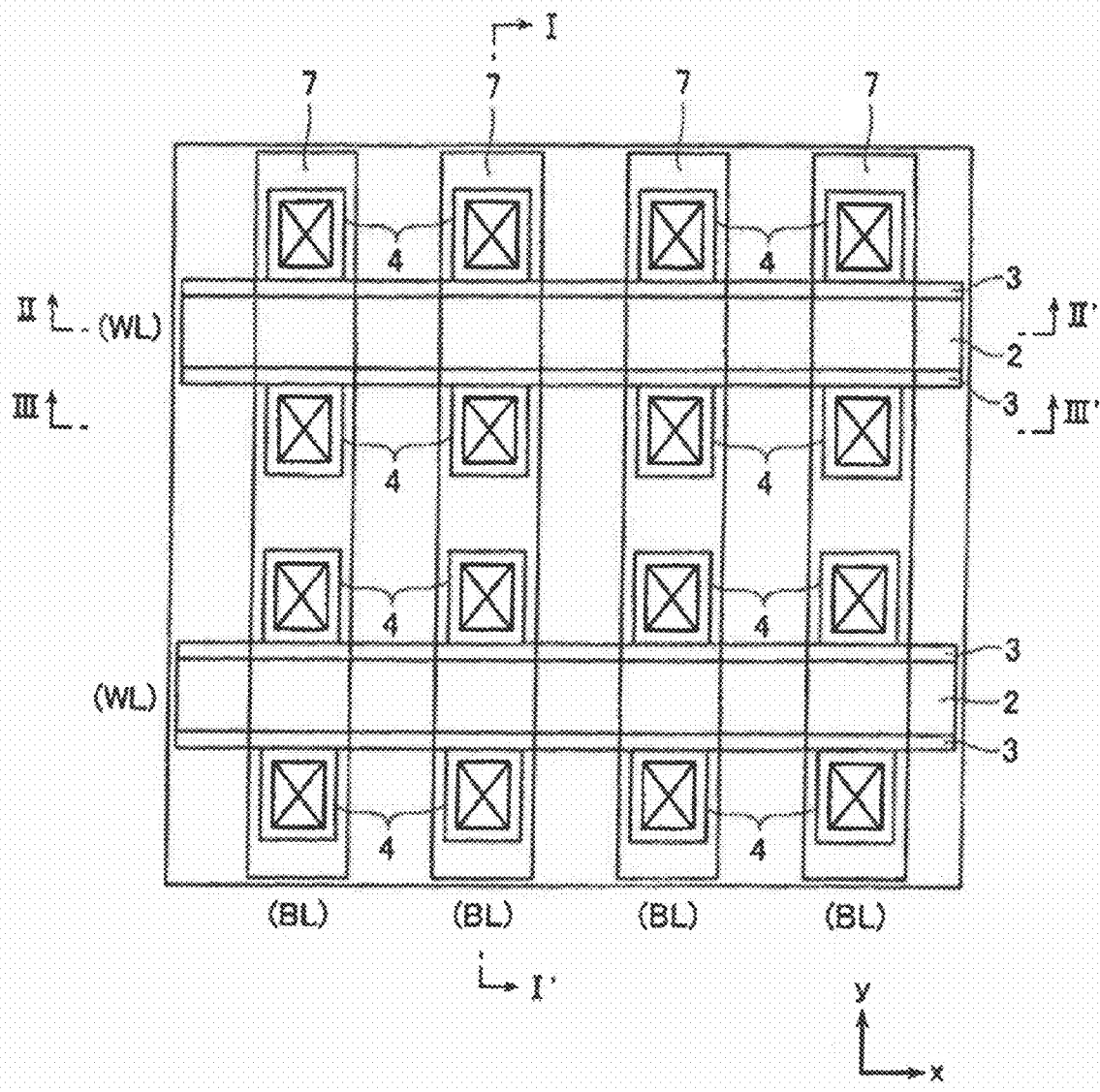
FIG. 27 is a plan view of a memory cell array in accordance with another embodiment.
Figure 28:
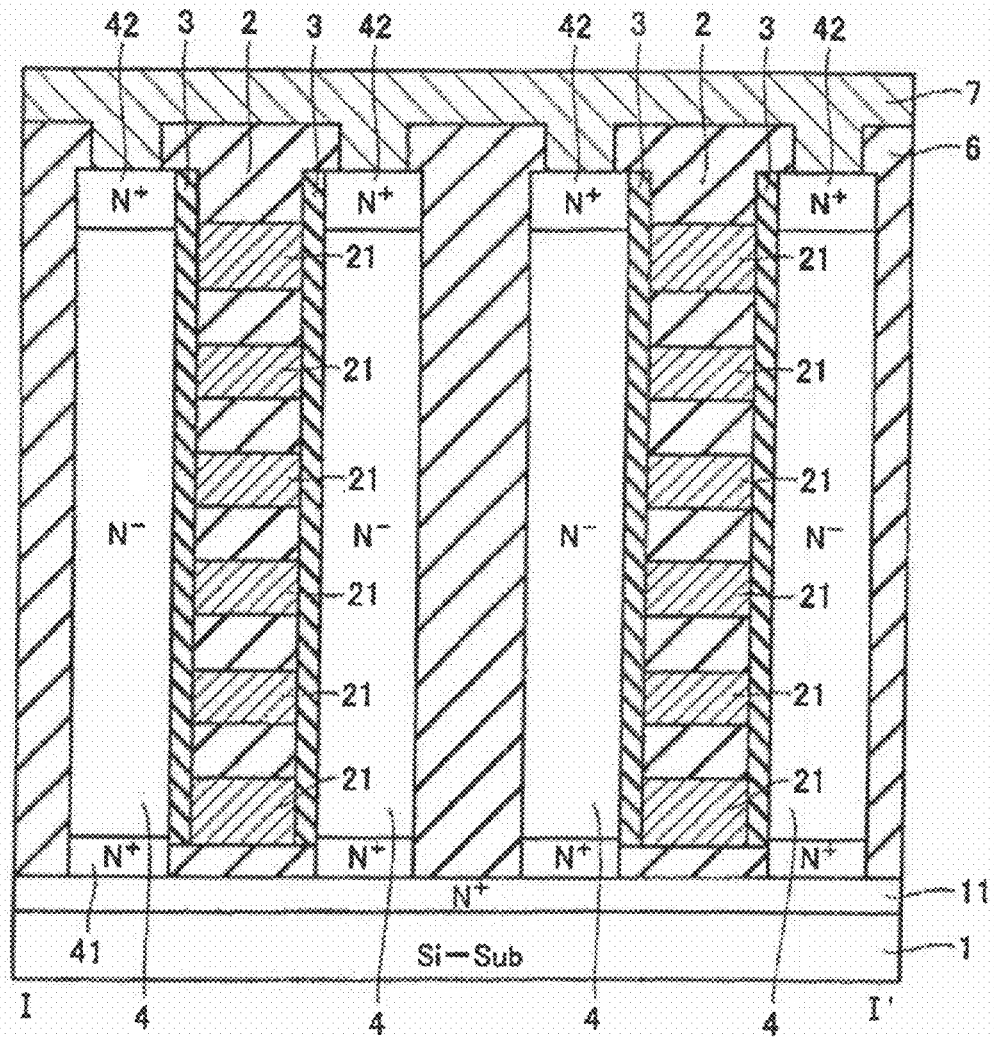
FIG. 28 is a sectional view taken along line I-I' in FIG. 27.

FIG. 27 is a plan view of a memory cell array in accordance with Embodiment 4, and FIG. 28 is I-I' sectional view of FIG. 27. II-II' and III-III' sectional views thereof are the same as FIGS. 3 and 4, respectively; and the fabrication steps are the same as Embodiment 1.

In this embodiment, two arrays of the pillar-shaped silicon layers 4 are so disposed along each gate wiring stack body 2 as opposed to opposite side surfaces of the gate wiring stack body 2 via gate insulating films 3. The two memory cells driven with a word line are disposed to share a bit line. In this case, two pillar-shaped silicon layers 4 sandwiching a gate wiring stack body 2 are not used as independent NAND cell units, i.e., two memory cells sharing a bit line and a word line can not store data independently from each other. However, it becomes possible to improve the S/N ratio and data reliability because the signal charge quantity becomes large. This is effective particularly in case of using a multi-level data storage scheme.

Embodiment 5

Figure 29:
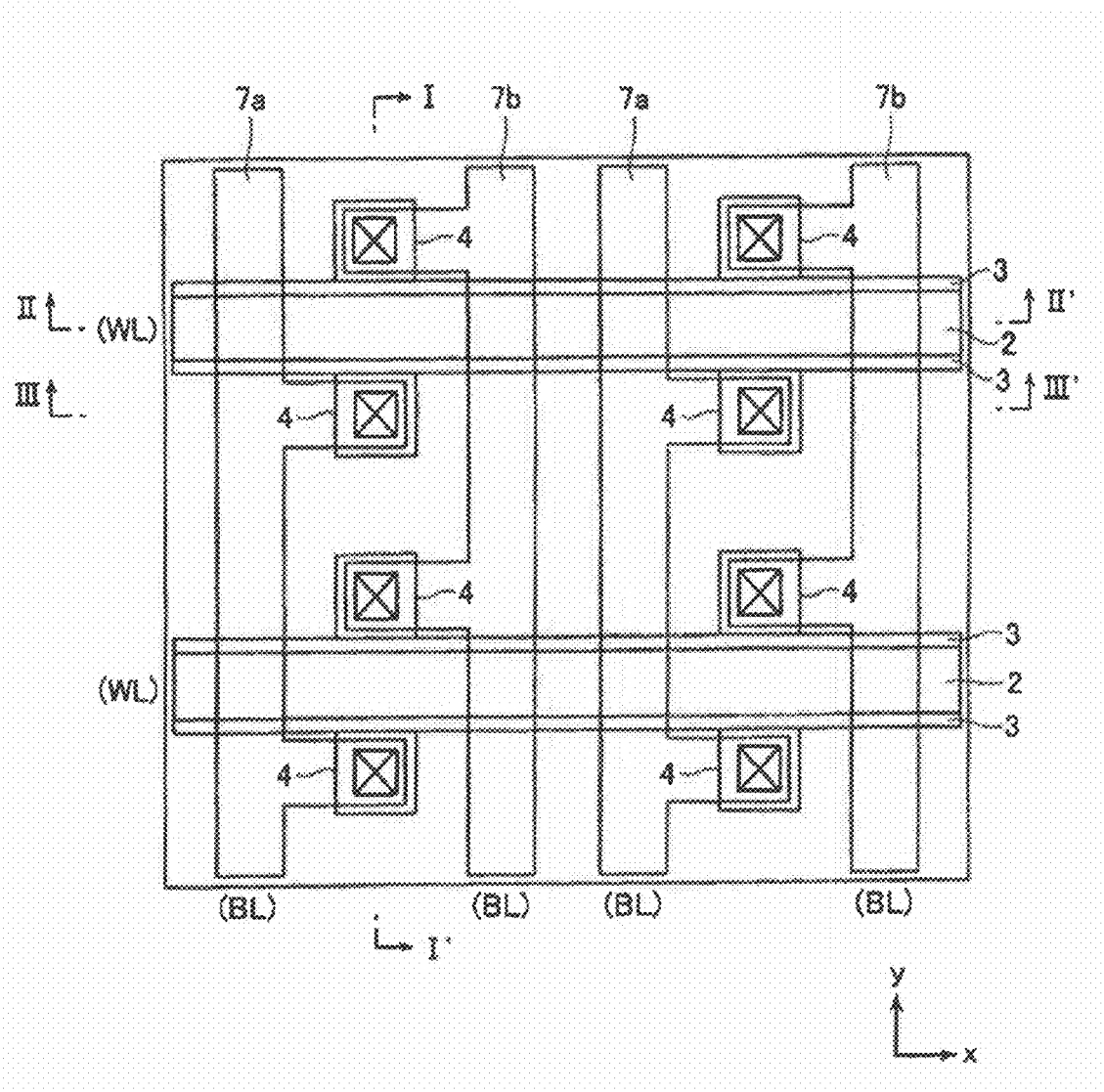
FIG. 29 is a plan view of a memory cell array in accordance with another embodiment.

FIG. 29 is a plan view of a memory cell array in accordance with Embodiment 5. As similar to Embodiment 4 shown in FIG. 27, two arrays of the pillar-shaped silicon layers 4 are so disposed along each gate wiring stack body 2 as opposed to opposite side surfaces of the gate wiring stack body 2 via gate insulating films 3. However, as different from Embodiment 4, the two pillar-shaped silicon layers sandwiching a gate wiring stack body 2 are coupled to different bit lines 7a and 7b from each other.

Figure 30:
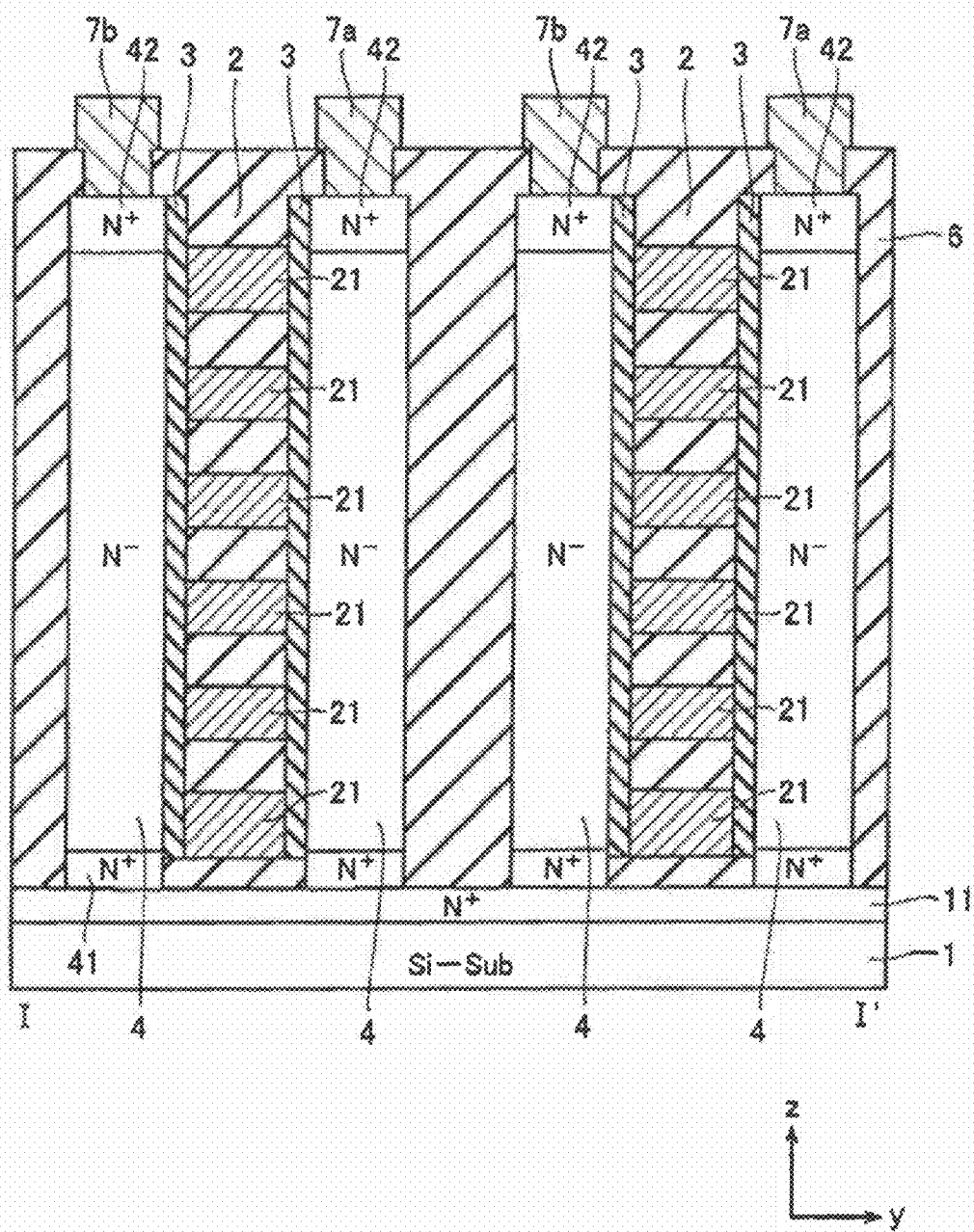
FIG. 30 is a sectional view taken along line I-I' in FIG. 29.

FIG. 30 is I-I' sectional view of FIG. 29. II-II' sectional view thereof is basically the same as FIG. 3; and the fabrication steps are the same as Embodiment 1.

As a result, although two pillar-shaped silicon layers sandwiching a gate wiring stack body 2 are driven with a common word line, these serve as different NAND cell units for storing different data because these are coupled to different bit lines.

Figure 31:
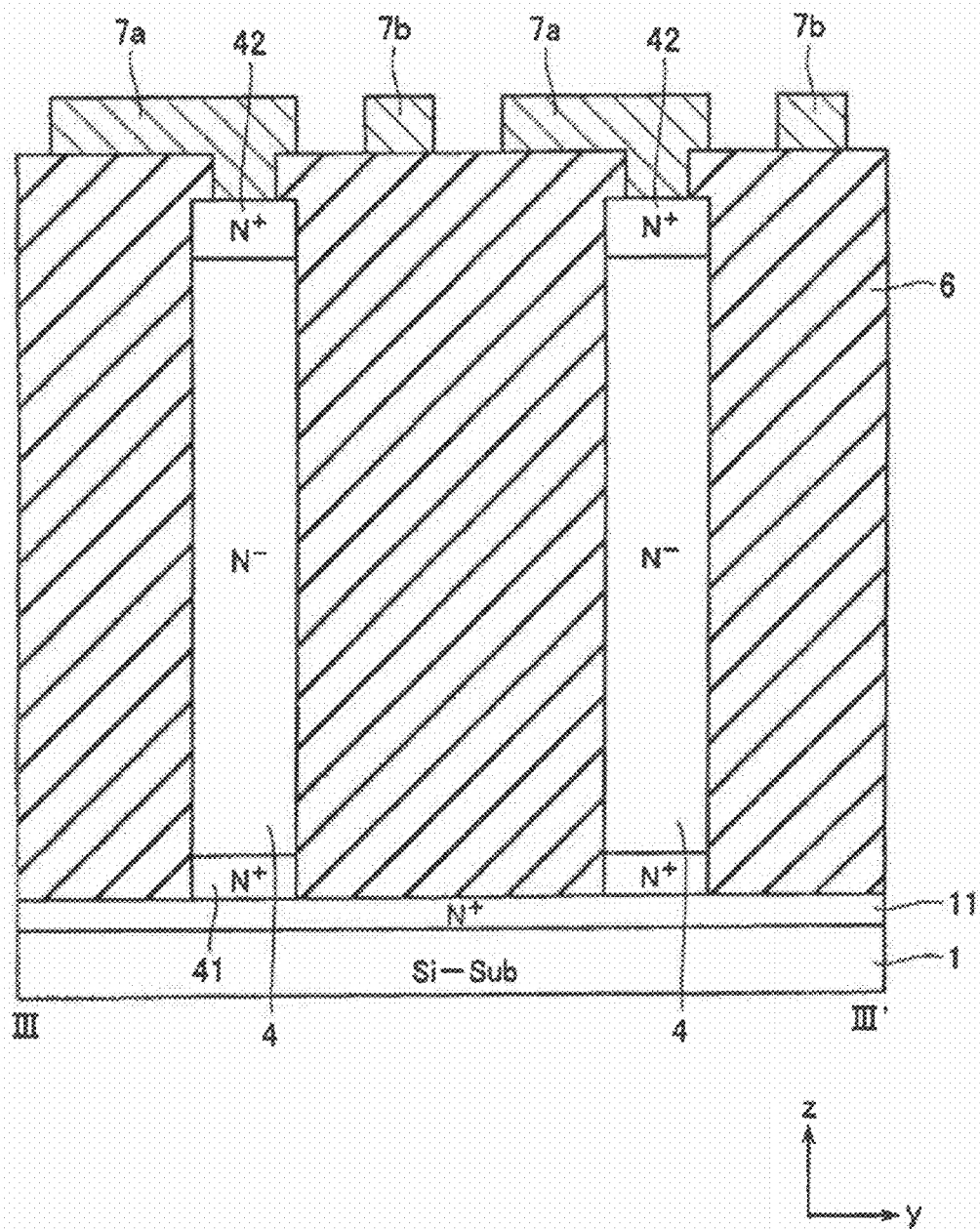
FIG. 31 is a sectional view taken along III-III' in FIG. 29 in case the bit lines are formed of a single layer.
Figure 32:
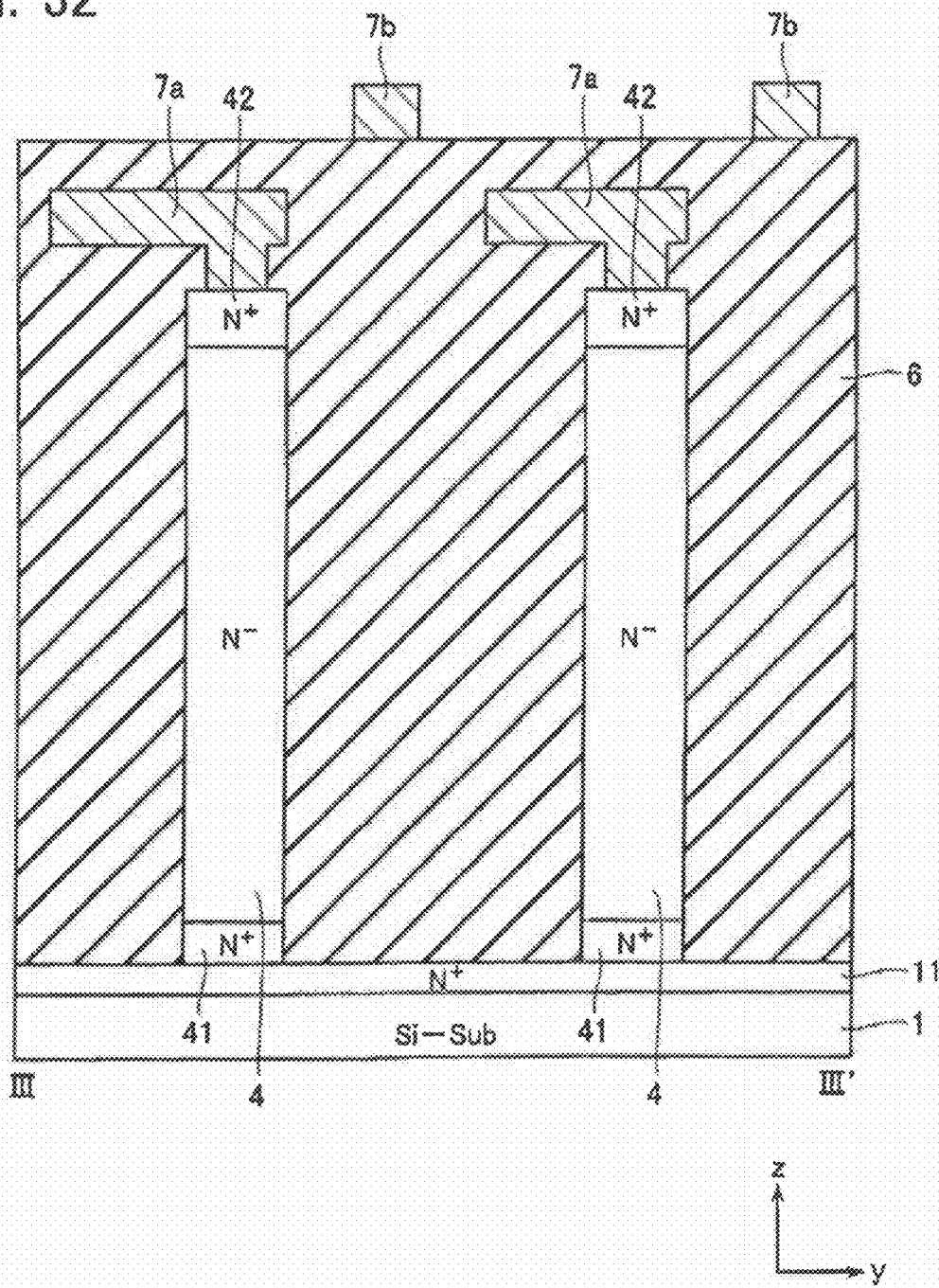
FIG. 32 is a sectional view taken along III-III' in FIG. 29 in case the bit lines are formed of two layers.

Bit lines 7a and 7b are formed by patterning a common conductive material film or formed with different conductive films. III-III' sectional view shown in FIG. 31 is the former case while that shown in FIG. 32 is the latter case.

Embodiment 6

Figure 33:
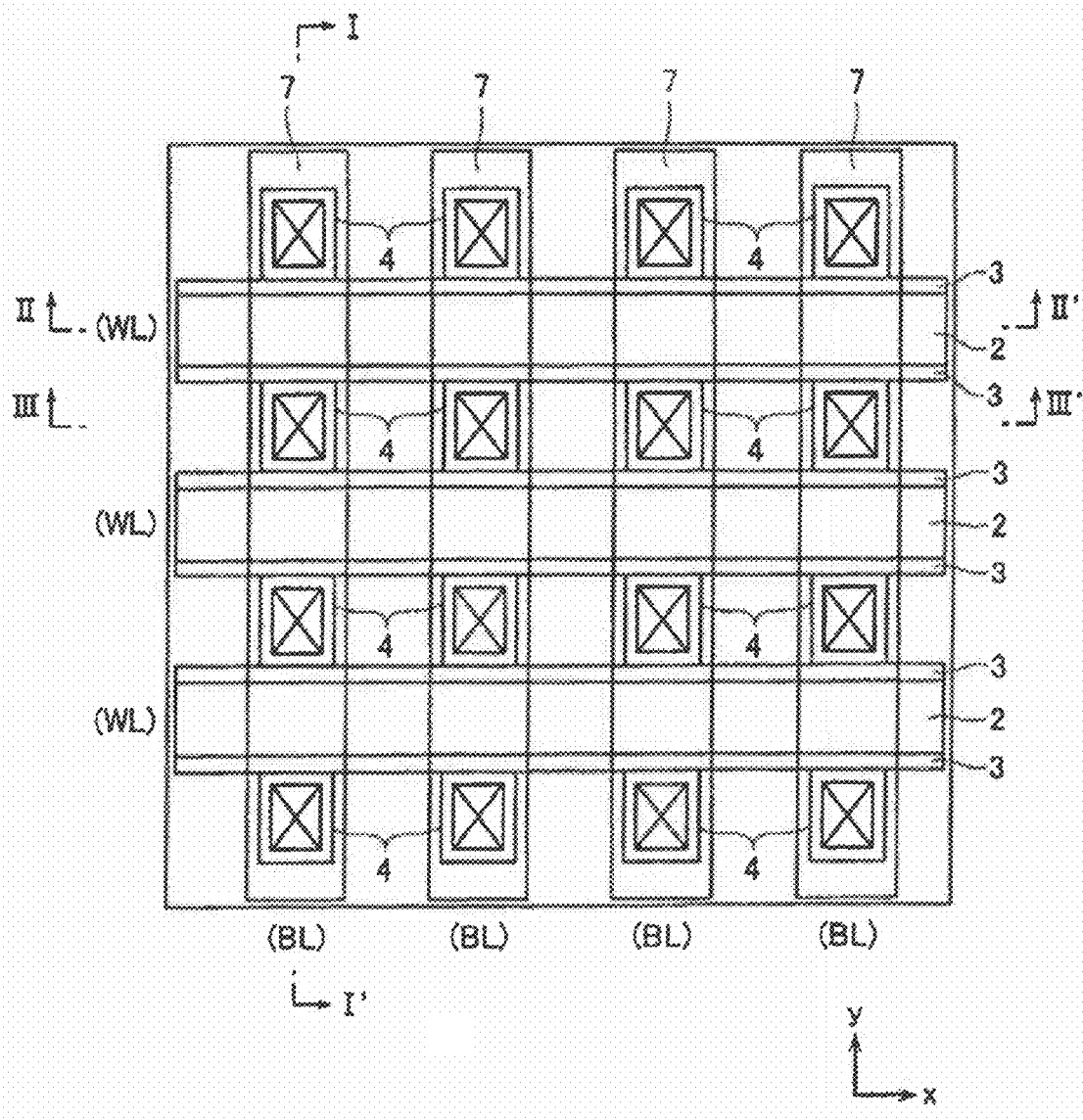
FIG. 33 is a plan view of a memory cell array in accordance with another embodiment.

FIG. 33 is a plan view of a memory cell array in accordance with Embodiment 6. It is common to Embodiment 4 shown in FIG. 27 that adjacent two arrays of the pillar-shaped silicon layers 4 are opposed to opposite side surfaces of each gate wiring stack body 2 via the gate insulating films 3. Further, it is common to Embodiment 3 shown in FIG. 25 that adjacent two gate wiring stack bodies 2 are opposed to opposite side surfaces of each array of the pillar-shaped silicon layers 4. Two pillar-shaped silicon layers 4 sandwiching a gate wiring stack body 2 are coupled to a common bit line 7.

Figure 34:
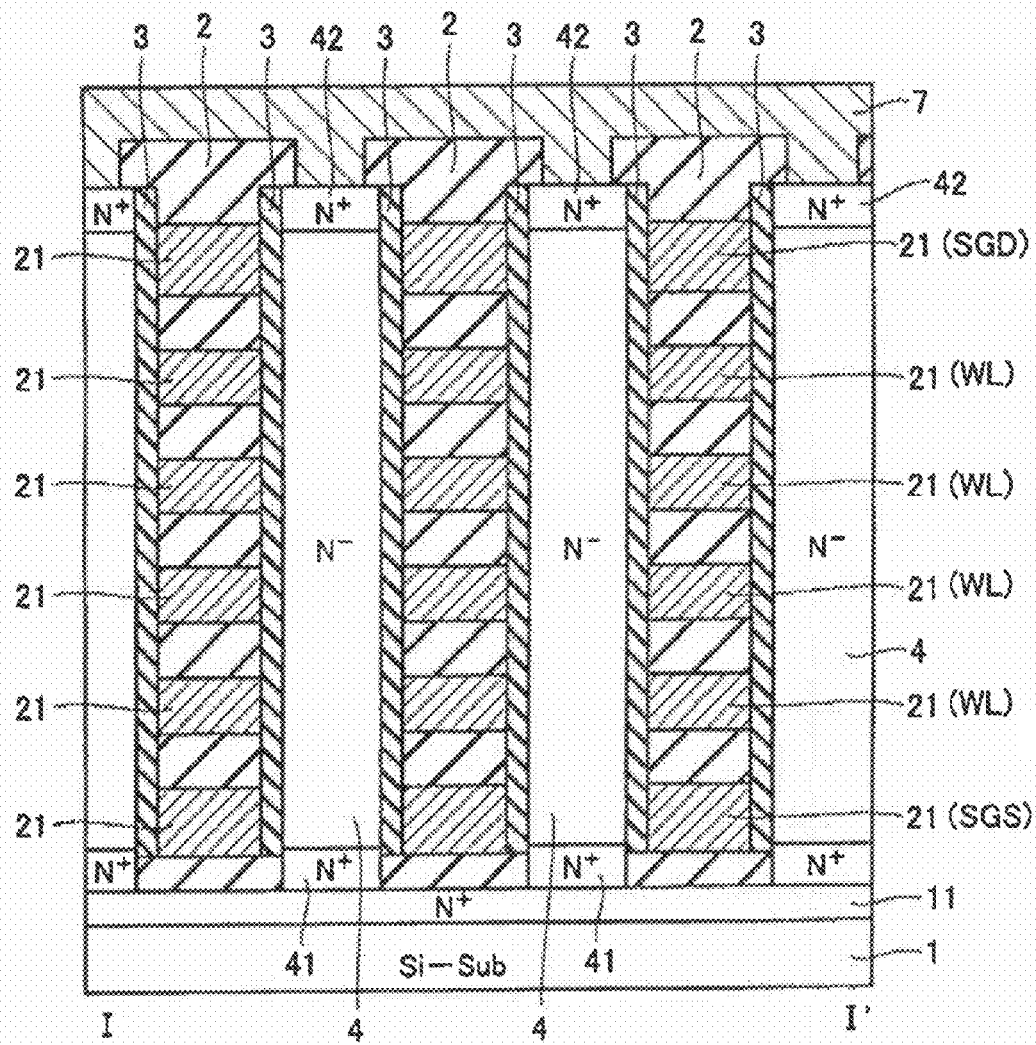
FIG. 34 is a sectional view taken along line I-I' in FIG. 33.

FIG. 34 is I-I' sectional view of FIG. 33. II-II' and III-III' sectional views of FIG. 33 are the same as those in FIGS. 3 and 4, respectively. The fabricating processes are the same as in Embodiment 1.

In this embodiment, two silicon layers 4 sandwiching a gate wiring stack body 2 are not used as independent NAND cell units because two memory cells sharing a word line and a bit line can not store data independently of each other. However, it becomes possible to improve, particularly in case of multi-level storing, the S/N ratio and data reliability because the signal charge quantity becomes large.

Embodiment 7

Figure 35:
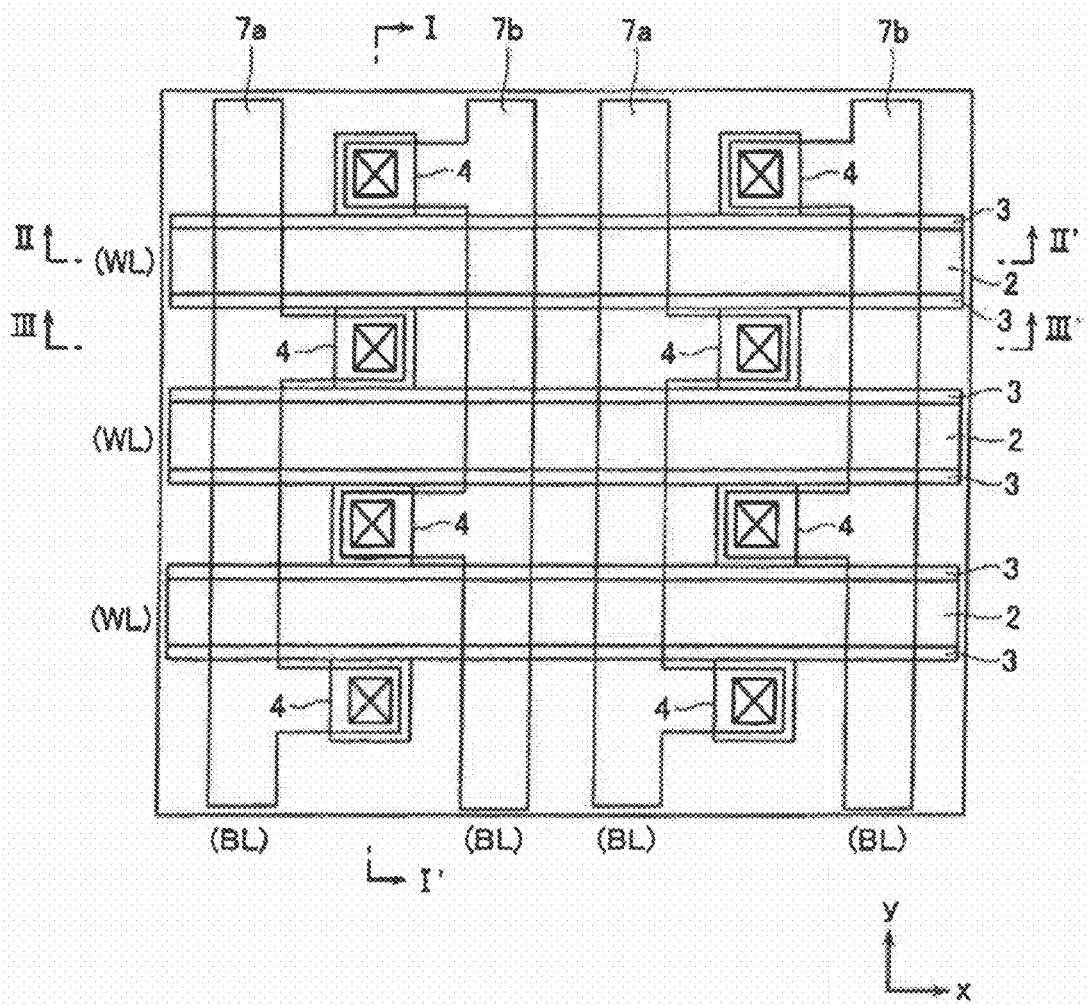
FIG. 35 is a plan view of a memory cell array in accordance with another embodiment.
Figure 36:
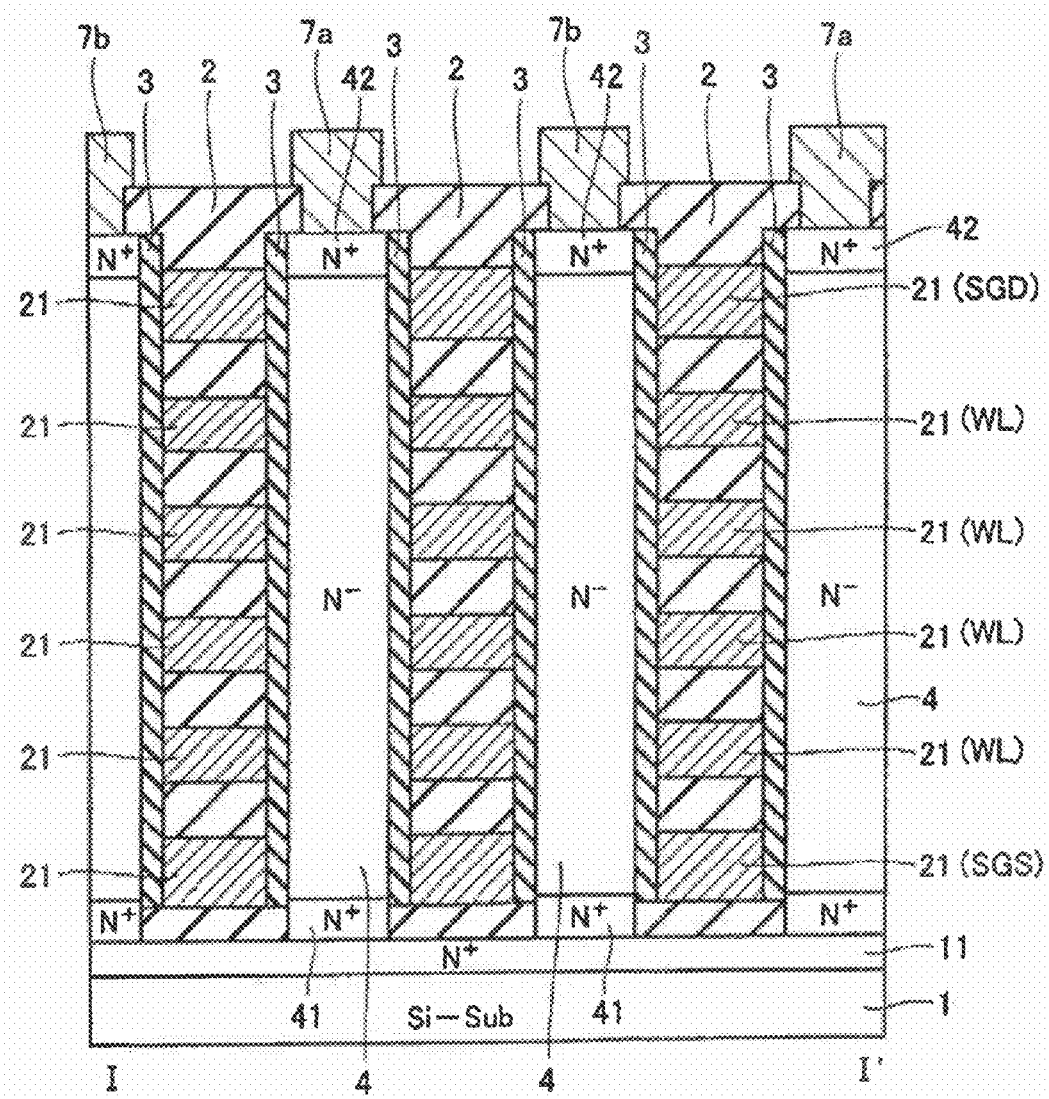
FIG. 36 is a sectional view taken along line I-I' in FIG. 35.

FIG. 35 is a plan view of a memory cell array in accordance with Embodiment 7. The arrangement of the gate wiring stack bodies 2 and pillar-shaped silicon layers 4 is the same as that in Embodiment 6 shown in FIG. 33, but it is different that two pillar-shaped silicon layers 4 opposed to opposite side surfaces of a gate wiring stack body 2 via the gate insulating films 3 are coupled to different bit lines 7a and 7b.

As a result, although the two pillar-shaped silicon layers are driven simultaneously with a word line, these constitute independent NAND cell units, which are able to store different data.

Bit lines 7a and 7b are formed of a conductive material film, or different conductive material films from each other. Therefore, III-III' sectional view of FIG. 35 is the same as FIG. 31 or FIG. 33.

Embodiment 8

In the above-described embodiments, W or WSi film is used as the stacked gate wirings, whereby low-resistive wirings may be achieved. By contrast, in case the gate wiring is formed of a polycrystalline film, the polycrystalline silicon wiring is preferably reformed as silicide wirings with a salicide (Self Aligned Silicide) technology when the cell array formation has been about completed.

The fabrication processes will be explained with reference to FIGS. 39 to 44 in accordance with such an Embodiment 8. FIGS. 39 to 44 each shows the sectional view of the peripheral circuit area together with III-III' sectional view of the cell array in Embodiment 1.

Figure 39:
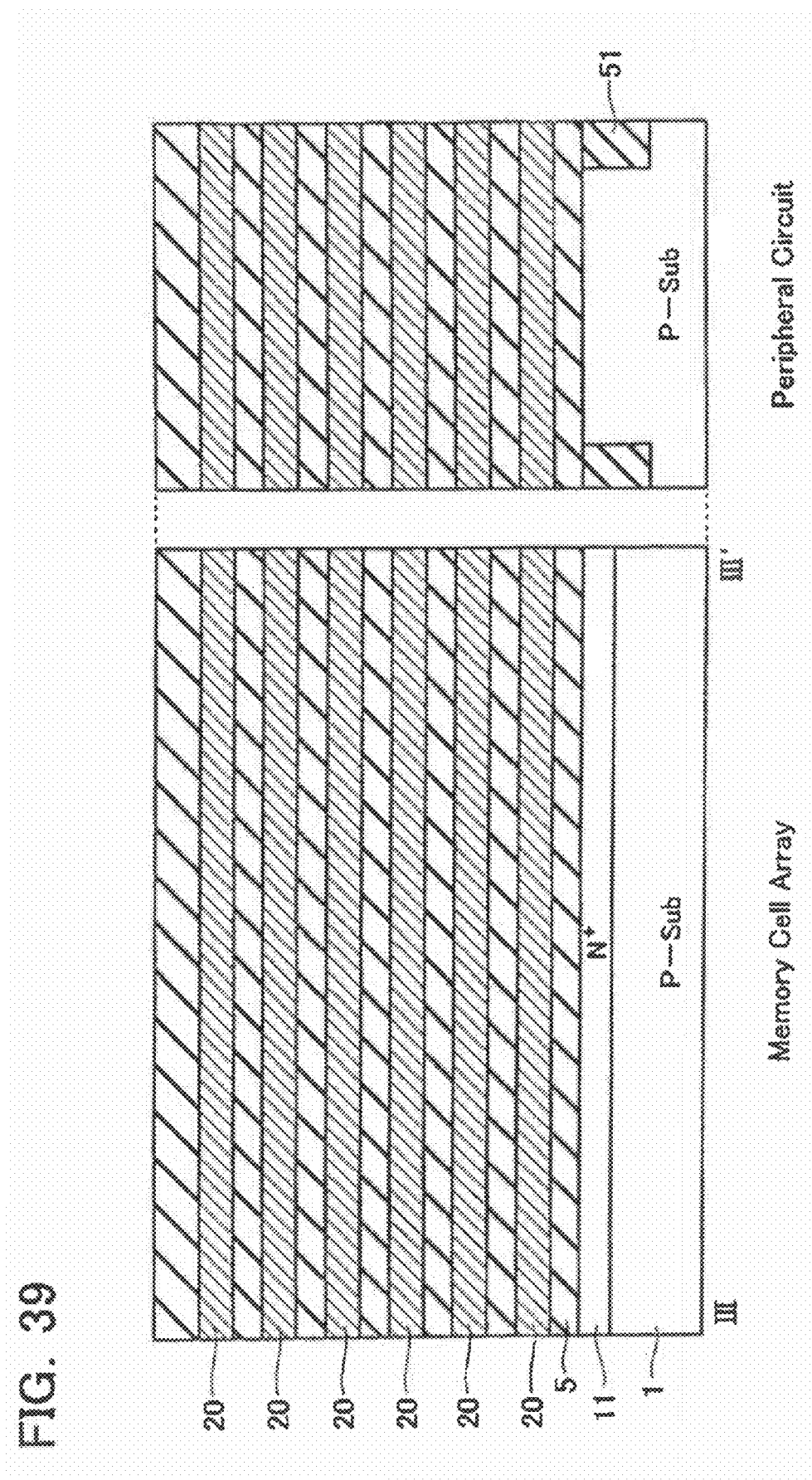
FIG. 39 is a sectional view for showing the step of stacking polycrystalline silicon films of a flash memory in accordance with another embodiment.

As shown in FIG. 39, a plurality of polycrystalline films, as gate electrode material films 20, are stacked on the silicon substrate 1 in such a way that these are separated from each other with insulating films 5. On the whole cell array area of the substrate 1, $N^+$-type diffusion layer 11 is formed like the above-described embodiments. On the peripheral circuit area, device isolating dielectric film 51 is buried with an STI (Shallow Trench Isolation) method prior to the polycrystalline silicon stacking.

Figure 40:
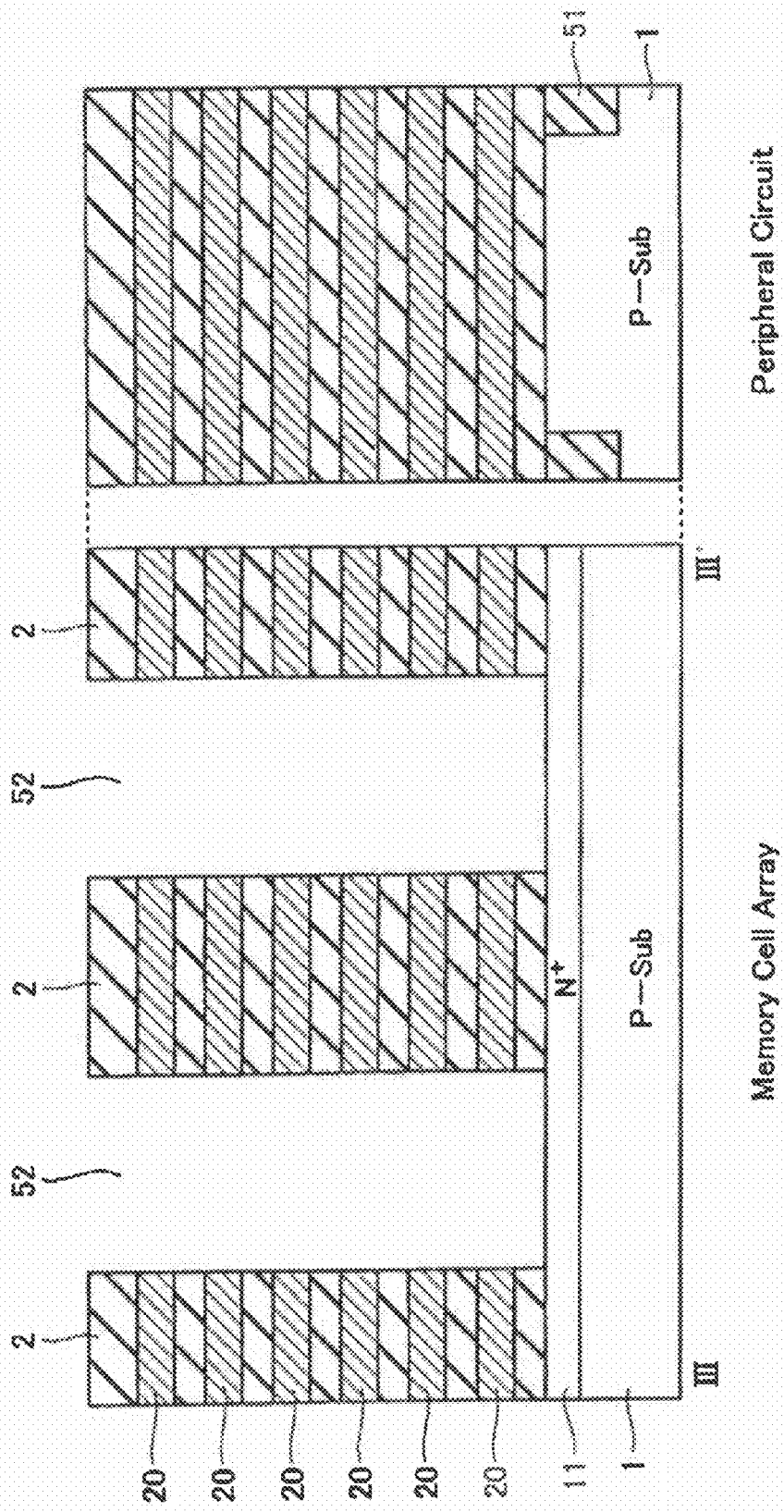
FIG. 40 is a sectional view for showing the step of patterning the polycrystalline silicon films.

As shown in FIG. 40, the polycrystalline silicon film stacked structure is etched to expose the cell array area of the substrate. As a result, a plurality of stripe-shaped gate wiring stack bodies 2 are formed as separated by grooves 52. Note here that the gate wiring stack bodies 2 at this stage are not separated perfectly as shown in FIG. 11 in Embodiment 1, but coupled two by two.

Figure 41:
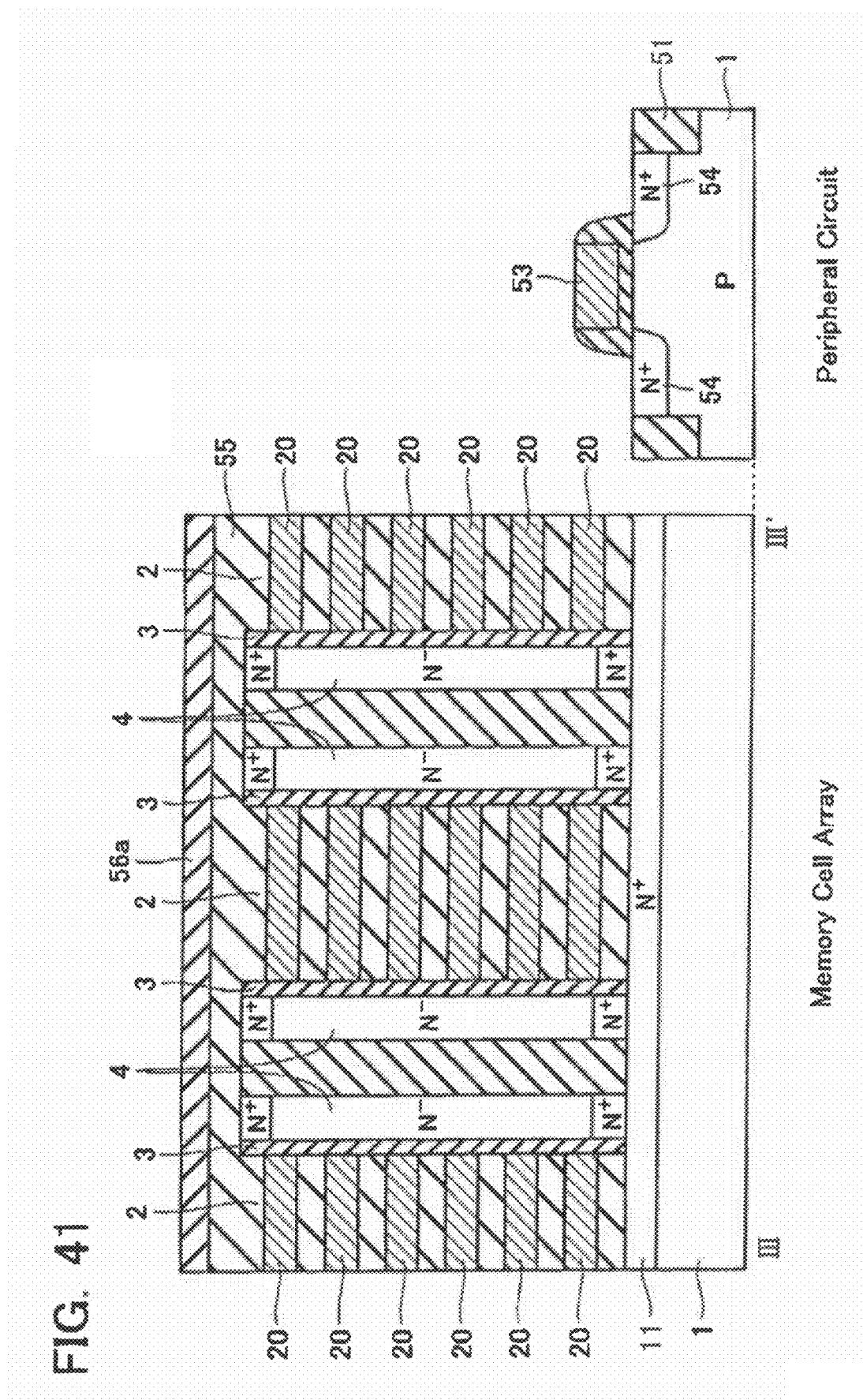
FIG. 41 is a sectional view for showing the steps of: forming gate insulating film on the side surface of the gate wiring stack body; and forming the pillar-shaped silicon layers.

Thereafter, as shown in FIG. 41, gate insulating film 3 is formed on the side surface of the gate wiring stack bodies 2 with a charge storage layer formed therein; and then pillar-shaped silicon layers 4 are formed to be opposed to the side surface of the gate wiring stack bodies 2 via the gate insulating film 3. A plurality of the pillar-shaped silicon layers 4 are arranged in perpendicular to the shown sectional view. In the bottom portions of the pillar-shaped silicon layers 4, $N^+$-type diffusion layers are formed in accordance with impurity diffusion from the substrate 1; and on the top portions of them, $N^+$-type diffusion layers are formed by ion implantation.

The above described processes from the step of forming the gate insulating film 3 to that of pillar-shaped silicon layers 4 are the same as in Embodiment 1. Thereafter, the cell array area is covered with interlayer insulating film 55; and formed thereon is silicon nitride film 56a.

By use of the silicon nitride film 56a as a mask, the gate wiring stack body on the peripheral circuit area is removed, and peripheral transistors are formed as follows: polycrystalline silicon gate 63 is formed on the substrate 1 with a gate insulating film interposed therebetween; side wall insulating film is formed; and source/drain diffusion layers 54 are formed.

Figure 42:
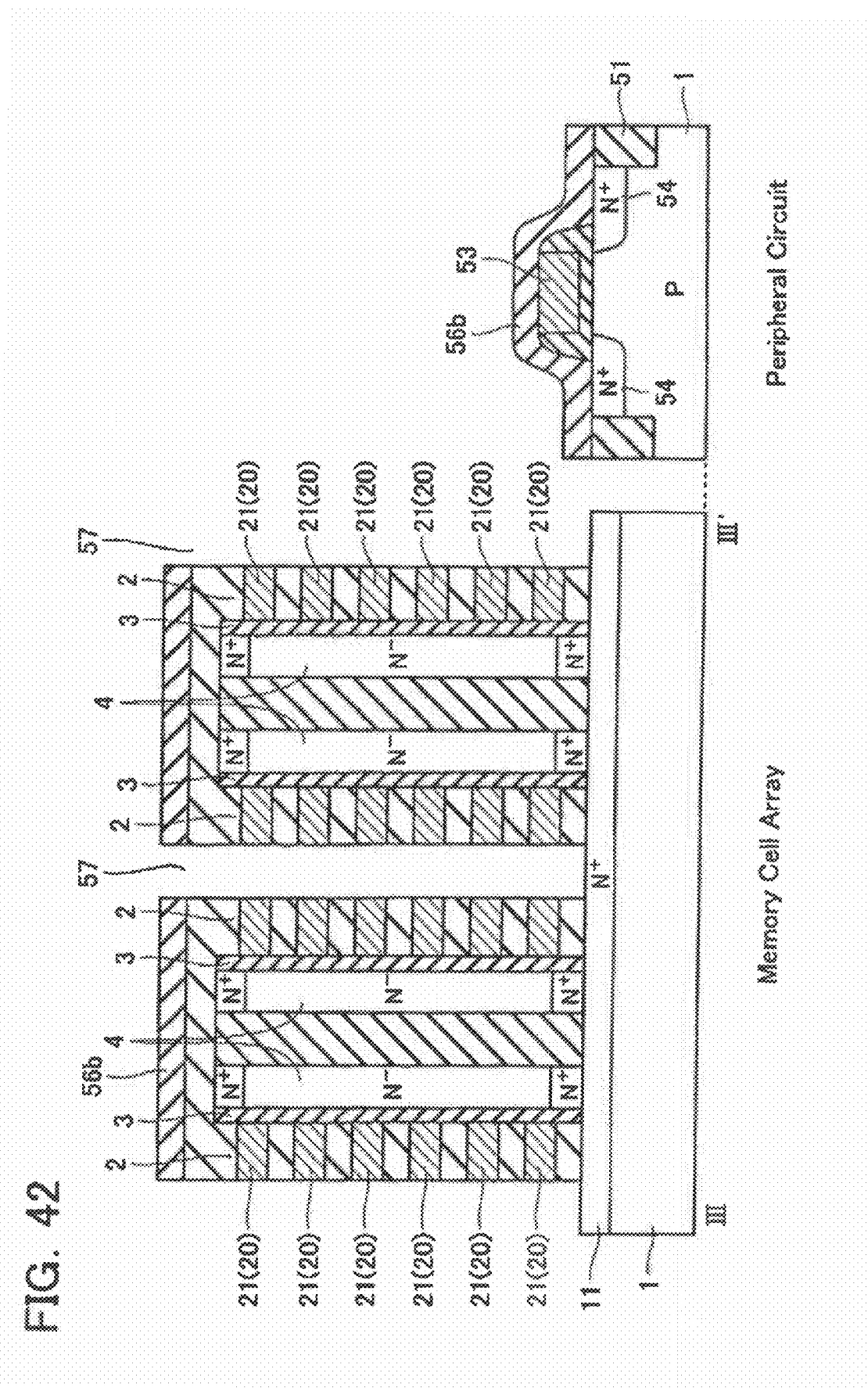
FIG. 42 is a sectional view for showing the step of etching the gate wiring stack body.

Following it, the silicon nitride film 56a covering the cell array area is removed, and silicon nitride film 56b is formed again, as shown in FIG. 42, to cover the whole surface. The silicon nitride film 56*b* is patterned on the cell array area as a mask; and the gate wiring stack bodies 2 are etched to expose the substrate, whereby the final stack structure of the gate wirings 21 will be formed. In other words, grooves 57 are formed so as to divide each gate wiring stack body 2 into two pieces, in each of which becomes a bundle of word lines and select gate lines. All the while, the peripheral circuit area is kept in such a state that it is covered with the silicon nitride film 56*b*.

Figure 43:
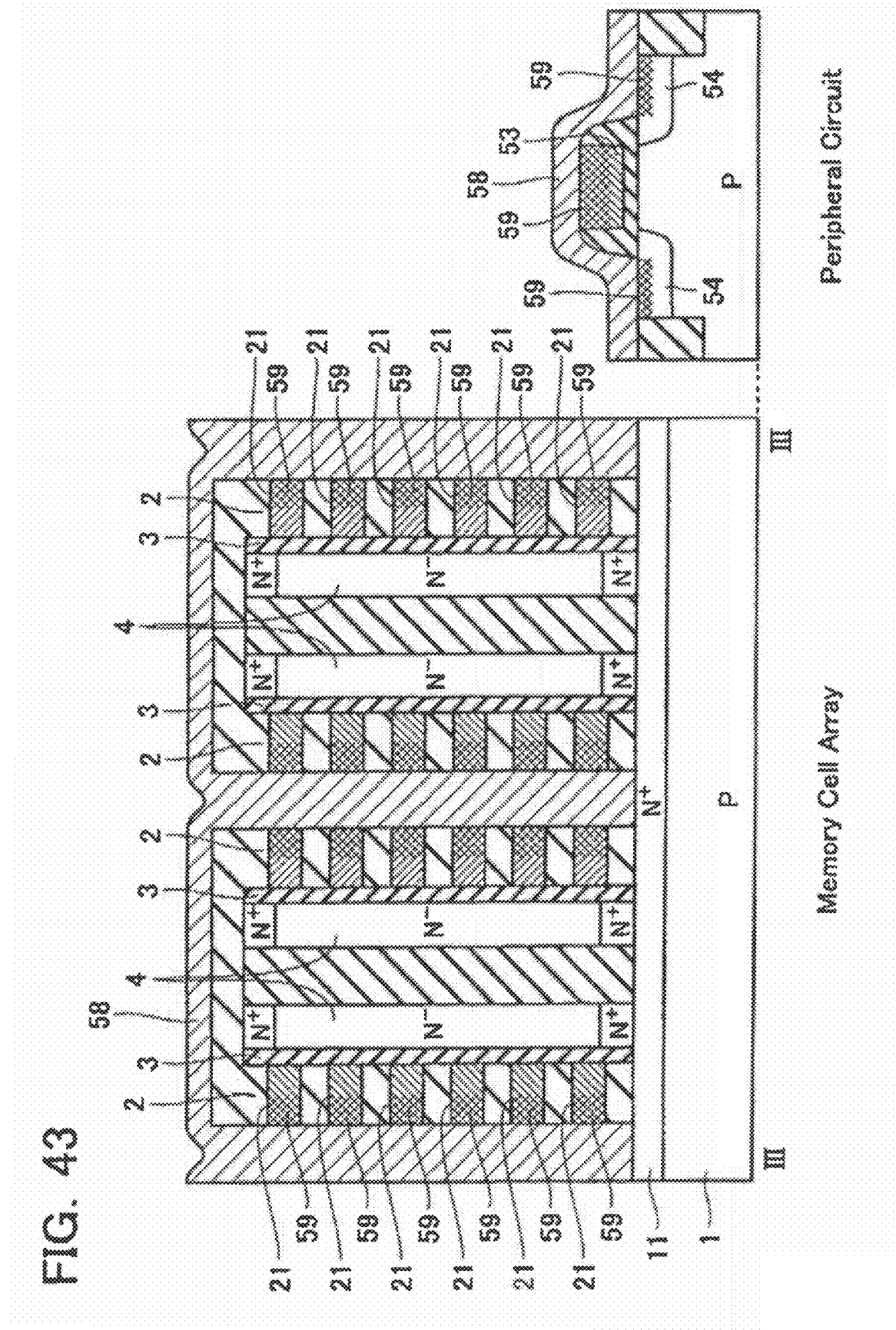
FIG. 43 is a sectional view for showing the salicide step of making the gate wirings of the gate wiring stack body and gate, source and drain of the peripheral transistor silicides.

After having removed the silicon nitride film 56*b*, as shown in FIG. 43, metal film 58, such as Co, Ni or Pd film, is formed by sputtering. Although sputtering has poor step-coverage, it is not necessary more than that the metal film 58 is buried in the groove 57 formed between the gate wiring stack bodies 2. Even if voids are formed in the metal film 68, there is no problem.

Annealing thereafter, metal penetrates into the polycrystalline silicon film 20 and interacts with it, so that silicide 59 is formed. In case metal film 58 is Co or Ni, silicide 59 hardly swells, so that it is formed without projecting itself from the side surface of the gate wirings 21. Particularly in case of Co, it penetrates almost perfectly into the polycrystalline silicon film 20 and interacts with it, and the silicide 59 is formed within the polycrystalline silicon film 20.

At this salicide step, silicide 59 is also formed on gate electrode 53, source and drain diffusion layers 54 in a self-aligned manner in the peripheral transistor.

After the salicide step, un-reacted metal film 58 will be removed by wet etching.

Figure 44:
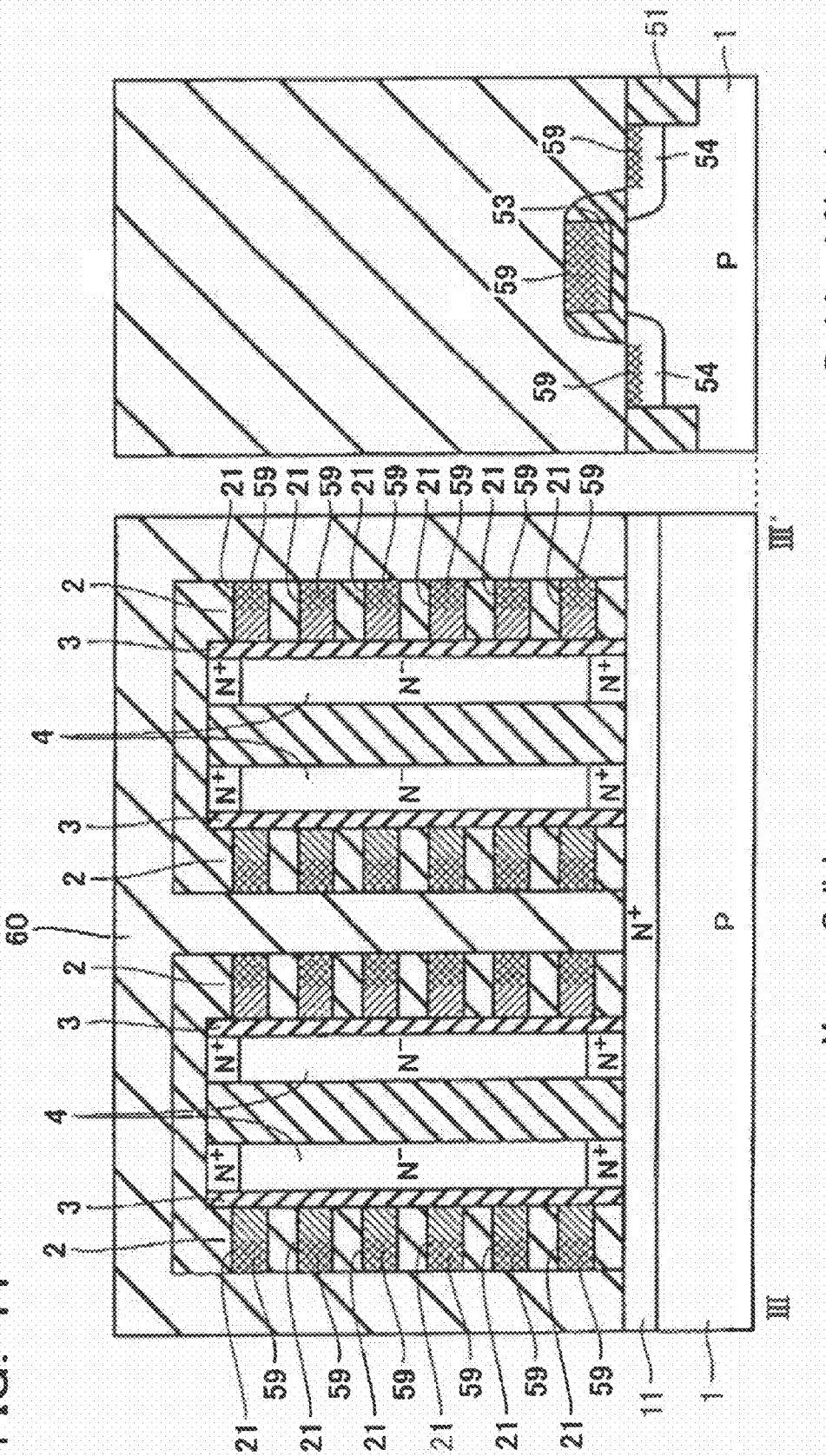
FIG. 44 is a sectional view for showing the step of forming the interlayer dielectric film covering the cell array area and peripheral circuit area.

Then, as shown in FIG. 44, interlayer dielectric film 60 is formed to cover the cell array area and the peripheral circuit area. Following it, metal wirings such as bit lines are formed (not shown).

According to this embodiment, stacked gate wirings (i.e., word lines and select gate lines) may be reformed as low-resistive wirings with the salicide technique. Note here that in this embodiment, the salicide process has been adapted to not only the cell array area but also the peripheral circuit area. However, it is possible to use such options that the salicide process is not adapted to the peripheral circuit area, or the salicide process adapted to the peripheral circuit area is different from that adapted to the cell array area.

Embodiment 9

In the above-described embodiments, with respect to the vertically stacked NAND cell unit, all memory cells and select gate transistors has a gate insulating film with a charge storage layer formed therein such as an ONO film. However, to make the property of the NAND cell unit more stabilized, it is desired that at least one of the upper and lower select gate transistors has such a gate insulating film that no charge storage layer is formed therein.

Figure 45:
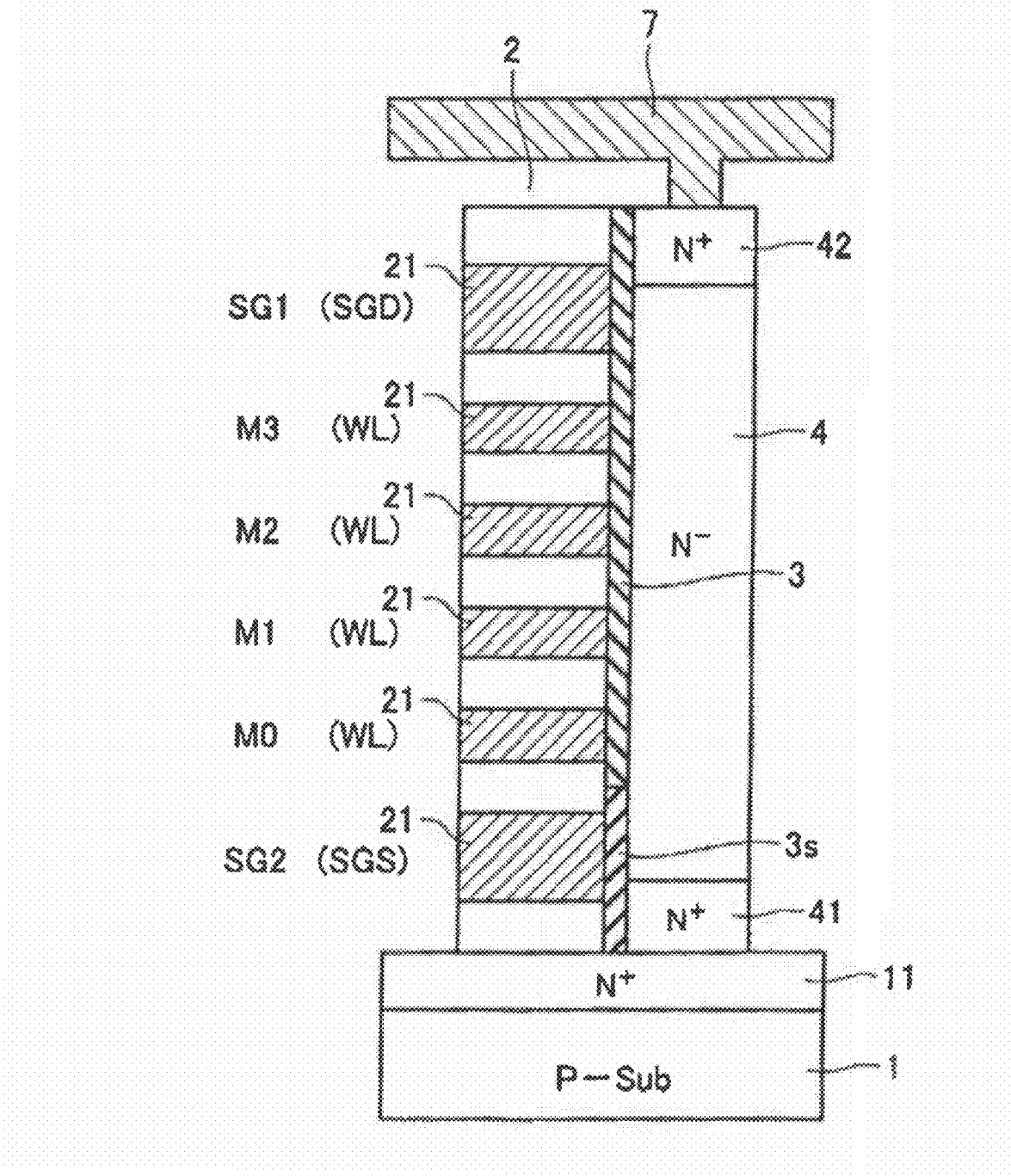
FIG. 45 is a sectional view for showing a NAND cell unit structure, in which the lower side select gate transistor's gate insulating film has no charge storage layer.
Figure 46:
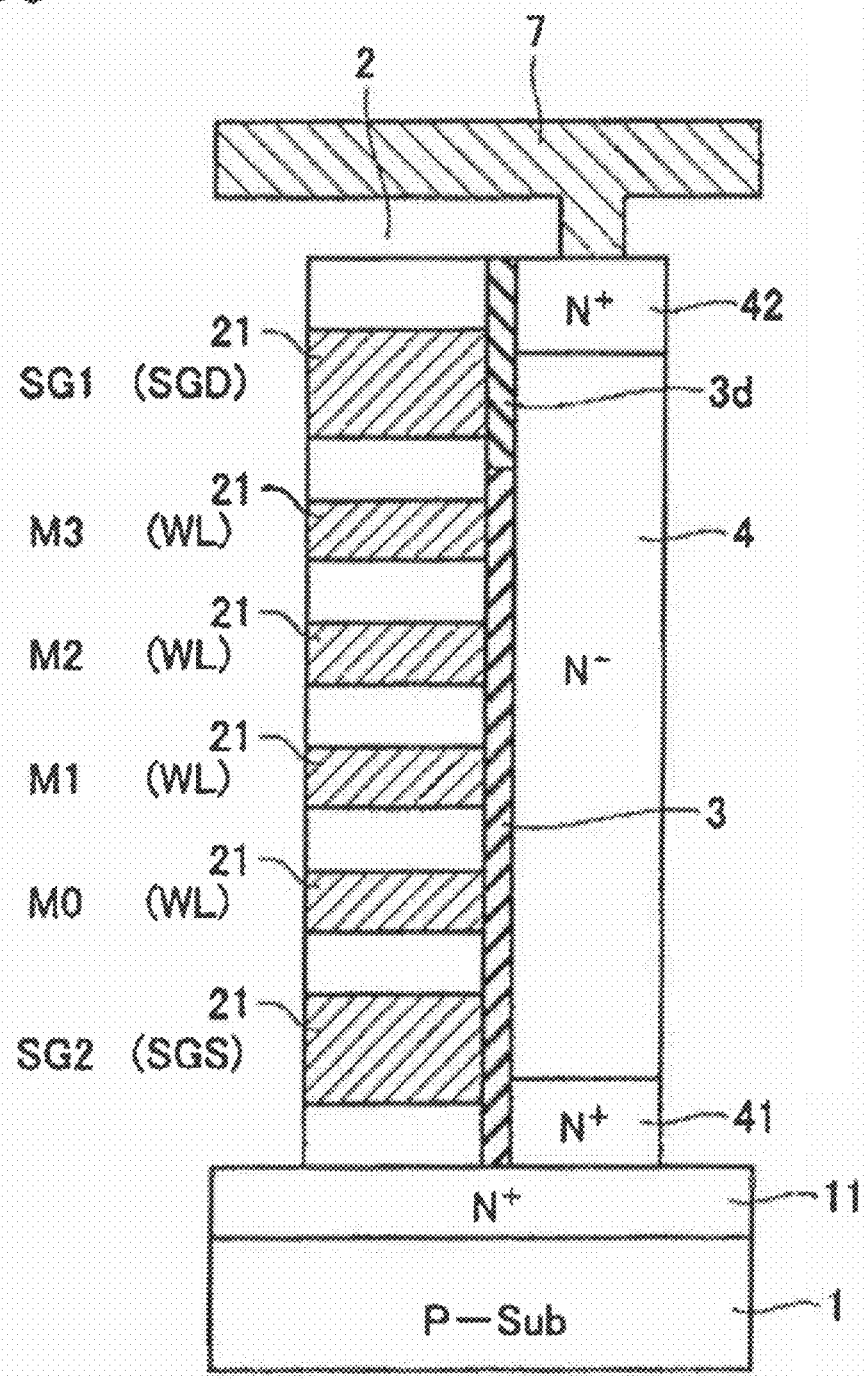
FIG. 46 is a sectional view for showing a NAND cell unit structure, in which the upper side select gate transistor's gate insulating film has no charge storage layer.
Figure 47:
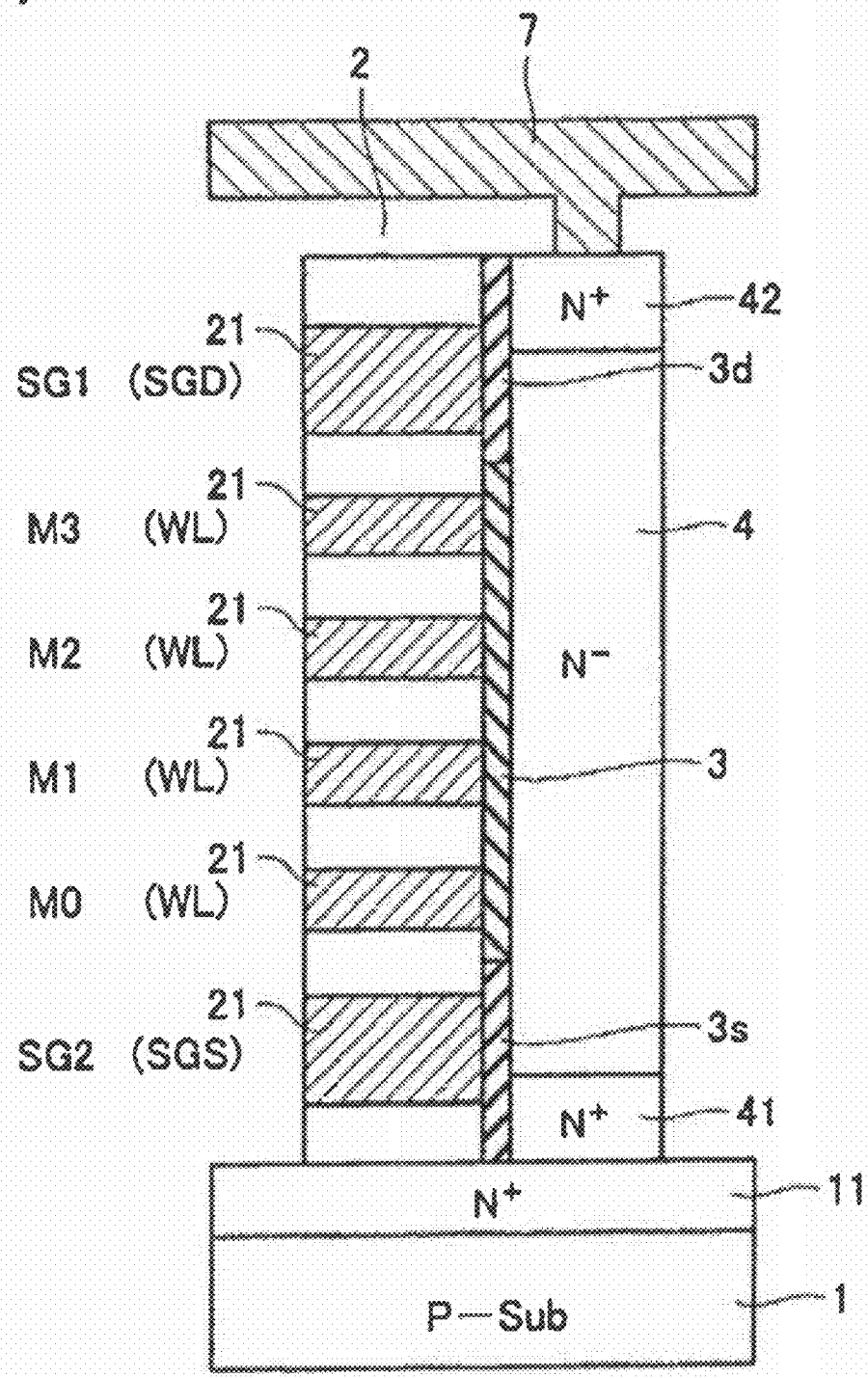
FIG. 47 is a sectional view for showing a NAND cell unit structure, in which the upper and lower side select gate transistors' gate insulating film has no charge storage layer.

FIGS. 45 to 47 are examples each showing the structure of one NAND cell unit in accordance with Embodiment 9. The portions corresponding to those in the above-described embodiments are designated with the same reference symbols as in the above-described embodiments, and the detail explanation will be omitted.

FIG. 45 shows such an example that the gate insulating film 3*s* of the select gate transistor SG2 disposed on the lower side, i.e., on the source line side, of the NAND cell unit is formed as different from the gate insulating film 3 including the charge storage layer.

FIG. 46 shows another example, in which the gate insulating film 3*d* of the select gate transistor SG1 disposed on the upper side, i.e., on the bit line side, of the NAND cell unit is formed as different from the gate insulating film 3 including the charge storage layer.

FIG. 47 shows still another example, in which the gate insulating films 3*d* and 3*s* of the select gate transistors SG1 and SG2 disposed on the both ends of the NAND cell unit are formed as different from the gate insulating film 3 including the charge storage layer.

The fabricating method of the NAND cell unit shown in FIG. 45 will be explained with reference to FIGS. 48 to 57. What is explained here is for the cell array scheme shown in FIG. 25, in which two gate wiring stack bodies 2 share a pillar-shaped silicon layer 4 sandwiched therebetween.

Figure 48:
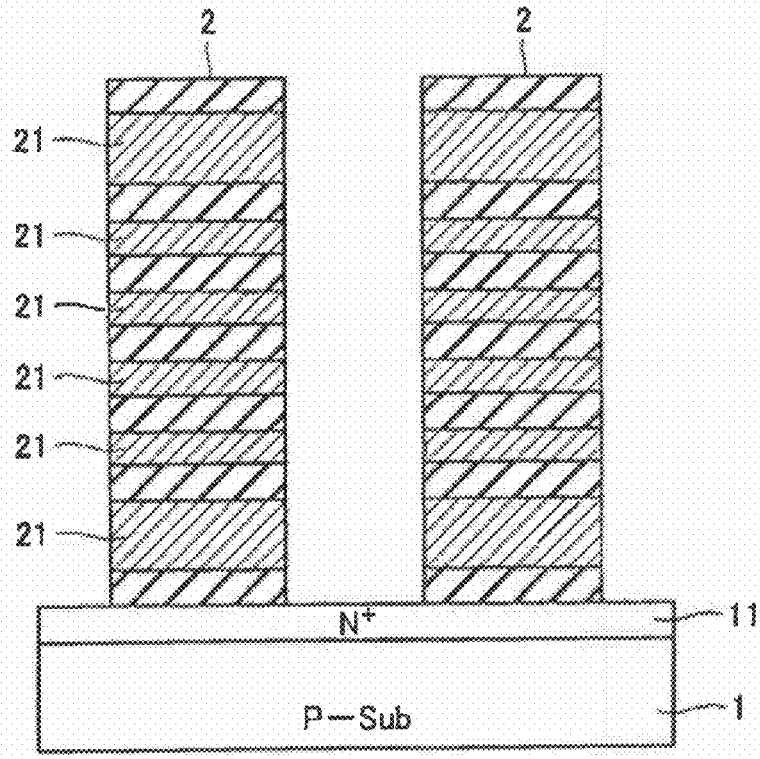
FIG. 48 is a sectional view for showing the step of forming the gate wiring stack body shown in FIG. 45.
Figure 49:
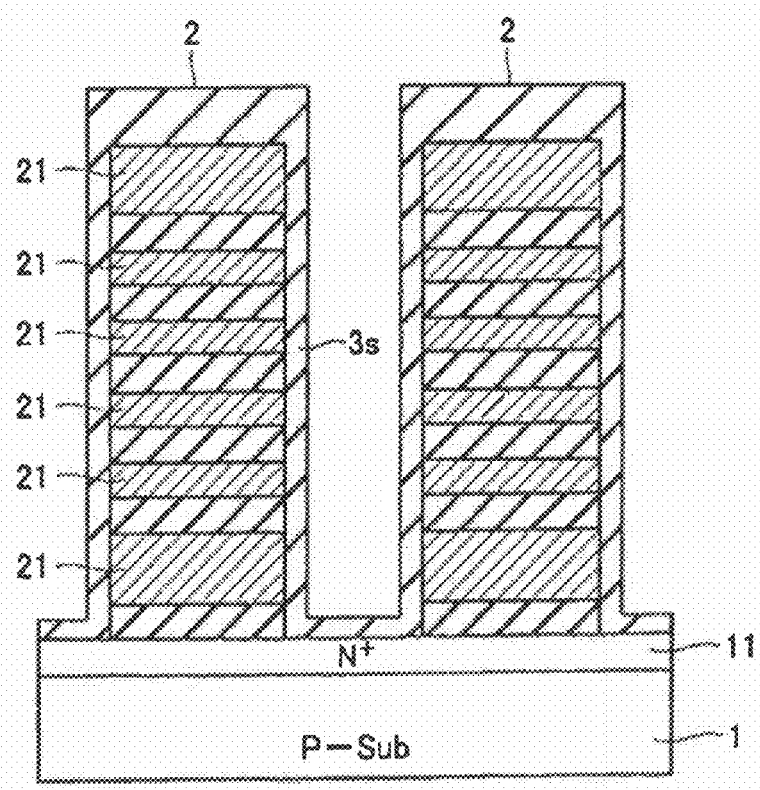
FIG. 49 is a sectional view for showing the step of forming the gate insulating film 3s without a charge storage layer.

FIG. 48 shows a state that the gate wiring stack bodies 2 with a plurality of wiring layers 21 stacked are patterned. So far, the fabricating processes are the same as in the above-described embodiments. Thereafter, as shown in FIG. 49, gate insulating film 3*s*, for example, silicon oxide film, in which no charge storage layer is formed, is formed.

Figure 50:
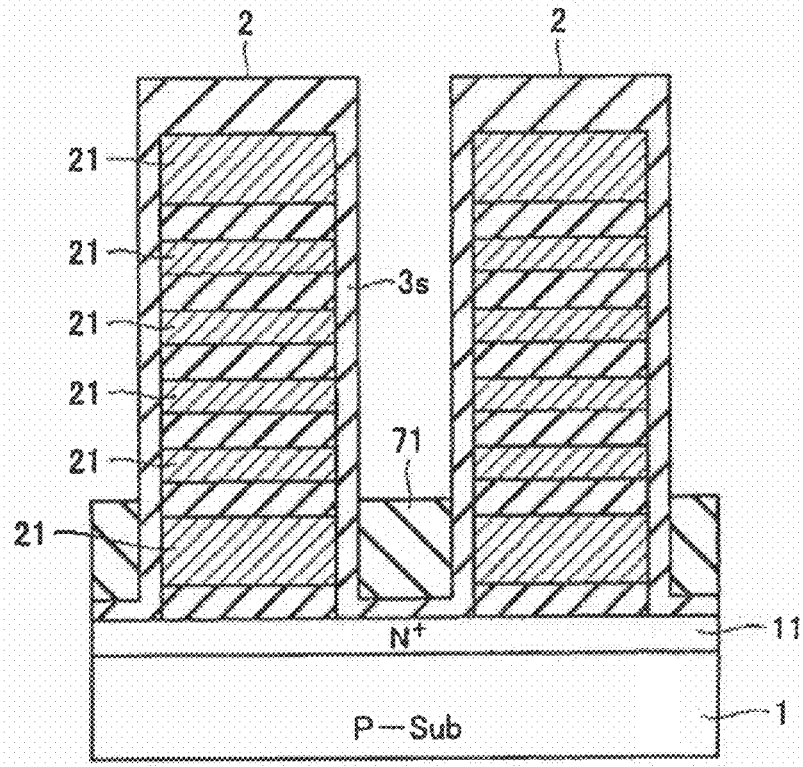
FIG. 50 is a sectional view for showing the step of burying the mask material film.

Then, as shown in FIG. 50, mask material film 71 used for selectively etching the gate insulating film 3*s* is deposited and etched-back, thereby being remained at the groove-bottom portion between the gate wiring stack bodies, i.e., at the formation portion of the lower side select gate transistor SG2. For example, in case the gate insulating film 3*s* is $SiO_2$ film, silicon nitride (SiN) film is used as the mask material film 71. Alternatively, a polycrystalline silicon film may be used as the mask material film 71 because it is possible to select such an etching condition that the etching rate is lower than that of the silicon oxide film.

Figure 51:
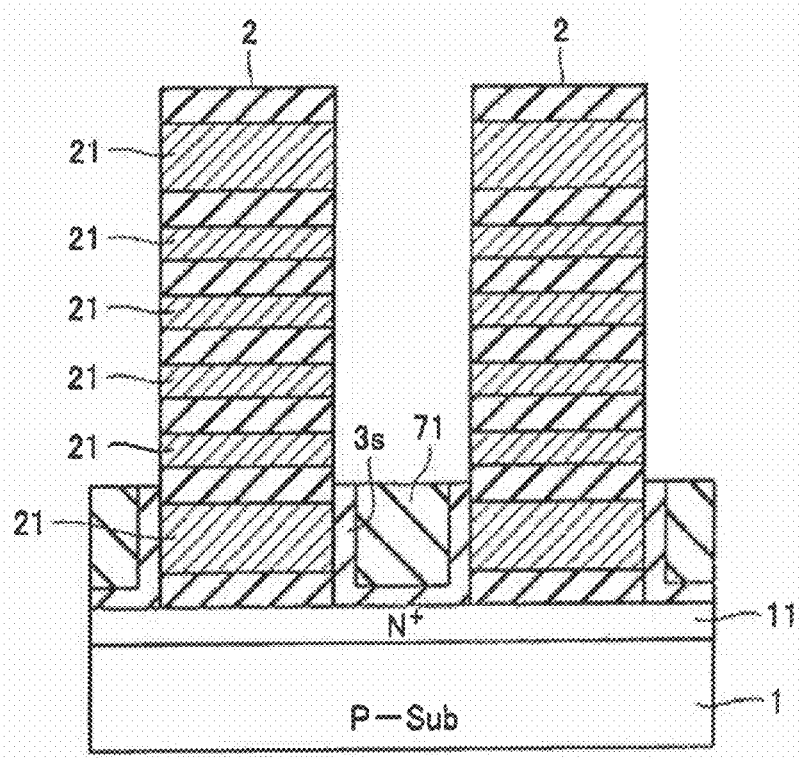
FIG. 51 is a sectional view for showing the step of etching the gate insulating film 3s.

Following it, as shown in FIG. 51, by use of the mask material film 71, the gate insulating film 3*s* is etched and removed except the portion remained at the lower side select gate transistor.

Figure 52:
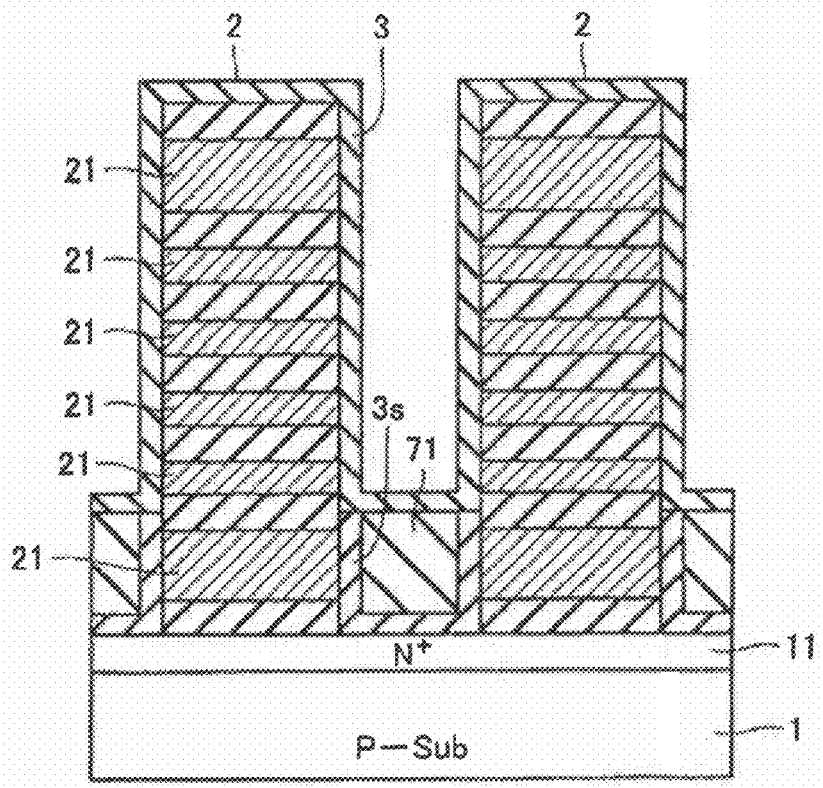
FIG. 52 is a sectional view for showing the step of forming the gate insulating film with the charge storage layer.
Figure 53:
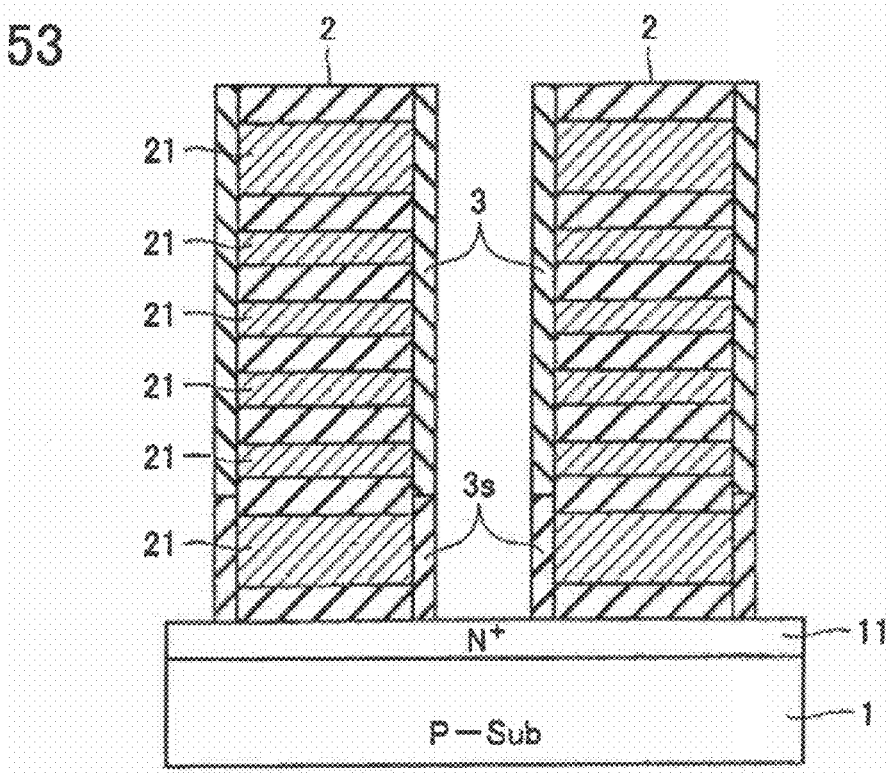
FIG. 53 is a sectional view for showing the step of removing the mask material film to expose the substrate.

Subsequently, as shown in FIG. 52, gate insulating film 3 including the charge storage layer is formed. Then, removing the mask material film 71, as shown in FIG. 53, the substrate surface between the gate wiring stack bodies 2 is exposed.

Figure 54:
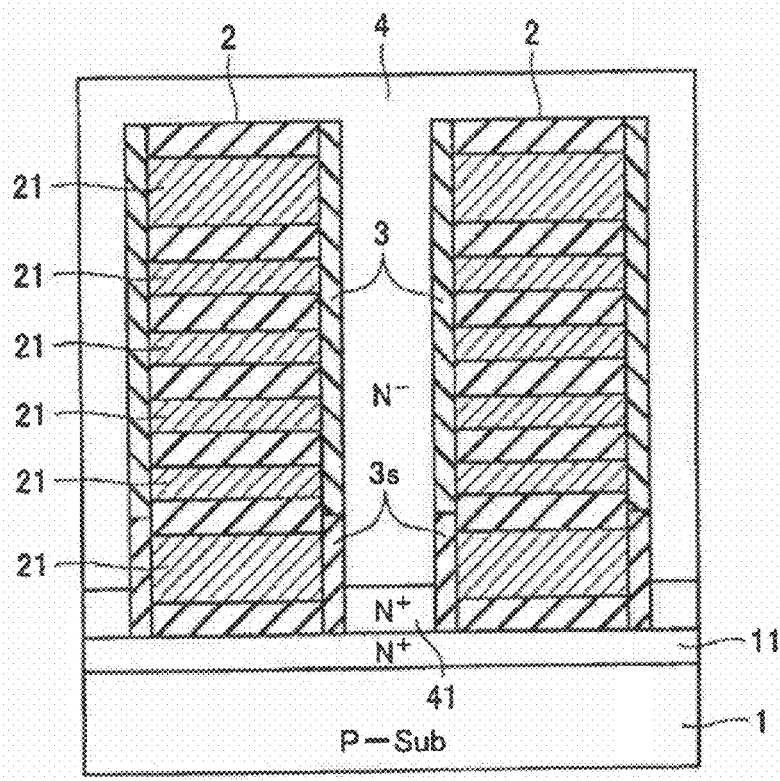
FIG. 54 is a sectional view for showing the steps of: forming a silicon layer; and crystallizing anneal thereof.

Thereafter, an amorphous silicon layer is deposited and subjected to crystallizing anneal, as shown in FIG. 54, $N^-$-type silicon layer 4 is formed. On the bottom of the silicon layer 4, $N^+$-type diffusion layer 41 is formed in accordance with impurity diffusion from the substrate like in the above-described embodiments.

Figure 55:
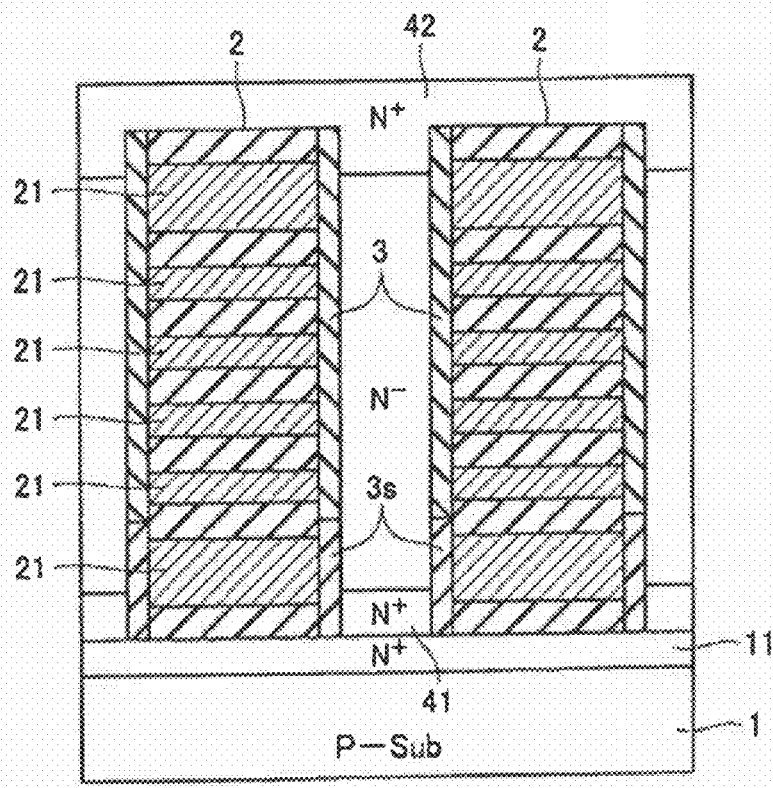
FIG. 55 is a sectional view for showing the step of forming contact diffusion layer.

Following it, as shown in FIG. 55, diffusing impurities on the top portion of the silicon layer 4, $N^+$-type diffusion layer 42 is formed thereon. The silicon layer 4 is divided into pillar-shaped silicon layers arranged at a pitch in the elongated direction of the gate wiring stack bodies 2.

Figure 56:
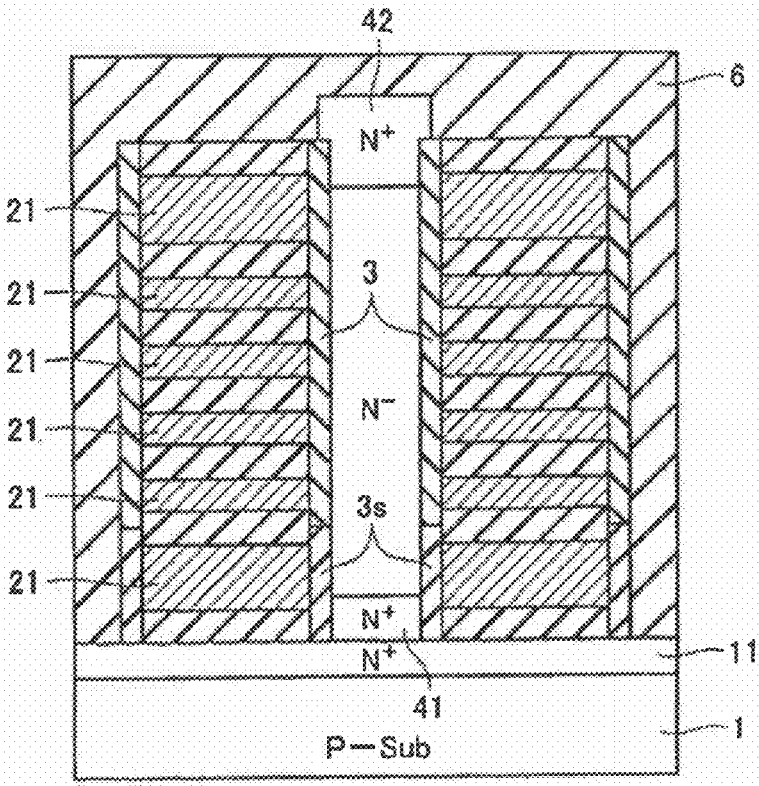
FIG. 56 is a sectional view for showing the step of forming the interlayer dielectric film.
Figure 57:
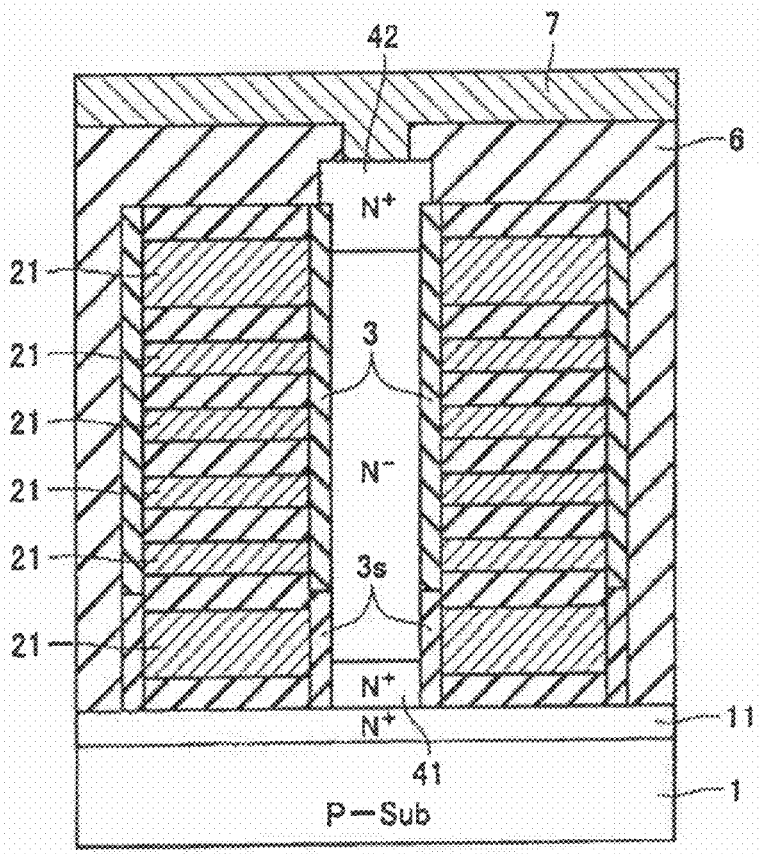
FIG. 57 is a sectional view for showing the step of forming the bit lines.

Then, interlayer dielectric film 6 is formed as shown in FIG. 56; and after having formed a contact hole, bit line 7 is formed as shown in FIG. 57 as being in contact with the $N^+$-type diffusion layer 42.

According to this embodiment, the operation of the lower side select gate transistor SG2 in the NAND cell unit is stabilized, and the property of the NAND cell unit is stabilized.

Figure 58:
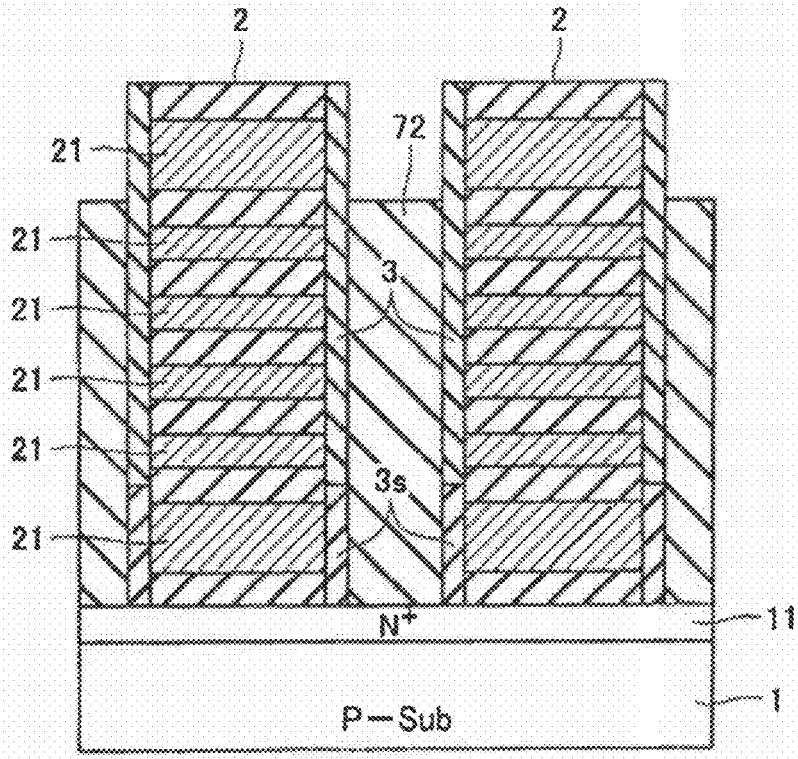
FIG. 58 is a sectional view for showing the step of burying the mask material film as followed the step shown in FIG. 53 for forming the structure shown in FIG. 47.
Figure 59:
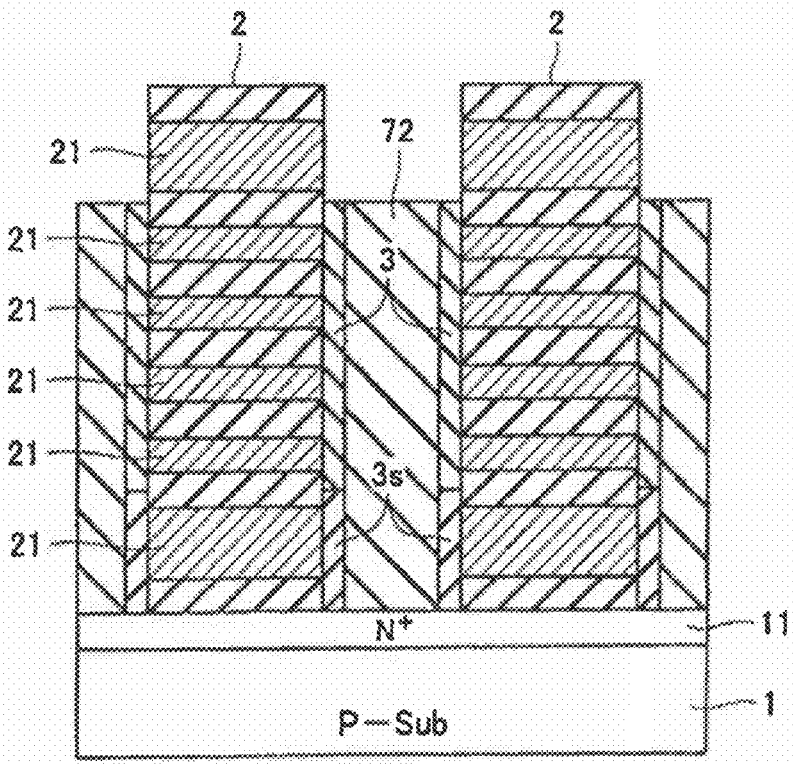
FIG. 59 is a sectional view for showing the step of etching the gate insulating film 3.
Figure 60:
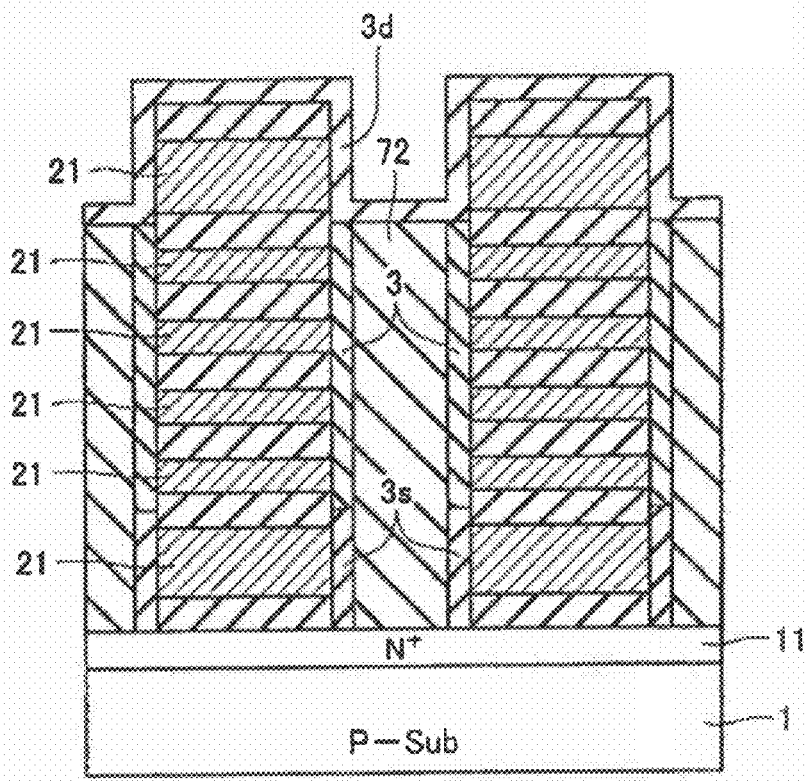
FIG. 60 is a sectional view for showing the step of forming the gate insulating film 3d without a charge storage layer.
Figure 61:
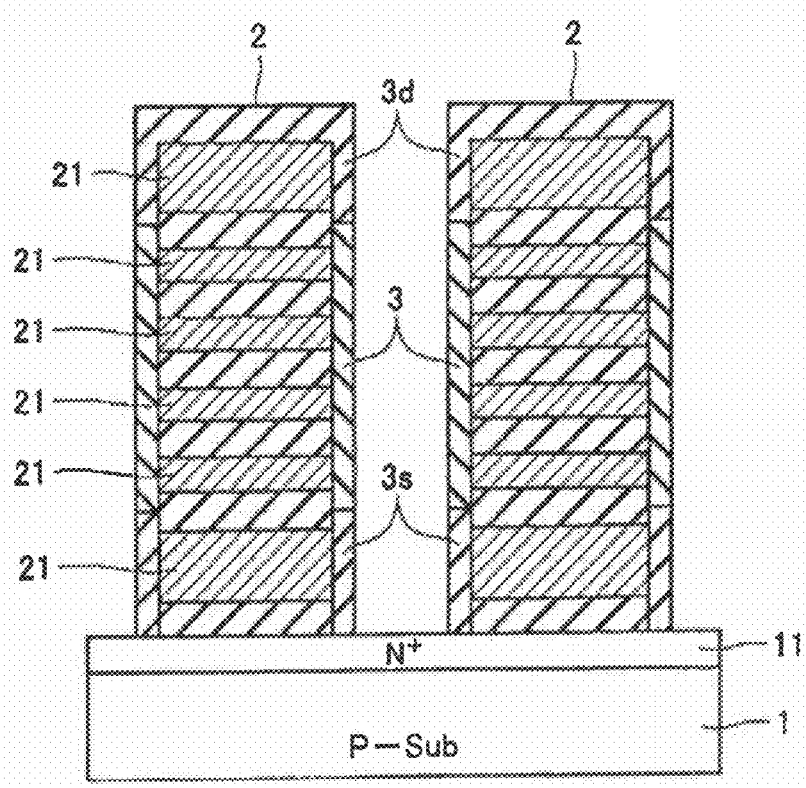
FIG. 61 is a sectional view for showing the step of removing the mask material film to expose the substrate.
Figure 62:
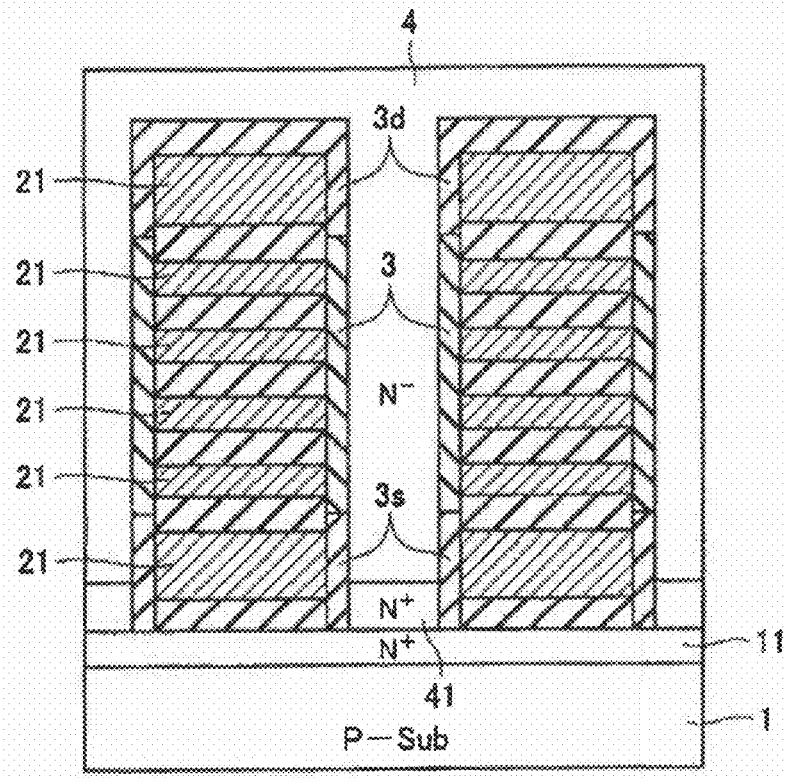
FIG. 62 is a sectional view for showing the steps of: forming a silicon layer; and crystallizing anneal thereof.
Figure 63:
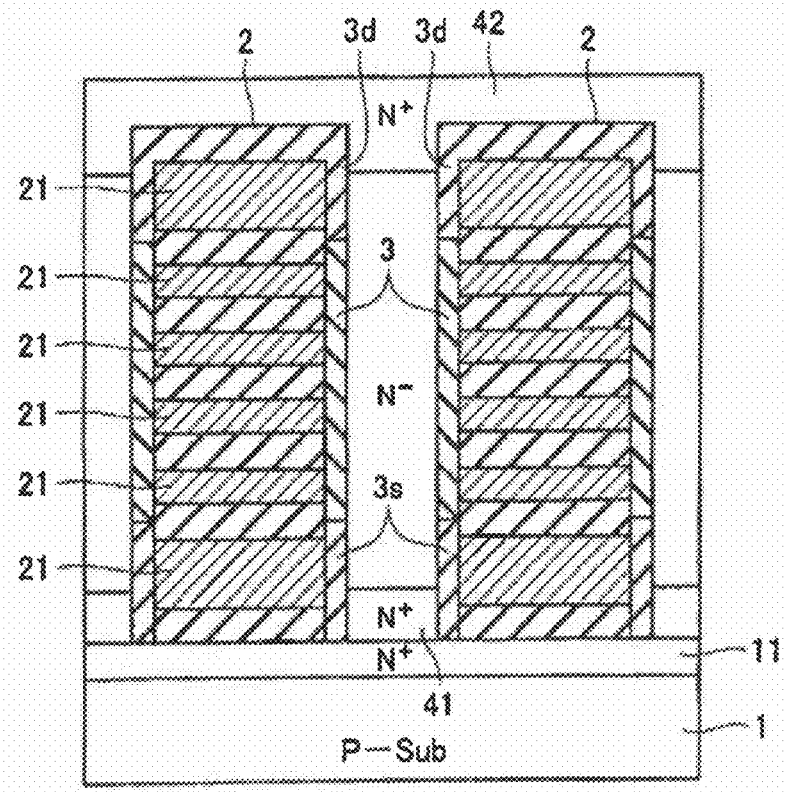
FIG. 63 is a sectional view for showing the step of forming contact diffusion layer.
Figure 64:
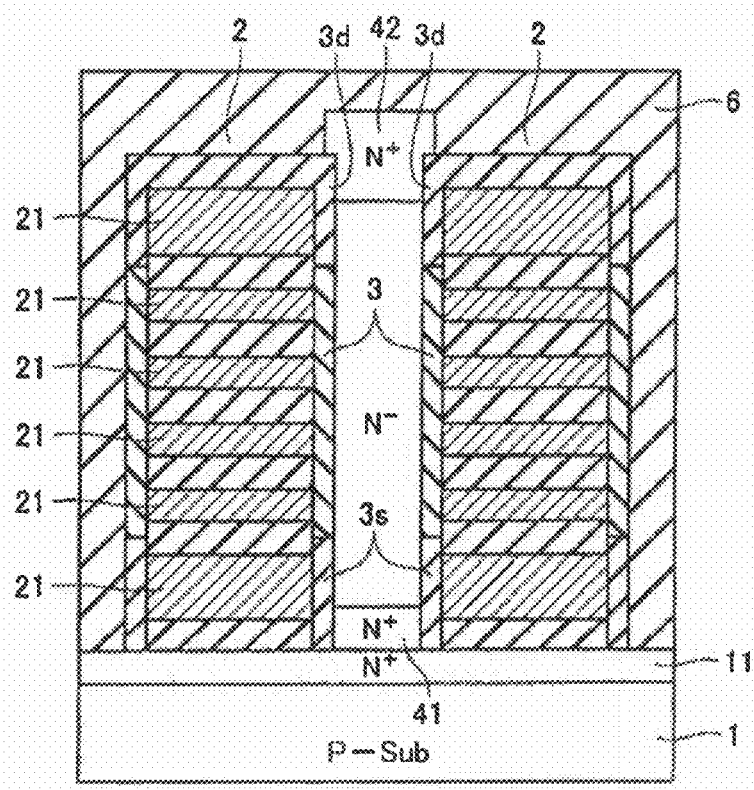
FIG. 64 is a sectional view for showing the step of forming the interlayer dielectric film.
Figure 65:
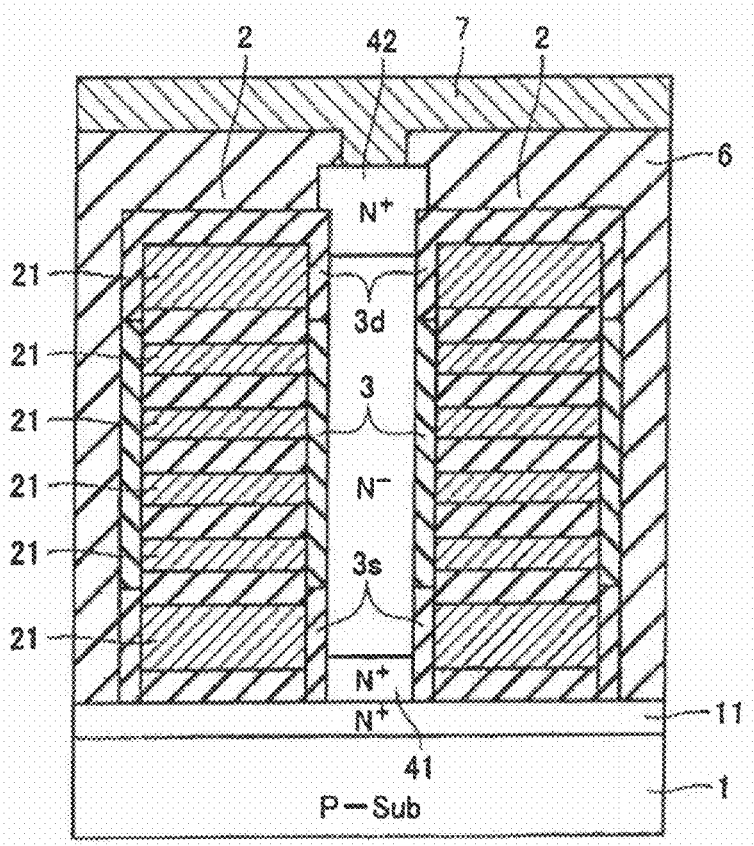
FIG. 65 is a sectional view for showing the step of forming the bit lines.

To form the structure shown in FIG. 47, in which both select gate transistors SG1 and SG2 have gate insulating films 3*d* and 3*s* with no charge storage layer, it is sufficient that after having formed the structure shown in FIG. 53, the steps shown in FIGS. 58 to 60 are adapted. That is, in the state shown in FIG. 53, mask material film 72 is, as shown in FIG. 58, deposited again and etched-back to be buried with such a height as to remain the gate insulating film 3 of the memory cells between the gate wiring stack bodies. In case the gate insulating film 3 is formed of an ONO film, silicon nitride or polycrystalline silicon is used as the mask material film 72 like the mask material film 71.

Then, as shown in FIG. 59, having etched and removed the gate insulating film 3 by use of the mask material film 72 as a mask, the gate insulating film 3d with no charge storage layer formed therein, for example, a silicon oxide film, is formed as shown in FIG. 60.

Thereafter, etching the mask material film 72, as shown in FIG. 59, the top surface of the substrate is exposed between the gate wiring stack bodies 2. The steps shown in FIGS. 62 to 65 are the same as those shown in FIGS. 54 to 57, i.e., forming the silicon layer as an activation layer; patterning it; forming contact diffusion layer 42; and forming bit lines 7.

As a result, both of the select gate transistors in the NAND cell unit are stabilized in operation.

To form the structure shown in FIG. 46, in which only the upper side select gate transistor has a gate insulating film with no charge storage layer formed therein, it is sufficient that after having formed the gate insulating film 3 with the charge storage layer formed therein, the processes shown in FIG. 58 and the remaining drawings are adapted.

This invention is not limited to the above-described embodiment. It will be understood by those skilled in the art that various changes in form and detail may be made without departing from the spirit, scope, and teaching of the invention.

What is claimed is:

1. A method of fabricating a semiconductor memory device comprising:
    forming a plurality of polycrystalline silicon films, which are stacked and separated from each other with insulating films interposed therebetween, in a cell array formation area of a semiconductor substrate;
    etching the stack structure of the polycrystalline silicon films and the insulating films to form a gate wiring stack body with an elongate pattern, in which a plurality of gate wirings are stacked via the insulating films;
    forming a gate insulating film on a first side surface of the gate wiring stack body, in which an insulating charge storage layer is formed;
    forming a plurality of pillar-shaped semiconductor layers with the same conductivity type as an impurity diffusion layer and a lower impurity concentration than the impurity diffusion layer, which are arranged in the elongated direction of the gate wiring stack body and opposed to the first side surface of the gate wiring stack body via the gate insulating film;
    forming a metal film on the second side surface of the gate wiring stack body, and annealing it to make the gate wirings silicides; and
    forming data lines to be in contact with the upper surfaces of the pillar-shaped semiconductor layers and intersect the gate wirings.

2. The method according to claim 1, wherein
the procedure of forming the gate insulating film comprises:
sequentially depositing a first silicon oxide film, a silicon nitride film serving as the charge storage layer and a second silicon oxide film or another insulator film with a dielectric coefficient higher than the silicon oxide to form the gate insulating film; and
removing the gate insulating film except that disposed on the first side surface of the gate wiring stack body.

3. The method according to claim 1, wherein
the procedure of forming the pillar-shaped semiconductor layers comprises:
forming a semiconductor layer on the semiconductor substrate, on which the gate wiring stack body is formed with the gate insulating film formed on the first side surface of the gate wiring stack body;
annealing the semiconductor layer to crystallize it; and
patterning the semiconductor layer to divide it into a plurality of the pillar-shaped semiconductor layers.

* * * * *